(12) United States Patent  (10) Patent No.: US 7,995,419 B2
Sato  (45) Date of Patent: Aug. 9, 2011

(54) SEMICONDUCTOR MEMORY AND MEMORY SYSTEM

(75) Inventor: Takahiko Sato, Shinjuku (JP)

(73) Assignee: Fujitsu Semiconductor Limited, Yokohama (JP)

( * ) Notice: Subject to any disclaimer, the term of this patent is extended or adjusted under 35 U.S.C. 154(b) by 238 days.

(21) Appl. No.: 12/535,761

(22) Filed: Aug. 5, 2009

(65) Prior Publication Data

US 2010/0034045 A1 Feb. 11, 2010

(30) Foreign Application Priority Data

Aug. 6, 2008 (JP) .................................. 2008-202760

(51) Int. Cl.
*G11C 8/00* (2006.01)
(52) U.S. Cl. ................................... 365/230.03; 365/236
(58) Field of Classification Search ............. 365/230.03, 365/236
See application file for complete search history.

(56) References Cited

U.S. PATENT DOCUMENTS

| 6,055,619 A * | 4/2000 | North et al. ............... 712/36 |
| 6,324,115 B1 * | 11/2001 | Choi ................... 365/230.03 |
| 6,928,024 B2 * | 8/2005 | Pfeiffer et al. .......... 365/230.03 |
| 2005/0268027 A1 | 12/2005 | Katsuki et al. |

FOREIGN PATENT DOCUMENTS

JP 2005-339348 A 12/2005

OTHER PUBLICATIONS

Ware, Frederick, A. et al.,*Micro-threaded Row and Column Operation in a DRAM Core*, Rambus White Paper, Rambus Inc., Mar. 2005, 1-7.

* cited by examiner

*Primary Examiner* — Son Dinh
(74) *Attorney, Agent, or Firm* — Fujitsu Patent Center

(57) ABSTRACT

A semiconductor memory that assigns M data groups, each data group including N data, to a first address, where M and N are integers equal to or larger than 2; and wherein L data among N data is designated by a second address indicating a position of the data groups and the L data is read from the designated position, where L is an integer and L<N.

20 Claims, 47 Drawing Sheets

FIG. 40

# SEMICONDUCTOR MEMORY AND MEMORY SYSTEM

CROSS-REFERENCE TO RELATED APPLICATIONS

This application claims the benefit of priority from Japanese Patent Application No. 2008-202760 filed on Aug. 6, 2008, the entire content of which are incorporated herein by reference.

BACKGROUND

1. Field

Embodiments discussed herein are related to a semiconductor memory having plural data terminals.

2. Description of Related Art

A system for processing images requires a high data transfer rate. Although a data transfer rate is improved as an operation frequency is increased, designing the system becomes more difficult and power consumption increases. Therefore, the number of data terminals of a semiconductor memory is increased in order to improve the data transfer rate.

Related arts are disclosed in, for example, Japanese Laid-open Patent Publication No. 2005-339348 and a document "Frederick A. Ware and Craig Hampel: Micro-threaded Row and Column Operation in a DRAM Core, Rambus White Paper (March 2005)".

SUMMARY

At least one embodiment of the present invention provides a semiconductor memory which assigns M data groups, each data group including N data, to a first address, where M and N are integers equal to or larger than 2. L (L<N) data among N data is designated by a second address indicating a position of the data groups and the L data is read from the designated position.

Additional examples and features of the invention will be set forth in part in the description that follows, and in part will become more apparent to those skilled in the art upon examination of the following or upon learning by practice of the invention.

BRIEF DESCRIPTION OF THE DRAWINGS

Embodiments of the present invention are illustrated by way of examples and not limited by the following figures:

FIG. 40 illustrates an exemplary area to be accessed of a semiconductor memory.

DETAILED DESCRIPTION OF EXAMPLES OF EMBODIMENTS

In the figures, dimensions and/or proportions may be exaggerated for clarity of illustration. It will be understood that when an element is referred to as being "between" two elements, it may be the only element layer between the two elements, or one or more intervening elements may also be present.

Also in the figures, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicated a positive logic. A signal having a reference symbol prefixed with a symbol "/" indicates a negative logic. A double-square symbol represents an external terminal such as a pad on a semiconductor chip or a lead of a package that includes the semiconductor chip therein. Terminals and signals supplied through the terminals, respectively, are denoted by like reference symbols.

Figure 1:
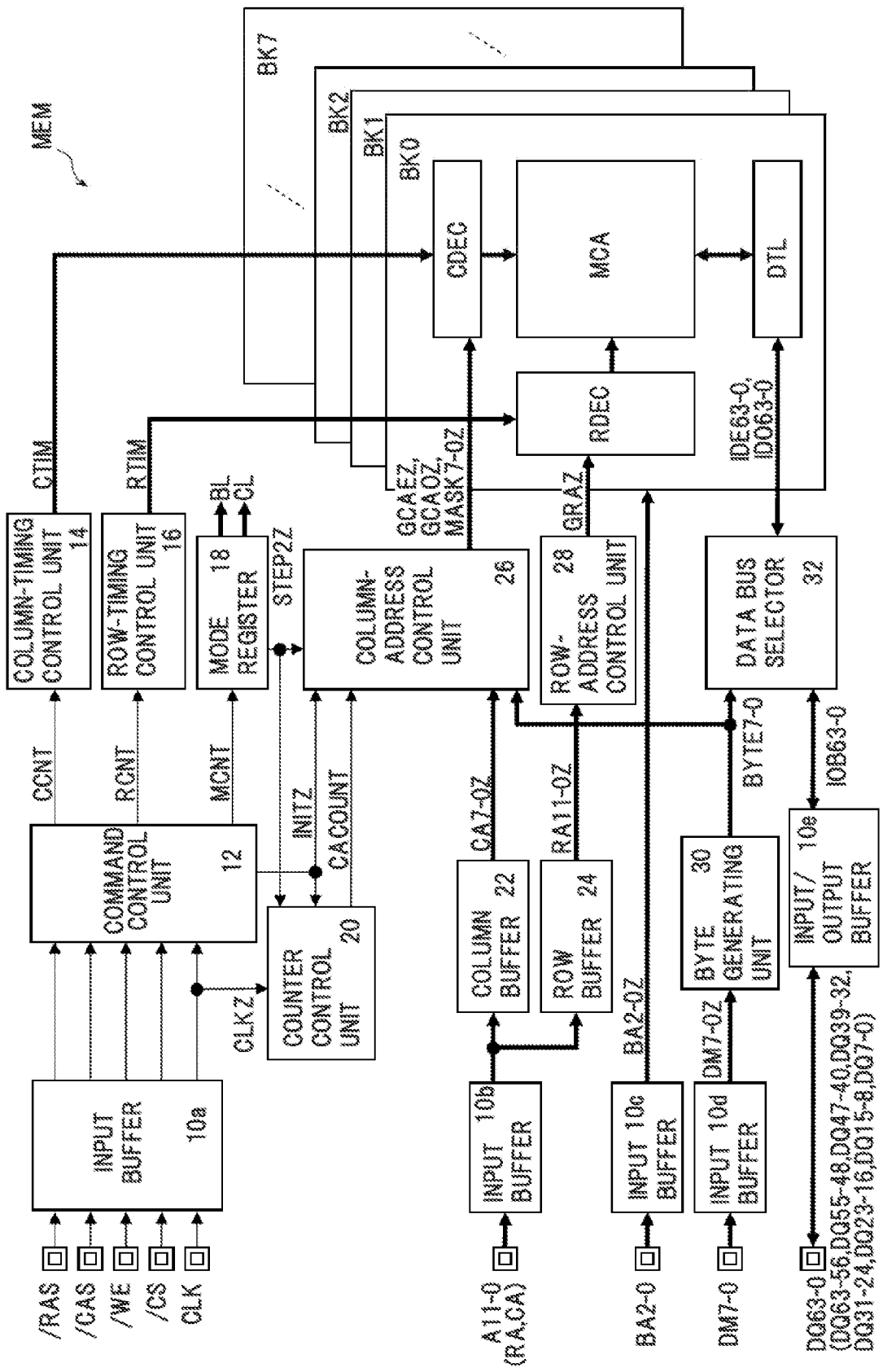
FIG. 1 illustrates a first semiconductor memory.

FIG. 1 illustrates a first semiconductor memory. As referred herein, first, second, third semiconductor memories are used to indicate first, second, third examples of a semiconductor memory of an embodiment of the present invention. Referring to FIG. 1, a semiconductor memory MEM may be, for example, an SDRAM. The semiconductor memory MEM includes input buffers 10a, 10b, 10c, and 10d, a data input/output buffer 10e, a command control unit 12, a column-timing control unit 14, a row-timing control unit 16, a mode register 18, a counter control unit 20, a column buffer 22, a row buffer 24, a column-address control unit 26, a row-address control unit 28, a byte generating unit 30, a data bus selector 32, and eight banks BK0 to BK7.

The input buffer 10a receives command signals, for example, a row address strobe signal/RAS, a column address strobe signal/CAS, a write enable signal/WE or a chip select signal/CS, and a clock signal CLK and outputs the received signals to the command control unit 12 and the like. The input buffer 10b receives 12-bit address signals A11-0, for example, a row address signal RA or a column address signal CA and outputs the received signal to the row buffer 24 and the column buffer 22. The input buffer 10c outputs 3-bit bank address signals BA2-0 as bank address signals BA2-0Z (BA2Z, BA1Z, and BA0Z). The input buffer 10d outputs 8-bit data mask signals DM7-0 as data mask signals DM7-0Z (DM7Z, DM6Z, ..., and DM0Z). Bits of the data mask signal correspond to eight data terminal groups DQ, respectively.

The data input/output buffer 10c outputs data, which is read from the banks BK, selected by the data bus selector 32, and transferred to internal data buses IOB63-0 (IOB63, IOB62, ..., and IOB0), to data terminals DQ63-0 (DQ63, DQ62, ..., and DQ0) during a read operation. The data input/output buffer 10e outputs data supplied to the data terminals DQ63-0 to the internal data buses IOB63-IOB0 during a write operation. The data terminals DQ63-0 may be classified into, for example, eight data terminal groups DQ63-DQ56, DQ55-DQ48, ..., and DQ7-DQ0. Data lines of the internal data buses IOB63-0 may be complementary signal lines or may be single signal lines.

The command control unit 12 receives a command signal in synchronization with a clock signal CLKZ, decodes the received command signal, and outputs control signals CCNT, RCNT, and MCNT. When the command control unit 12 receives an active command or a refresh command, the command control unit 12 outputs a row control signal RCNT to the row-timing control unit 16. When the command control unit 12 receives a read command or a write command, the command control unit 12 outputs a column control signal CCNT to the column-timing control unit 14 and outputs an initialization signal INITZ to the counter control unit 20 and the column-address control unit 26. When the command control unit 12 receives a mode register setting command, the command control unit 12 outputs a mode control signal MCNT to the mode register 18.

The column-timing control unit 14 outputs, in response to the column control signal CCNT, a column timing signal CTIM for activating a column decoder CDEC. The row-timing control unit 16 outputs, in response to the row control signal RCNT, a row timing signal RTIM for activating a row decoder RDEC.

The mode register 18 includes plural registers which are set according to a logic level supplied to address terminals AD or data terminals DQ in synchronization with the mode control signal MCNT. In the mode register 18, an operation mode of the memory MEM, for example, burst length BL, CAS latency CL, or the like is set. The burst length BL is the number of data signals that are output from the data terminals DQ in response to one read command or the number of data signals that are input from the data terminals DQ in response to one write command. Sign BL is also used as bit lines in FIG. 5. The CAS latency CL is the number of clocks from receiving a read command until stating outputting read data. A step signal STEP2Z designates an increment of a column address CA of a burst counter BCOUNT illustrated in FIG. 2.

The counter control unit 20 outputs, in response to the initialization signal INITZ, a counter signal CACOUNT having a pulse that synchronizes with the clock signal CLKZ. The number of pulses of the counter signal CACOUNT is a half of the number indicated by the burst length BL when the step signal STEP2Z is at a high level. The number of pulses of the counter signal CACOUNT is the number indicated by the burst length BL when the step signal STEP2Z is at a low level.

The column buffer 22 receives 8-bit address signals A7-0 in synchronization with a /CAS signal and outputs the received signals to the column-address control unit 26 as column address signals CAZ (CA7Z, CA6Z, ..., and CA0Z). The row buffer 24 receives 12-bit address signals A11-0 in synchronization with a /RAS signal and outputs the received signals to the row-address control unit 28 as row address signals RAZ (RA11Z, RA10Z, ..., and RA0Z).

Figure 3:
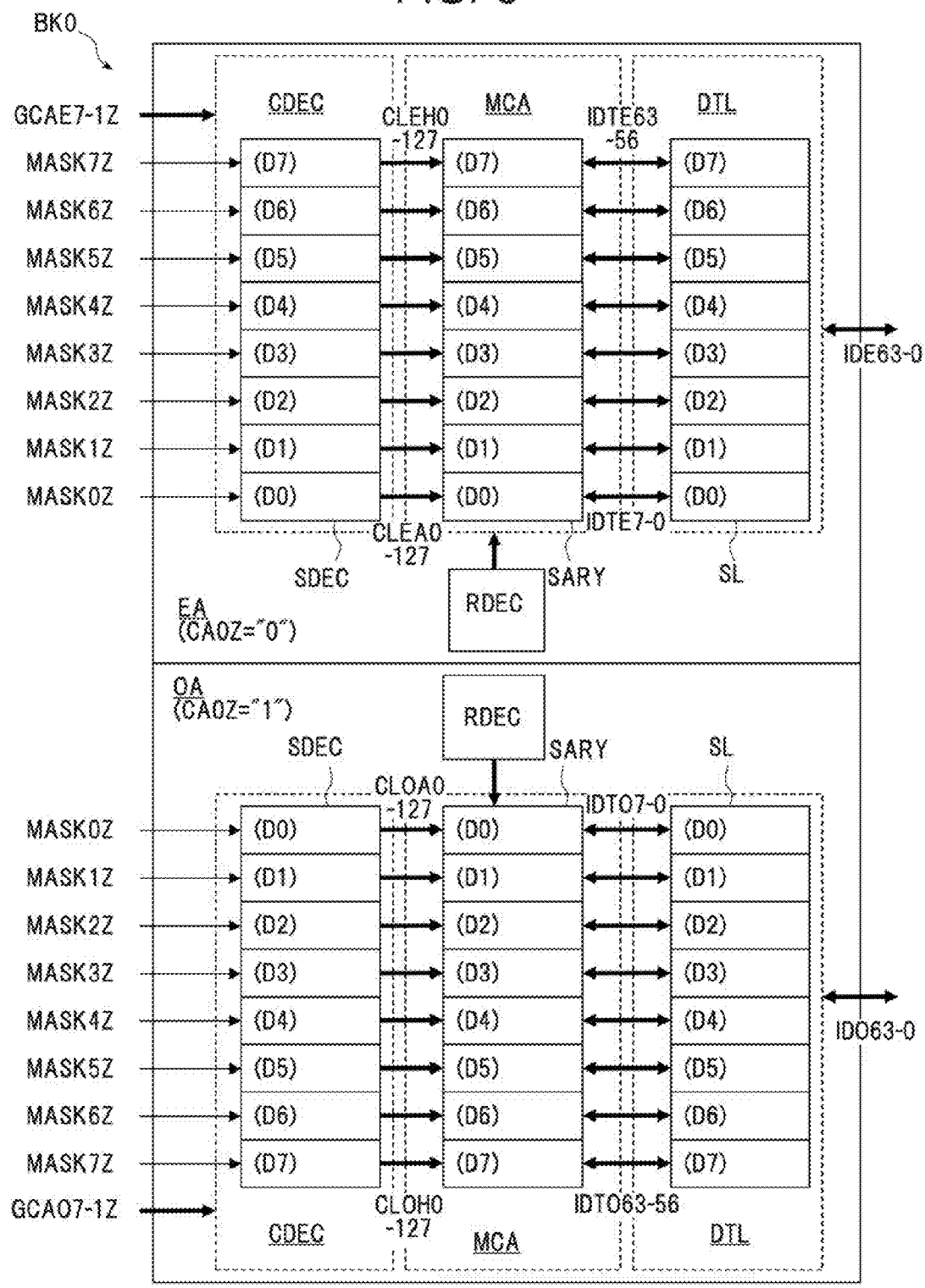
FIG. 3 illustrates an exemplary bank.

The column-address control unit 26 outputs global column address signals GCAEZ and GCAOZ in response to the column address signals CA7-0Z when the step signal STP2Z is at a high level. The global column address signals GCAEZ and GCAOZ are generated in association with higher-order seven bits (CA7-1Z) of the column address signals CAZ. The column-address control unit 26 outputs a global column address signal GCAEZ or GCAOZ in response to the column address signals CA7-0Z when the step signal STEP2Z is at a low level. As illustrated in FIG. 3, two memory areas EA and OA of a bank BK0 (or BK1-7) are accessed based on the column address signals GCAEZ and GCAOZ. The column-address control unit 26 outputs byte signals BYTE7-0 from the byte generating unit 30 as mask signals MASK7-0Z (MASK7Z, MASK6Z, ..., and MASK0Z). The row-address control unit 28 outputs global row address signals GRAZ (GRA11Z, GRA10Z, ..., and GRA0Z) in response to row address signals RA11-0Z.

The byte generating unit 30 latches the data mask signals DM7-0Z and outputs the data mask signals DM7-0Z as 8-bit byte signals BYTE7-0. Data output to data terminal groups DQ63-56 is selected based on the byte signal BYTE7 during a read operation. A memory area in the banks BK in which data supplied to the data terminal groups DQ63-56 is written is selected based on the byte signal BYTE7 during a write operation. Similarly, data output to or input to data terminal groups DQ47-40, 39-32, 31-24, 23-16, 15-8, or 7-0 is selected based on other byte signals BYTE6 to BYTE0. Since the byte signals BYTE7-0 are supplied to the memory MEM, a controller that accesses the memory MEM using the data mask terminal DM may be easily designed.

The data bus selector 32 couples internal data buses IOB63-0 to one of internal data lines IDE63-0 and IDO63-0 for each of data terminal groups (bytes) in response to the byte signals BYTE7-0.

Each of the banks BK0 to BK7 includes a column decoder CDEC, a row decoder RDEC, a memory cell array MCA, and a data latch DTL. The banks BK0 to BK7 have configurations substantially the same as or similar to one another and are selected according to bank address signals BA2 to BA0. The memory MEM according to FIG. 1 or following figures may have one, two, or four banks.

Figure 2:
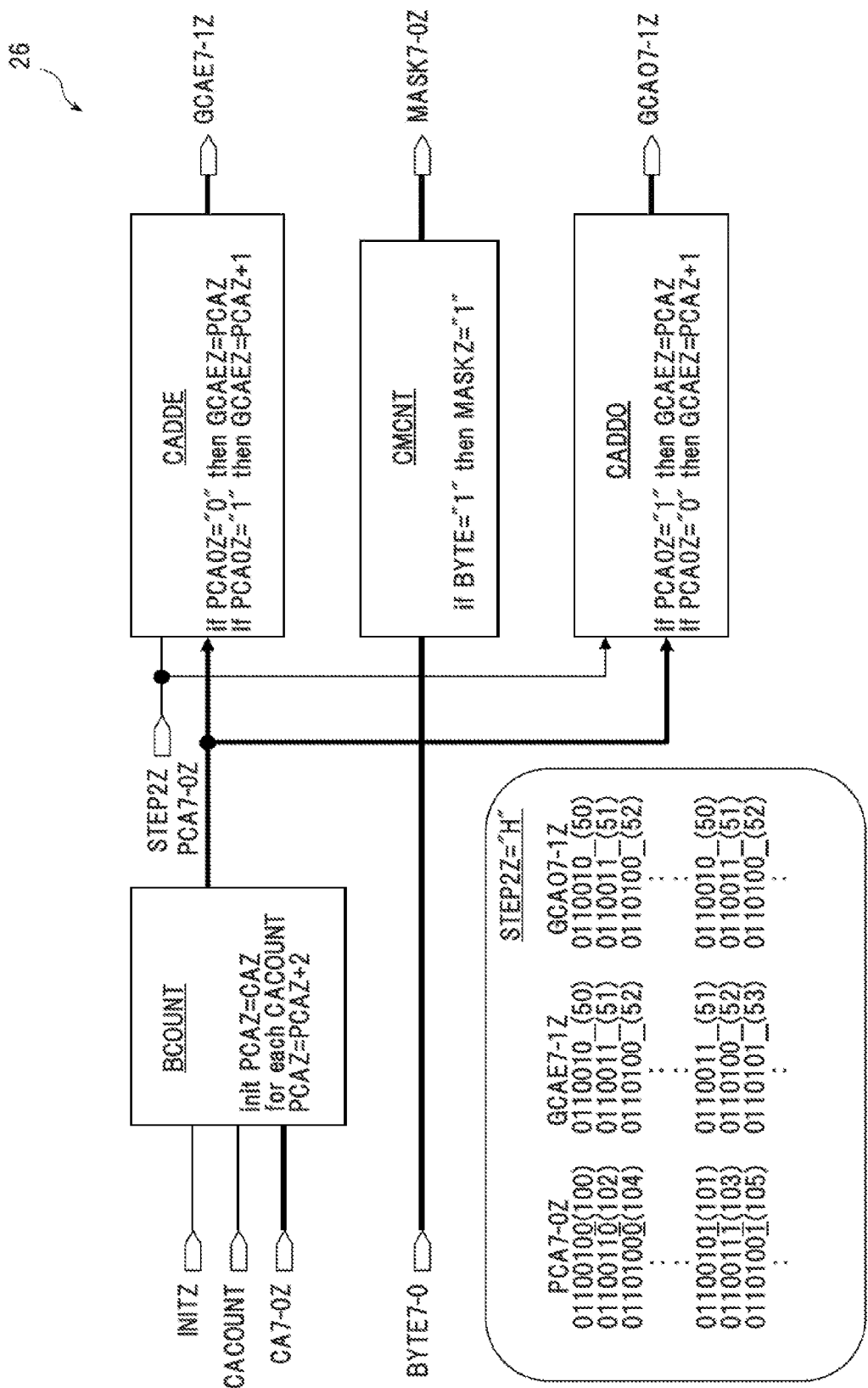
FIG. 2 illustrates an exemplary column-address control unit.

FIG. 2 illustrates an exemplary column-address control unit. The exemplary column-address control unit may be the column-address control unit 26 illustrated in FIG. 1. 26 illustrated in FIG. 1. The column-address control unit 26 includes a burst counter BCOUNT, column address adders CADDE and CADDO, and a column-mask control unit CMCNT. The burst counter BCOUNT loads the column address signals CA7-0Z as a burst start address in synchronization with the initialization signal INITZ and outputs 8-bit pre-column address signals PCA7-0Z. Thereafter, the burst counter BCOUNT increments the pre-column address signals PCA7-0Z by two in synchronization with the counter signal CACOUNT.

The column address adder CADDE outputs pre-column address signals PCA7-1Z as global column address signals GCAE7-1Z when a least significant bit PCA0Z of the pre-column address signals PCA7-0Z is "0". The column address adder CADDE outputs higher-order seven bits of an address obtained by adding 1 to the pre-column address signals PCA7-0Z as the global column address signals GCAE7-1Z when the step signal STEP2Z is at a high level and the least significant bit PCA0Z is "1". The column address adder CADDE prohibits the output of the global column address signals GCAE7-1Z when the step signal STEP2Z is at a low level and the least significant bit PCA0Z is "1".

The column address adder CADDO operates oppositely to the column address adder CADDE. The column address adder CADDO outputs the pre-column address signals PCA7-1Z as global column address signals CGAO7-1Z when the least significant bit PCA0Z is "1". The column address adder CADDO outputs higher-order seven bits of an address obtained by adding 1 to the pre-column address signals PCA7-0Z as the global column address signals GCAO7-1Z when the step signal STEP2Z is at a high level and the least significant bit PCA0Z is "0". The column address adder CADDO prohibits the output of the global column address signals GCAO7-1Z when the step signal STEP2Z is at a low level and the least significant bit PCA0Z is "0".

As illustrated in a frame on the lower left of FIG. 2, the column address adders CADDE and CADDO respectively generate the global column address signals GCAE7-1Z and the global column address signals CGAO7-1Z having substantially the same value when the step signal STEP2Z is at a high level and, the pre-column address signals PCA7-0Z are even number signals, for example, a least significant bit is "0". Data is input to and output from memory cells assigned to the same column address CA in an even number area EA and an odd number area OA illustrated in FIG. 3. A digit sequence in the frame indicates a binary number and a number in parentheses indicates a decimal number. The column address adder CADDE generates the global column address signals GCAE7-1Z larger than the global column address signals GCAO7-1Z by 1 when the pre-column address signals PCA7-0Z are odd number signals, for example, when a least significant bit is "1". Data is input to and output from memory cells assigned to column addresses CA shifted from each other by one address in the even number area EA and the odd number area OA illustrated in FIG. 3. The column-mask control unit CMCNT outputs the byte signals BYTE7-0 as mask signals MASKZ7-0Z (MASK7Z, MASK6Z, ..., and MASK0Z).

FIG. 3 illustrates an exemplary bank. The exemplary bank may be the bank BK0 illustrated in FIG. 1. The bank BK1-7 is substantially the same as or similar to the bank BK0. The bank BK0 includes the even number area EA and the odd number area OA. The even number area EA corresponds to CA0Z="0" and the odd number area OA corresponds to CA0Z="0". Each of the even number area EA and the odd number area OA includes a row decoder RDEC, a column decoder CDEC, a memory cell array MCA, and a data latch DTL. The even number area EA and the odd number area OA includes circuits substantially the same as or similar to each other.

The column decoder CDEC of the even number area EA includes eight sub-column decoders SDEC. The sub-column decoders SDEC correspond to data groups D7-0, respectively. Each of the data groups D7-0 includes 8-bit data (byte data). Data groups D7, D6, ..., and D0 correspond to one of the data terminal groups DQ63-56, DQ55-48, ..., and DQ7-0. In the semiconductor memory illustrated in FIG. 1, data read from sub-arrays SARY of a data group is output to a data terminal group DQ having a number different from a number of the data group. The data terminals DQ are effectively utilized and a data transfer rate is improved.

The sub-column decoders SDEC decode the common global column address signals GCAE7-1Z and activate one of column selection signals CLE, for example, CLEH0-127. The sub-column decoders SDEC of the column decoder CDEC in the odd number area OA decode the common global column address signals GCAO7-1Z and activate one of column selection signals CLO, for example, CLOH0-127.

Figure 4:
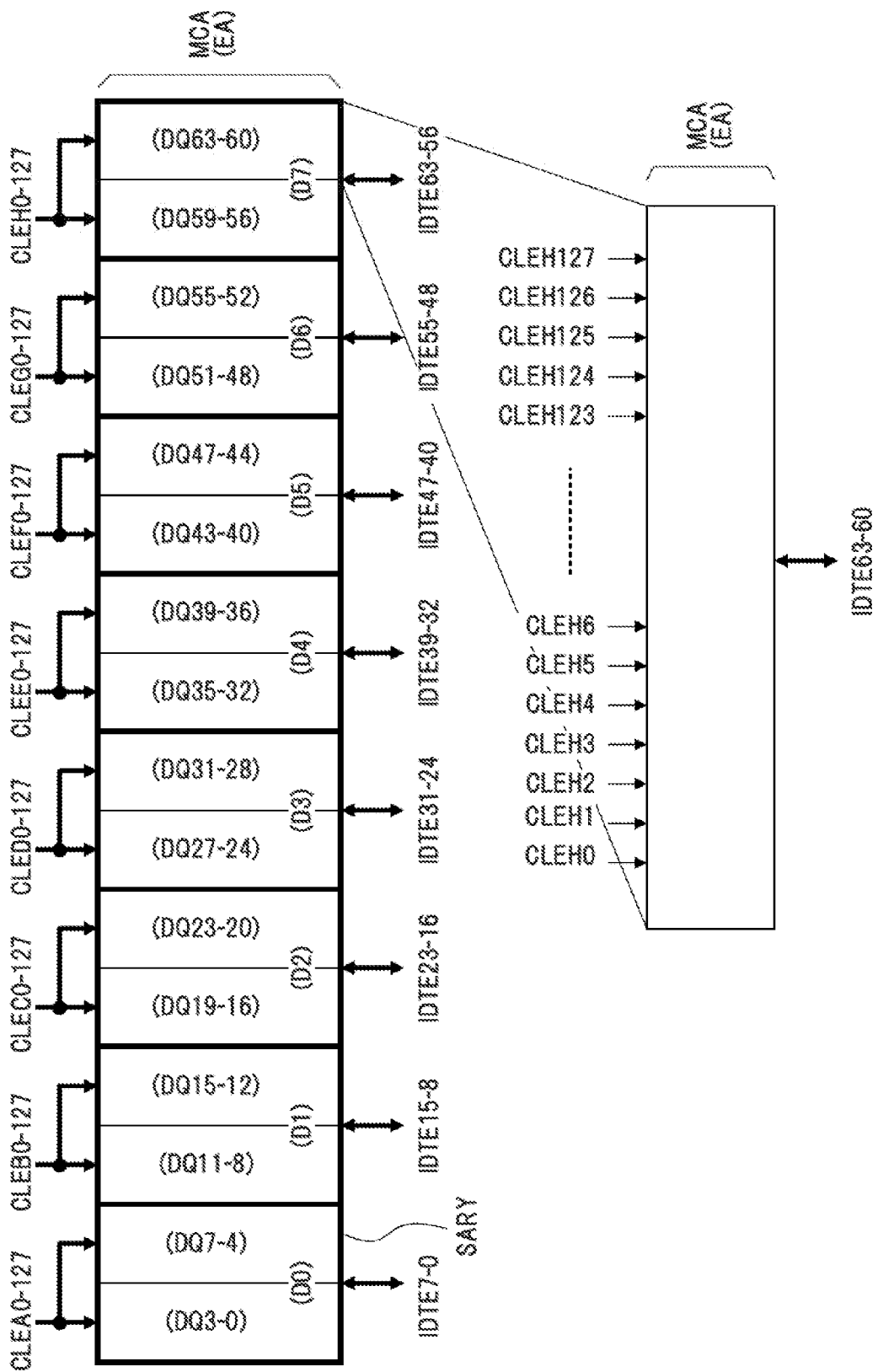
FIG. 4 illustrates an exemplary memory cell array.

As illustrated in FIG. 4, the column selection signals CLE are affixed with A, B, C, D, E, F, G, and H in order from a data group among data groups D0-7 with a smallest number. The column selection signals CLO also affixed with A, B, C, D, E, F, G, and H in order from a data terminal group with a smallest number. When each of the sub-column decoders SDEC receive a high-level mask signal (one of MASK7Z to MASK0Z), the sub-column decoder SDEC prohibits a decoding operation and sets the column selection signal CLE or CLO to a low level. Power consumption of the banks BK may be reduced by deactivating the sub-column decoders SDEC, which do not need to operate, for each of the data groups D7-0 using the mask signals MASK7Z to MASK0Z.

The memory cell array MCA of the even number area EA in FIG. 3 includes eight sub-arrays SARY that receive column selection signal groups CLEA0-127, CLEB0-127, ..., and CLEH0-127, respectively. The sub-arrays SARY correspond to the data groups D7-0, respectively. Each of the memory cell arrays MCA includes an area for storing eight data groups D7-0.

The data latch DTL of the even number area EA includes eight sub-latches SL corresponding to the data groups D7-0, respectively. The sub-latches SL are coupled to the sub-arrays SARY via complementary internal data line groups IDTE63-56, IDTE55-48, ..., and IDTE7-0. The sub-latches SL are coupled to internal data lines IDE 63-0 common to the even number area EA. A data latch of the odd number area OA also includes eight sub-latches SL corresponding to eight data terminal groups DQ, respectively. The sub-latches SL are coupled to the sub-arrays SARY via complementary internal data line groups IDTO63-56, IDTO55-48, ..., and IDTO7-0. The sub-latches SL are coupled to common internal data lines IDO63-0.

FIG. 4 illustrates an exemplary memory cell array. The exemplary memory cell array may be the memory cell array MCA illustrated in FIG. 3. The memory cell array MCA of the even number area EA is illustrated. Each of the sub-arrays SARY includes two areas to which 4-bit data, for example, DQ63-60 and DQ59-56, or the like is assigned. The two areas are coupled to common column selection signal lines, for example, CLEH0-127 and common internal data lines, for example, IDTE63-56.

Figure 5:
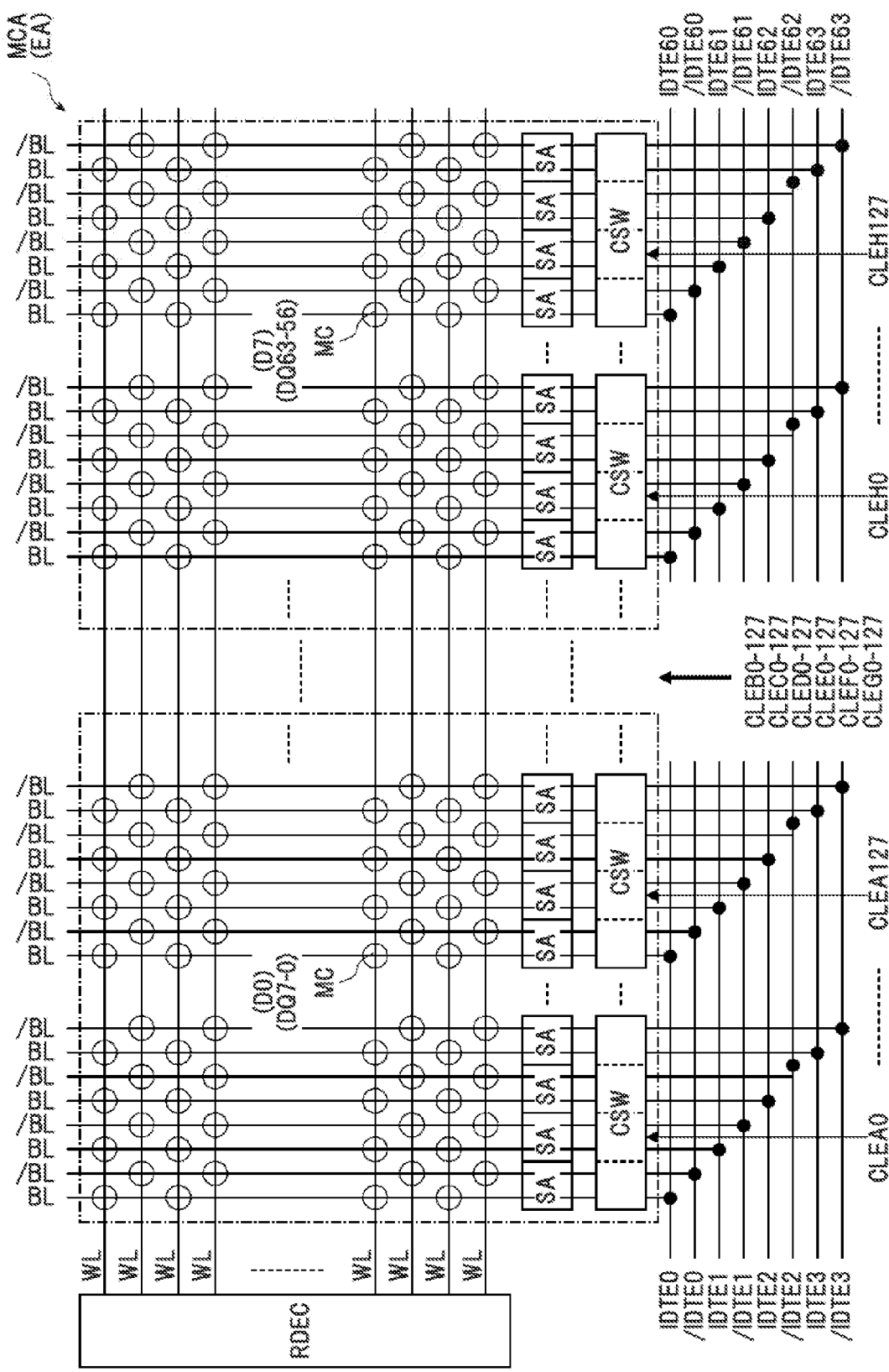
FIG. 5 illustrates an exemplary main part of a memory cell array.

FIG. 5 illustrates an exemplary main part of a memory cell array. The memory cell array may be the memory cell array MCA illustrated in FIG. 4. The odd number area OA is substantially the same as or similar to an odd number area illustrated in FIG. 5 except that signal names are different. A main part of the memory cell array MCA in other semiconductor memories described herein is substantially the same as or similar to the main part of the memory cell array MCA illustrated in FIG. 5 except that the number of memory cells MC coupled to one word line WL and the number of column selection signal lines CLE and CLO are different. An area to which 4-bit data is allocated, for example, an area corresponding to data terminals DQ3-0 includes four bit line pairs BL and /BL, four sense amplifiers SA, and four column switches CSW for each of the column selection signals CLEA0-127. Each of the column selection signals CLEA0-127 is supplied to four column switches CSW commonly.

For example, in an area corresponding to the data terminals DQ7-0 (a frame of an alternate long and short dash line on the left side in the figure), one of the column selection signals CLEA0-127 is activated according to the column address CA. Data are read from an area corresponding to the data terminals DQ3-0 and an area corresponding to the data terminals DQ7-4, respectively. Substantially the same holds true for areas corresponding to other data terminals DQ63-8. The memory cells MC from which data are read may not be adjacent to each other.

Each of the sense amplifiers SA is coupled to the bit line pairs BL and /BL illustrated on an upper side of FIG. 5. The bit line pairs BL and /BL may be wired to an upward direction and a downward direction of the sense amplifier SA via switches provided above and below the sense amplifier SA. The sense amplifier SA is selectively coupled to one of the two bit line pairs BL and /BL via the switches (a shared sense amplifier).

The memory cells MC are arranged in crossing portions of the word lines WL and the bit lines BL or /BL. Each of the word lines WL is coupled in common to the memory cells MC that store data groups D7, D6, ..., and D0. In the semiconductor memory illustrated in FIG. 1, each of the word lines WL is coupled to 8192 memory cells. In order to reduce load on the word lines WL, the plural row decoders RDEC may be arranged in the memory area EA. Word lines of metal wiring may be provided along the word lines WL of polysilicon or the like and the word lines WL and the word lines of metal wiring may be coupled at given intervals. The word lines WL may include main word lines and sub-word lines. Plural sub-word decoders that drive the sub-word lines may be arranged in the memory area EA. In FIG. 1, for example, image data is stored in the memory cells MC.

Figure 6:
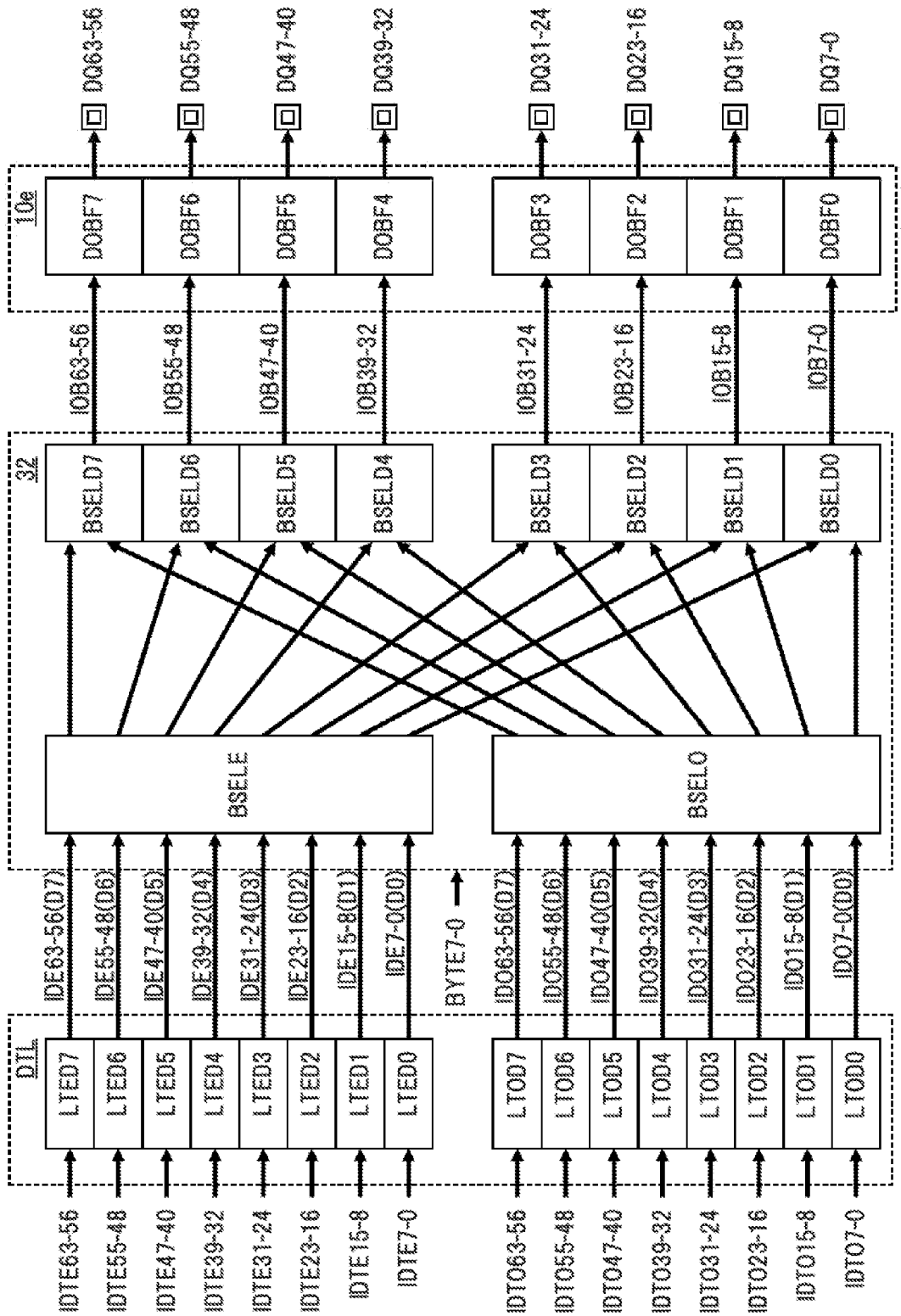
FIG. 6 illustrates an exemplary data bus selector.

FIG. 6 illustrates an exemplary data bus selector. The exemplary data bus selector may be the data bus selector 32 illustrated in FIG. 1. The data bus selector 32 selects one of a data group from the even number area EA and a data group from the odd number area OA and transfers the data group to the input/output buffer 10*e*. The data bus selector 32 includes byte selectors BSELE, BSELO, and BSELD7-0. The byte selector BSELE and the byte selector BSELO are substantially the same as or similar to each other. The byte selector BSELE transfers the data groups D7-0 supplied to the internal data lines IDE63-0 to the byte selectors BSELD7-0 according to the byte signals BYTE7-0. The byte selector BSELO transfers the data groups D7-0 supplied to the internal data lines IDO63-0 to the byte selectors BSELD7-0 according to the byte signals BYTE7-0.

Each of the byte selectors BSELD7-0 selects, according to the byte signals BYTE7-0, one of the data groups D7-0 transferred from the byte selectors BSELE and BSELO and transfers the data groups D7-0 to the internal data buses IOB63-56, IOB55-48, ..., and IOB7-0. The input/output buffer 10*e* includes data output buffers DOBF7, DOBF6, ..., and DOBF0 that output the data group transferred to the internal data buses IOB63-56, IOB55-48, ..., and IOB7-0 to the data terminals DQ63-56, DQ55-48, and DQ7-0.

In FIG. 6, paths of a data group (read data) output from the data terminals DQ to the outside of the memory MEM are indicated by arrows. The data bus selector 32 determines an output destination of the read data group according to the byte signals BYTE7-0. The data bus selector 32 may transfer the data group bi-directionally. Paths of a data group (write data) supplied to the data terminals DQ are indicated by arrows in a direction opposite to that illustrated in the figure.

Figure 7:
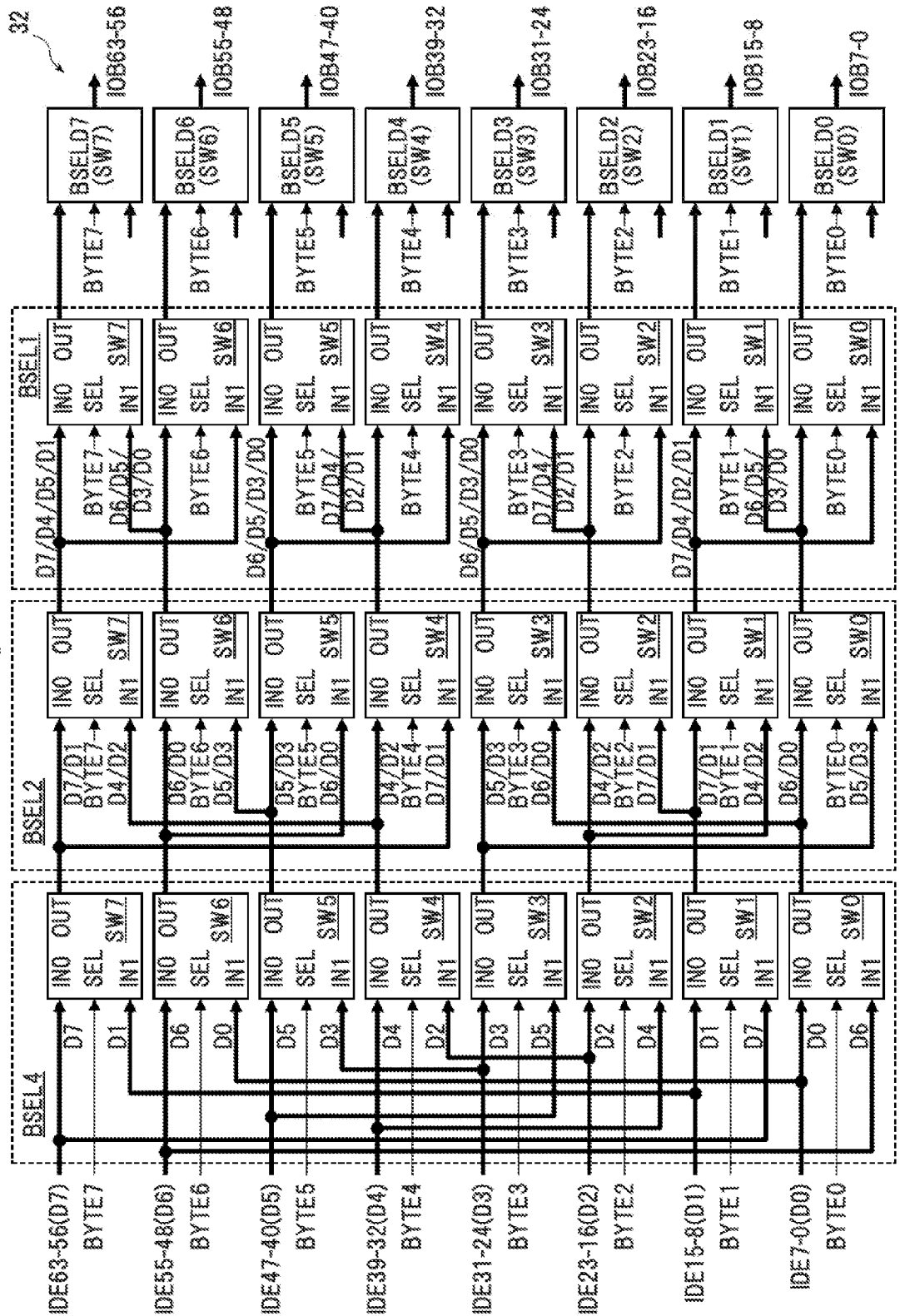
FIG. 7 illustrates another exemplary data bus selector.

FIG. 7 illustrates an exemplary data bus selector. The data bus selector may be the data bus selector 32 illustrated in FIG. 6. Each of the byte selectors BSELE and BLSEO includes sub-selectors BSEL4, BSEL2, and BSEL1. In FIG. 7, the byte selector BSELE and the sub-selector BSEL corresponding to the even number area EA are illustrated.

Each of the sub-selectors BSEL4, BSEL2, and BSEL1 includes eight selector switches SW7-0. Each of the selector switches SW7-0 outputs a data group received by an input terminal IN0 to an output terminal OUT when the byte signals BYTE7-0 received by a select terminal SEL are at a low level. Each of the selector switches SW7-0 outputs a data group received by an input terminal IN1 to the output terminal OUT when the byte signals BYTE7-0 received by the select terminal SEL are at a high level. For example, the selector switch SW7 of the sub-selector BSEL4 outputs a data group D7 from the output terminal OUT when the byte signal BYTE7 is at a low level.

The sub-selectors BSEL4, BSEL2, and BSEL1 replace a data group, for example, 1-byte data. Selector switches SW7-4 of the sub-selector BSEL4 correspond to higher-order 4-byte data groups D7-4. Selector switches SW3-0 of the sub-selector BSEL4 correspond to lower-order 4-byte data groups D3-0. The selector switches SW7-0 of the sub-selector BSEL4 select a corresponding data group when a low-level signal is received by the selector terminal SEL, and select another data group when a high-level signal is received by the selector terminal SEL.

The sub-selector BSEL2 replaces 2-byte data groups with each other for each of adjacent four selector switches, for example, SW7-4. The sub-selector BSEL1 replaces 1-byte data groups with each other for each of adjacent two selector switches, for example, SW7-6.

The number of sub-selectors BSEL may be n when the number of data groups is the nth power of 2 (in this example, n=3). For example, when there are sixteen data groups (sixteen bytes), four sub-selectors BSEL are provided. A sub-selector including sixteen selector switches is provided on an input side of the sub-selector BSEL4. The sub-selector replaces a higher-order 8-byte data group with a lower-order 8-byte data group for each of the bytes. In the data bus selector 32, plural sub-selectors BSEL provided in association with the number of data groups are coupled according to a given rule. Selector switches SW0-7 include, for example, simple logic circuits illustrated in FIG. 8. Therefore, the data bus selector 32 is simply and easily designed.

The byte selectors BSELD7-0 are substantially the same as or similar to the selector switches SW7-0. Each of the byte selectors BSELD7-0 selects a data group transferred to the sub-selector BSEL1 corresponding to the even number area EA when each of the byte signals BYTE7-0 is at a low level. Each of the byte selectors BSELD7-0 selects a data group transferred from the sub-selector BSEL1 corresponding to the odd number area OA when each of the byte signals BYTE7-0 is at a high level.

Figure 8:
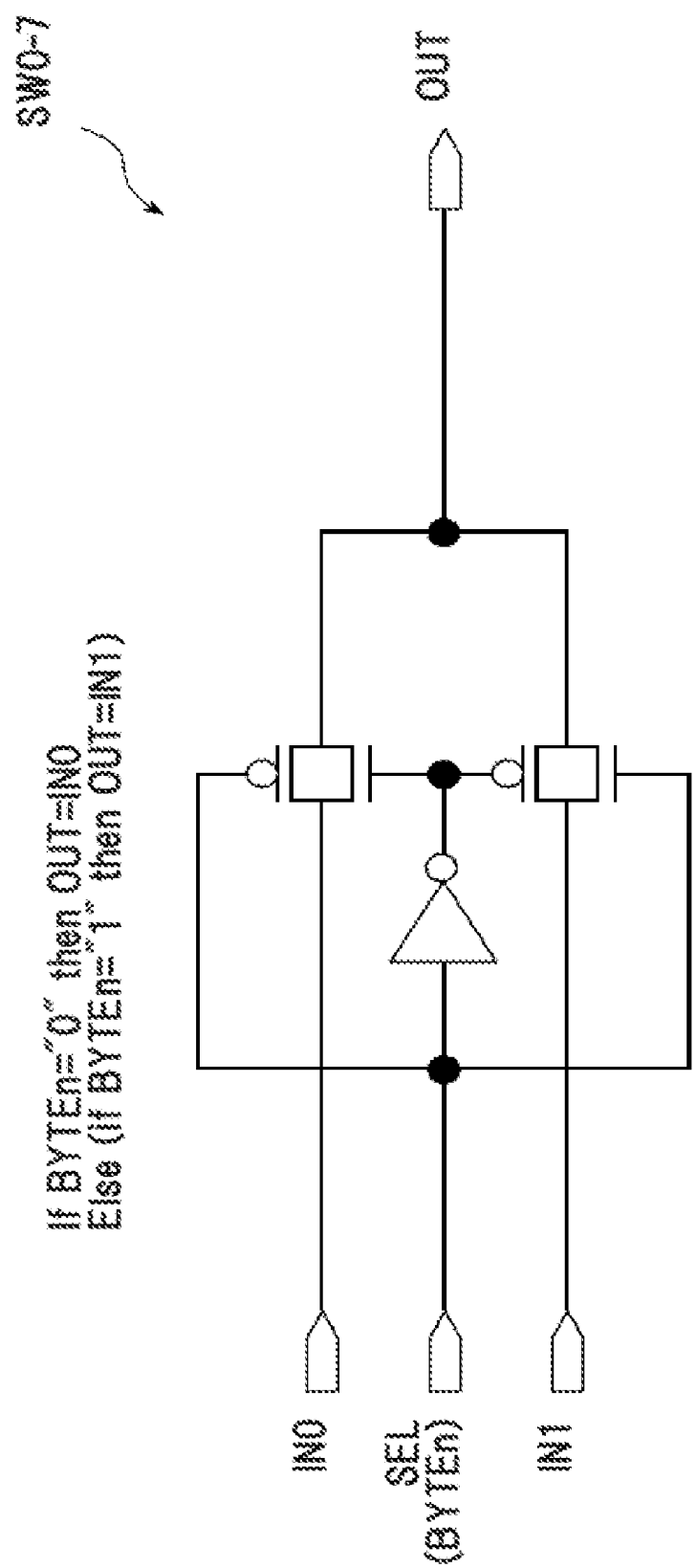
FIG. 8 illustrates an exemplary selector switch.

FIG. 8 illustrates an exemplary selector switches. The exemplary selector switches may be the selector switches SW0-7 illustrated in FIG. 7. Each of the selector switches SW0-7 includes a CMOS transfer gate that couples the input terminal IN0 to the output terminal OUT when the select terminal SEL receives a low-level signal and a CMOS transfer gate that couples the input terminal IN1 to the output terminal OUT when the select terminal SEL receives a high-level signal.

Figure 9:
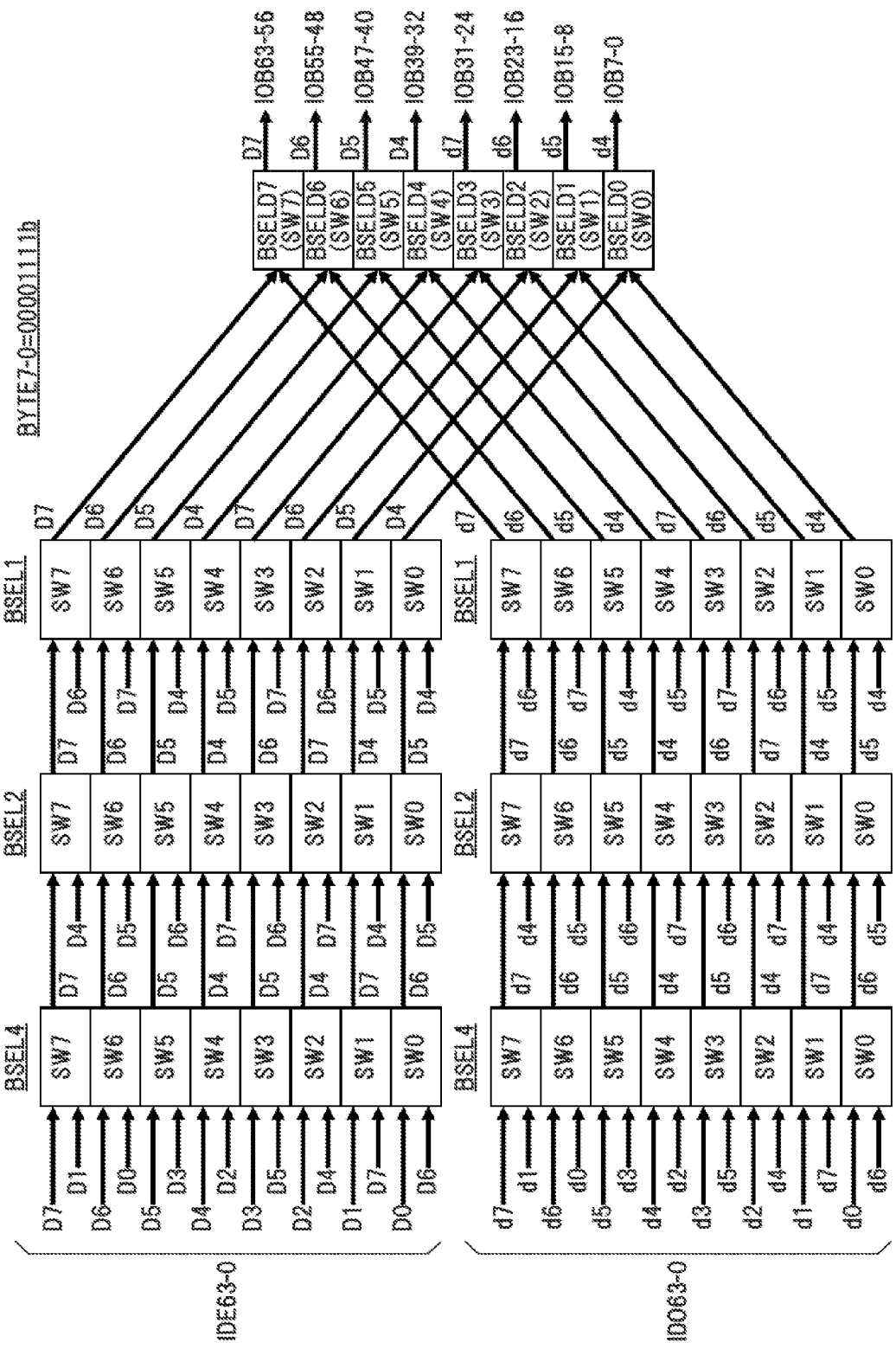
FIG. 9 illustrates exemplary operations of a data bus selector.

FIG. 9 illustrates exemplary operations of a data bus selector. The data bus selector may be the data bus selector 32 illustrated in FIG. 7. For example, the byte signals BYTE7-0 are "00001111" in a binary number. "b" is added to the end of a digit sequence of the binary number. In FIG. 9, the data groups D7-0 output from the even number area EA and the data groups d7-0 output from the odd number area OA are illustrated. In the sub-selectors BSEL4, BSEL2, and BSEL1, the selector switches SW7-4 that receive the byte signals BYTE7-4 of a logic "0" select data groups supplied to input terminals on an upper side of the figure. The selector switches SW3-0 that receive the byte signals BYTE3-0 of a logic "1" select data groups supplied to input terminals on a lower side of the figure.

The sub-selector BSEL1 of the even number area EA outputs data groups D7 to D4. The sub-selector BSEL1 of the odd number area OA outputs data groups d7 to d4. The byte selectors BSELD7-4 that receive the byte signals BYTE7-4 of a logic "0" select data groups D7-4 supplied to input terminals on the upper side of FIG. 9. Byte selectors BSELD3-0 that receive the byte signals BYTE3-0 of a logic "1" select data groups d7-4 supplied to the input terminals on the lower side of FIG. 9. The data groups D7 to D4 read from the even number area EA are transferred to the internal data buses IOB63-32 corresponding to the data terminals DQ63-32. The data groups d7 to d4 read from the odd number area OA are transferred to the internal data buses IOB31-0 corresponding to the data terminals DQ31-0. The data groups d7 to d4 are output to the data terminals DQ31-0 rather than the data terminals DQ63-32.

Figure 10:
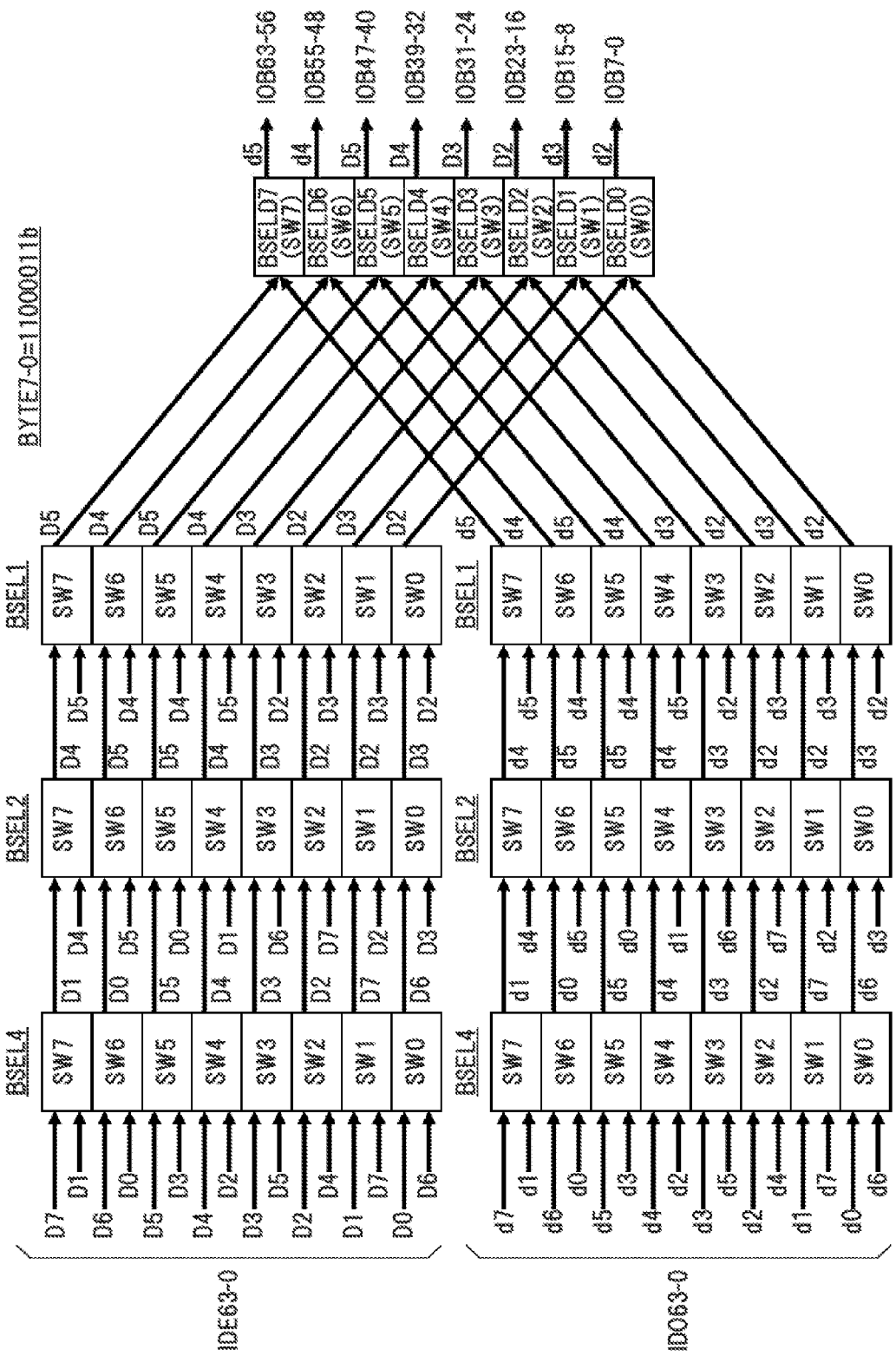
FIG. 10 illustrates other exemplary operations of a data bus selector.

FIG. 10 illustrates other exemplary operations of a data bus selector. The data bus selector may be the data bus selector 32 illustrated in FIG. 7. A logic of the byte signals BYTE7-0 may be "11000011b". Selector switches SW5-2 that receive byte signals BYTE5-2 of a logic "0" select data groups supplied to input terminals on an upper side of FIG. 10. Selectors switches SW7-6 and 2-1 that receive byte signals BYTE7-6 of a logic "1" select data groups supplied to input terminals on a lower side of FIG. 10. The byte selectors BSELD7-0 operate in substantially the same manner as the selector switches SW7-0. Data groups D5 to D2 read from the even number area EA are transferred to internal data buses IOB47-16 corresponding to data terminals DQ47-16. Data groups d5 to d4 and d3 to d2 read from the odd number area OA are transferred to internal data buses IOB63-48 and IOB15-0 corresponding to the data terminals DQ63-48 and DQ15-0. The data groups d5 to d2 are output to data terminals DQ63-48 and DQ15-0 rather than the data terminals DQ47-16.

Figure 11:
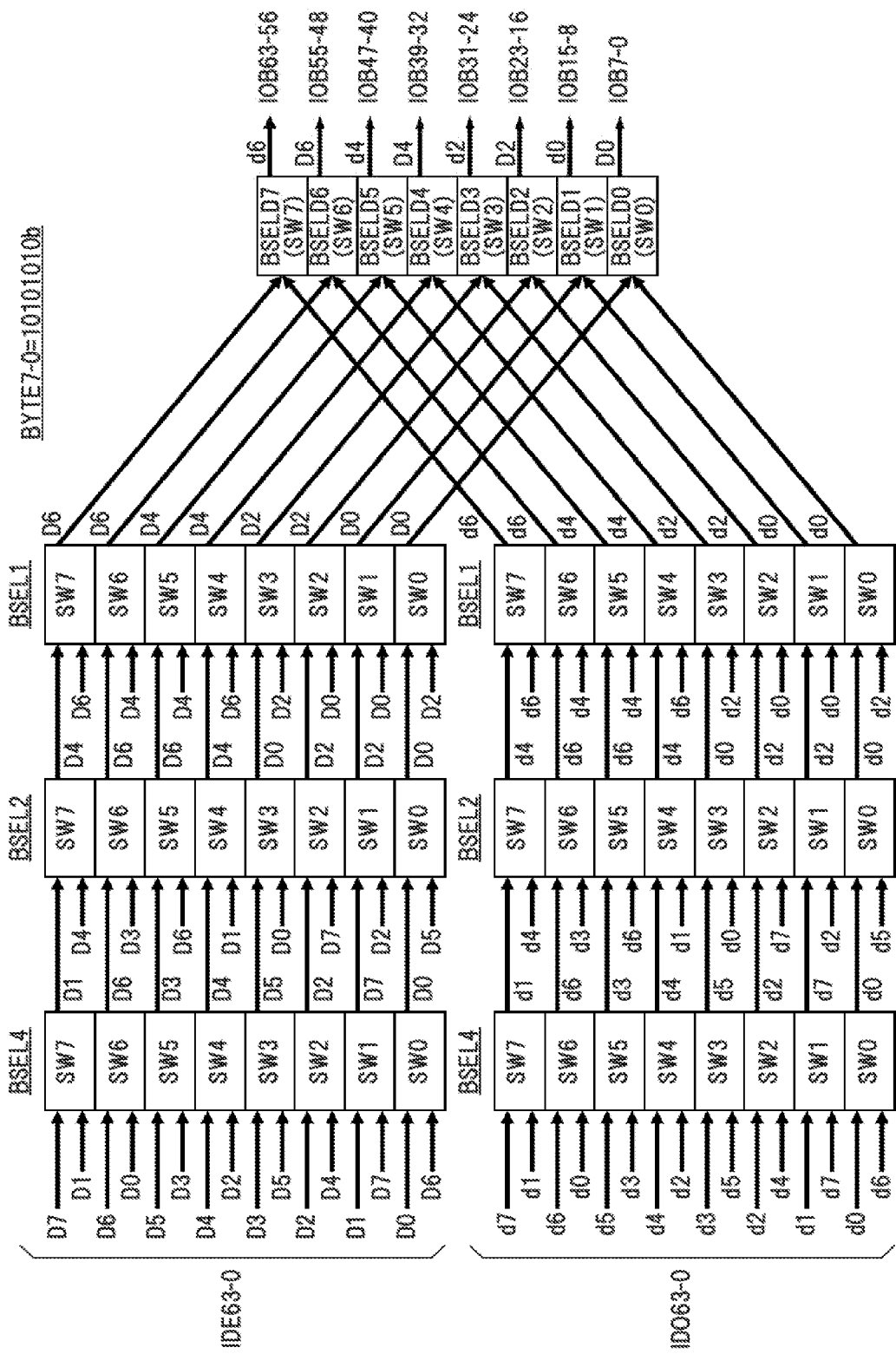
FIG. 11 illustrates other exemplary operations of the data bus selector.

FIG. 11 illustrates still other exemplary operations of a data bus selector 32. The data bus selector may be the data bus selector illustrated in FIG. 7. A logic of the byte signal BYTE7-0 may be "10101010b". Operations of the selector switches SW7-0 and the byte selectors BSELD7-0 are substantially the same as or similar to the operations illustrated in FIGS. 9 and 10. Byte selectors BSELD 6, 4, 2, and 0 that receive low-level byte signals BYTE 6, 4, 2, and 0 output data groups D6, D4, D2, and D0. Byte selectors BSELD 7, 5, 6, and 1 that receive high-level byte signals BYTE 7, 5, 3, and 1 output data groups d6, d4, d2, and d0.

Figure 12:
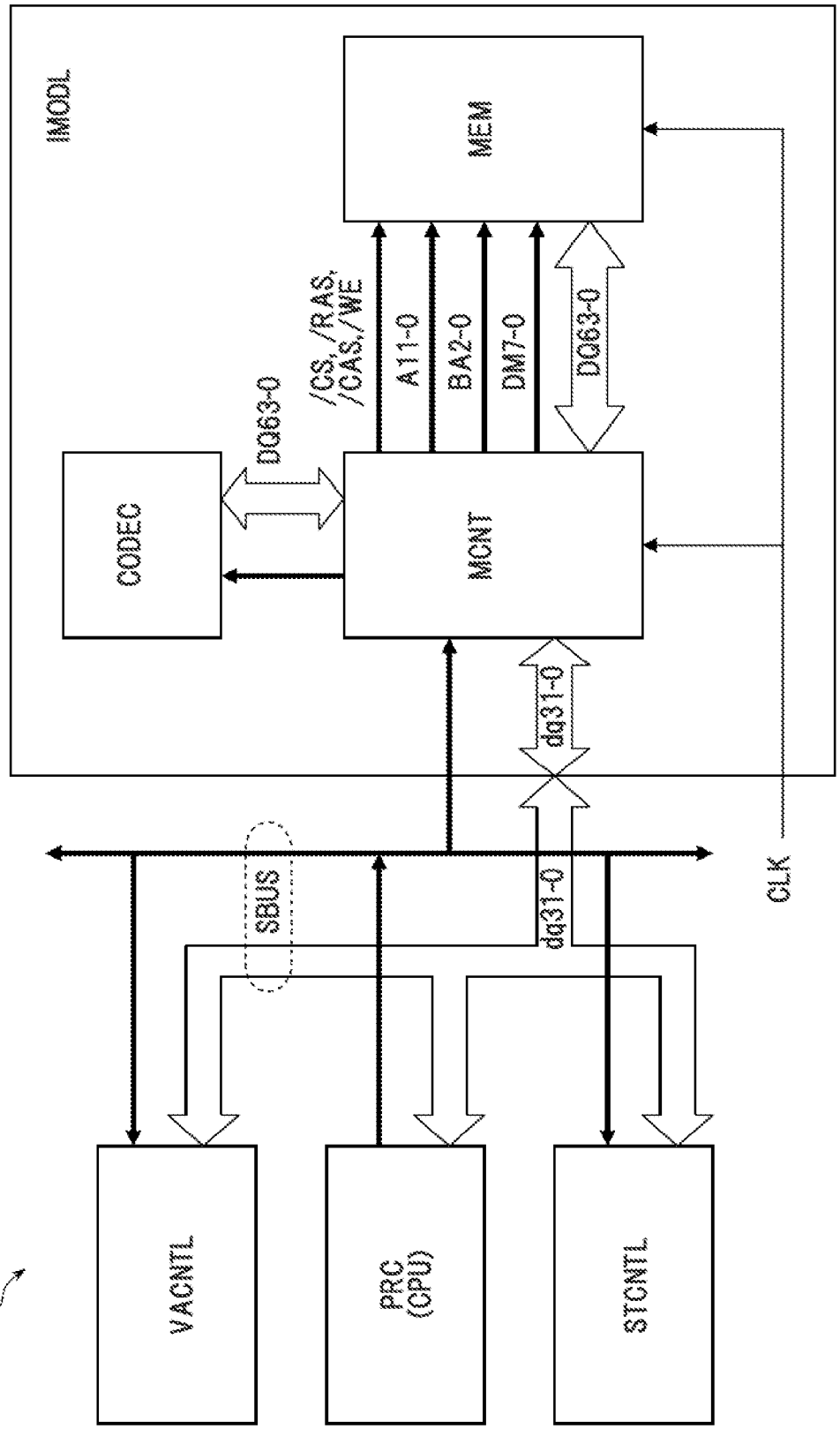
FIG. 12 illustrates an exemplary system mounted with a semiconductor memory.

FIG. 12 illustrates an exemplary system mounted with a semiconductor memory. The semiconductor memory may be the semiconductor memory MEM illustrated in FIG. 1. For example, the system SYS is a non-general purpose system such as a built-in image processing system. Since the non-general purpose system increases data bus width without using a high-frequency clock, a data transfer rate is improved. Therefore, when the memory MEM is mounted on an image processing module IMODL illustrated in FIG. 12, data bus width in the module IMODL may be increased without increasing bus width of an external data bus (SBUS) of the module IMODL.

The system SYS includes a video/audio controller VACNTI, a processor PRC such as a CPU, a storage device controller STCNTL, and the image processing module IMODL. The image processing module IMODL includes, for example, a CODEC employing H.264 which is one of compression encoding methods for moving image data, a memory controller MCNT, and the memory MEM.

For example, the image processing module IMODL is formed by a SoC(System on Chip) or a SiP (System in Package). The memory MEM may be a memory for a particular or selected application, for example, an ASIC memory. The ASIC memory may have large bus width of a data signal compared with that of a general-purpose memory for loose external terminal number limitation. The system includes the processor PRC, the memory controller MCNT, and the memory MEM.

The processor PRC outputs an access request to the memory controller MCNT in order to write image data in the memory MEM and read image data from the memory MEM. The memory controller MCNT input 64-bit data DQ63-0 to and output the 64-bit data DQ63-0 from the memory MEM and the CODEC and inputs 32-bit data dq31-0 to and outputs the 32-bit data dq31-0 from the system bus SBUS. Since data bus width in the module IMODL is increased to increase a data processing amount, high cost performance is obtained in the system as a whole even when data bus width of the system bus SBUS is small.

Figure 13:
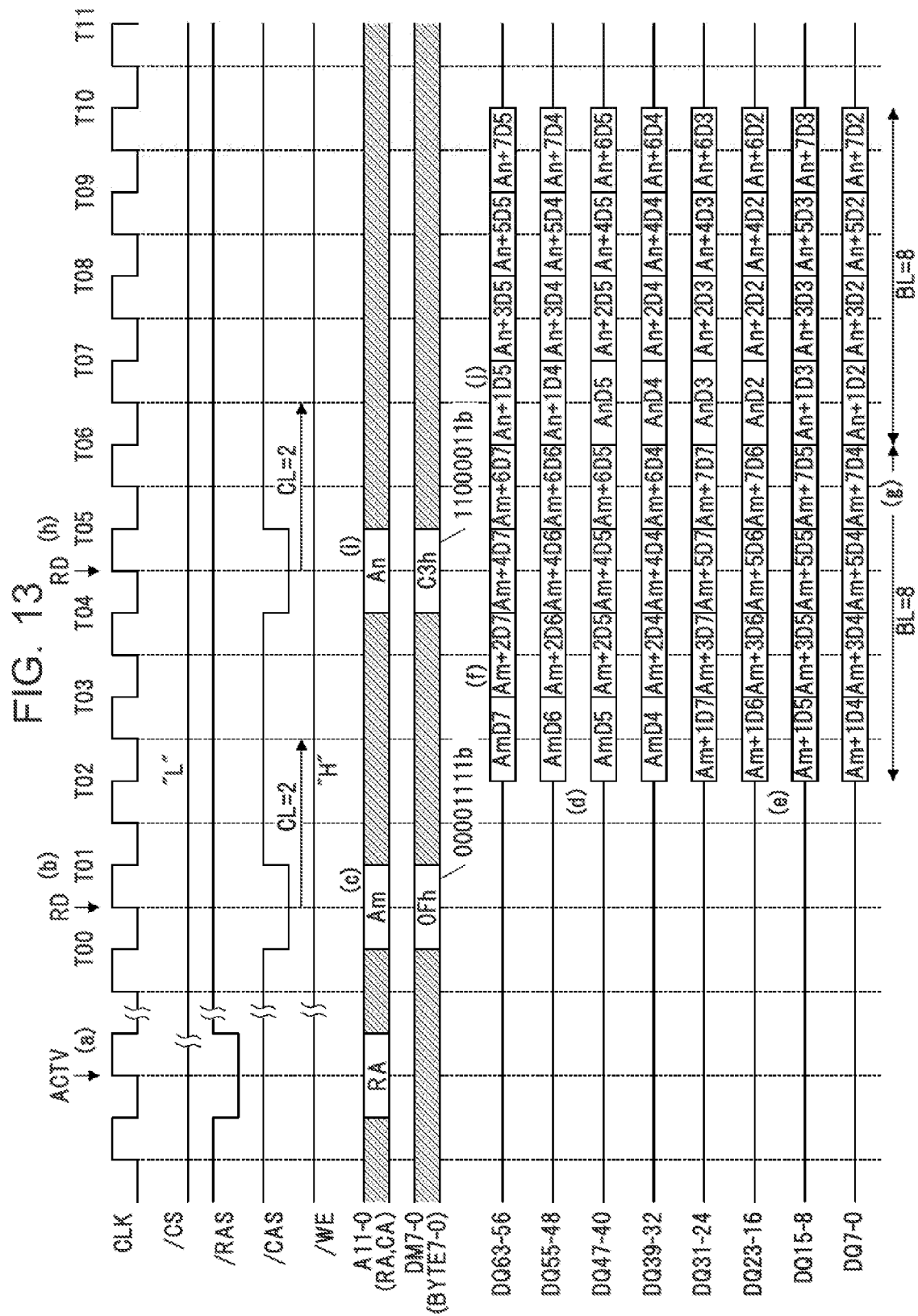
FIG. 13 illustrates exemplary operations of a semiconductor memory.

FIG. 13 illustrates exemplary operations of a semiconductor memory. The semiconductor memory may be the semiconductor memory MEM illustrated in FIG. 1. When the memory controller MCNT controlled by the processor PRC outputs an access command to the memory MEM, the operations illustrated in FIG. 13 are performed. The burst length BL is set to "8" and the CAS latency CL is set to "2". Times T00-11 indicate a clock cycle. The active command ACTV is supplied to the memory MEM in advance and any of the banks BK0-7 is activated (FIG. 13(a)). The active command ACTV is indicated by a low-level /CS signal and a /RAS signal.

At time T01, a read command RD is supplied from the memory controller MCNT to the memory MEM (FIG. 13(b)). The read command RD may be indicated by low-level /CS signal and /CAS signal and a high-level /WE signal. The processor PRC reads the data groups D7-4 stored in the memory MEM. The memory controller MCNT supplies a column address CA=Am and a data mask signal DM (BYTE7-0 signal)=0Fh to the memory MEM together with the read command RD (FIG. 13 (c)). "h" of "0Fh" indicates that "0F" is a hexadecimal number.

At time T03, the memory MEM outputs higher-order 4-byte data groups D7 to D4 among 8-byte data stored in the memory cell MC assigned to a column address Am to the data terminals DQ63-32 in response to the first read command RD(FIG. 13(d)). The memory MEM outputs higher-order 4-byte data groups D7 to D4 among 8-byte data stored in the memory cell MC assigned to a column address Am+1 to the data terminals DQ31-0 (FIG. 13(e)).

"0" of the byte signals BYTE7-4 indicates that the data groups D7 to D4 among the data groups D7 to D0, which are assigned to the received column address Am, are output to the data terminals DQ, for example, DQ63-32. "1" of the byte signals BYTE3-0 indicates the data terminals DQ, for example, DQ32-0 (data terminals that output the next data group) that output the data groups D7 to D4 assigned to an address obtained by adding 1 to the received column address Am. The data groups D7 to D4 are output from the data terminals D32-0 corresponding to the byte signals BYTE3-0 of "1".

Data groups output from the data terminals DQ, for example, D7 to D4 and the data terminals DQ from which the data groups are output are arbitrarily designated based on the byte signals BYTE7-0. Numbers, for example, "7 to 4" of the data groups D7 to D4 transferred from memory areas of the different column address signals CA7-0 to the data terminals DQ63-0, respectively, are substantially equal to one another. The common data groups D7 to D4 having different column addresses CA are output from the 4-byte data terminals DQ, respectively. Therefore, the number of "0"s and the number of "1"s of the byte signals BYTE7-0 are substantially set equal.

In FIG. 1, 4-byte data of the column address Am+1 are not output at a second clock cycle T04 but are output one clock earlier. Lower order 4-byte data not requested by the system SYS are not output to the data terminals DQ31-0. Since requested data is output from the memory MEM, a data transfer rate is improved. Data output timing after the column address Am+1 becomes earlier.

When the column address Am is an even number, read data AmD7 to AmD4 are read from the even number area EA and read data Am+1D7 to Am+1D4 are read from the odd number area OA. When the column address Am is an odd number, the read data AmD7 to AmD4 are read from the odd number area OA and the read data Am+1D7 to Am+1D4 are read from the even number area EA.

Data of the column address Am+1 to be output at time T04 has already output at time T03. At time T04, data Am+2D7 to Am+2D4 and Am+3D7 to Am+4D4 read from the memory cells MC corresponding to column addresses Am+2 and Am+3 are output from the data terminals DQ63-0 (FIG. 13(f)). In response to the first read command RD, data up to a column address Am+7 corresponding to the burst length BL =8 are output from the data terminals DQ63-0 by using four clock cycles (FIG. 13(g)). Since data corresponding two column addresses CA is output in one clock cycle, operations of the burst length BL =8 are performed in four clock cycles. Since read data having different column addresses CA are output to one half and the other half of the data bus width (64 bits), output time for the read data is halved.

At time T05, the next read command RD is supplied from the memory controller MCNT to the memory MEM (FIG. 13(h)). The processor PRC requests the data groups D5 to D2 stored in the memory MEM. The memory controller MCNT supplies a column address CA=An and data mask signals DM (BYTE7-0 signals)=C3h to the memory MEM together with the read command RD (FIG. 13(i)). Based on "C3h" of the byte signals BYTE7-0, as illustrated in FIG. 10, the data groups D5-2 are output from the data terminals DQ47-16 (four bytes) and the data groups D5 to D2 are output from the data terminals DQ 63-48 and DQ15-0.

At time T07, the memory MEM outputs the 4-byte data groups D5 to D2 among the 8-byte data stored in the memory cell MC assigned to the column address An to the data terminals DQ47-16 (FIG. 13(j)). The memory MEM outputs the 4-byte data groups D5 to D2 among the 8-byte data stored in the memory cell MC assigned to the column address An+1 to the data terminals DQ63-56 and 16-0. In the following burst operations, in substantially the same manner, data corresponding to continuous two column addresses CA are contemporaneously output to the data terminals DQ63-0. In second burst read, as in the first burst read, since requested data is output from the memory MEM, a data transfer rate is improved. Data output timing after the column address An+1 becomes earlier.

Image data includes plural block data of a given size. A part of information of the image data rather than the entire information may be processed. For example, the image data processing is performed based on luminance information included in the image data. Image information such as the luminance information may be assigned to substantially the same area in each of the image data. Therefore, as illustrated in FIG. 13, a method of repeatedly accessing the specific data groups D7 to D4 (or D5 to D2) may be effective for access to the image data.

In a write operation, data groups designated by the byte signals BYTE7-0 are supplied to the memory MEM. Two data groups written in memory cells assigned to the continuous two column addresses CA are contemporaneously supplied to the memory MEM. In a burst write operation, write data supplied to the memory MEM first is supplied to the memory MEM together with a write command and the column address CA. In the write operation, the data illustrated in FIG. 13 is supplied to the memory MEM two clock cycles earlier as write data. Other operations are substantially the same as or similar to the operations illustrated in FIG. 13. The data bus selector 32 couples, in order opposite to the order illustrated in FIG. 7, the internal data buses IOB63-0 to given internal data lines IDE63-0 and IDO63-0 using a selector for transferring data. The write data DQ63-0 are written in at least one of the even number area EA and the odd number area OA according to a logic of the byte signals BYTE7-0.

When one of 3-bit addresses for identifying the banks BK0-7 is, for example, a least significant bit of the column address CA, data groups AmD7-4 and data groups Am+1D7-4 illustrated in FIG. 13 are read from the different banks BK. A global column address signal GCAEZ or GCAOZ from the column-address control unit 26 is supplied to the two banks BK according to the bank addresses BA2-0. Word lines of the two banks BK are activated and a data groups is read from a memory cell selected by the column address CA among memory cells coupled to the word lines. Data groups read from the two banks BK, respectively, are output to the internal data lines IDE63-0 or IDO63-0 according to the bank addresses BA2-0 and transferred to the data bus selector 32. Each of the banks BK0-7 includes a data selector that outputs output of the data latch DTL to the internal data lines IDE63-0 or IDO63-0. Operations substantially the same as or similar to the operations illustrated in FIG. 13 may be performed.

Data groups stored in the memory cells MC assigned to the different column addresses CA are contemporaneously output to the data terminals DQ63-0. An arbitrary data group among data groups selected by the continuous column addresses CA is read. In the write operation, as in the read operation, data groups written in the memory cells MC assigned to the different column addresses CA are contemporaneously supplied to the data terminals DQ63-0. Therefore, the number of clock cycles for a burst operation is halved. Since the byte signals BYTE7-0 are used, a data group to be read is designated for each of read commands, i.e., for each of burst operations and a data group to be written is designated for each of write commands, i.e., each of burst operations. Therefore, data requested by the system SYS is read or written. A data transfer rate and performance of the system SYS are improved.

When the data bus selector 32 replaces and selects a data group according to a given rule, data is input to and output from the data terminals DQ63-0 according to substantially the same rule. Therefore, a design the system SYS may become easier.

Since the circuit of the semiconductor memory MEM illustrated in FIG. 1 is changed, arbitrary 2-type data groups among the 8-byte data groups D7 to D0 assigned to continuous four column addresses CA are contemporaneously output from the data terminals DQ63-0 to the outside. The arbitrary 2-byte data groups among the 8-byte data groups D7 to D0 assigned to the continuous four column addresses CA are contemporaneously written in the data terminals DQ63-0. Each of the banks BK includes four memory areas. The column-address control unit 26 includes four column address adders corresponding to the four memory areas. The burst counter BCOUNT of the column-address control unit 26 increments the pre-column address signals PCA7-0Z by four in synchronization with the counter signal CACOUNT.

A logic of the byte signals BYTE7-0 may be supplied to address terminals A11-8 corresponding to a free bit of the column address signal CA. The logic of the byte signals BYTE7-0 is encoded and supplied to the address terminal A11-8. Sixteen data read patterns are designated by the 4-bit address terminals A11-8. 4-bit byte terminals BYTE3-0 may be provided to supply the byte signals BYTE7-0 to the memory MEM using the address terminals A11-8 and the byte terminals BYTE3-0.

Figure 14:
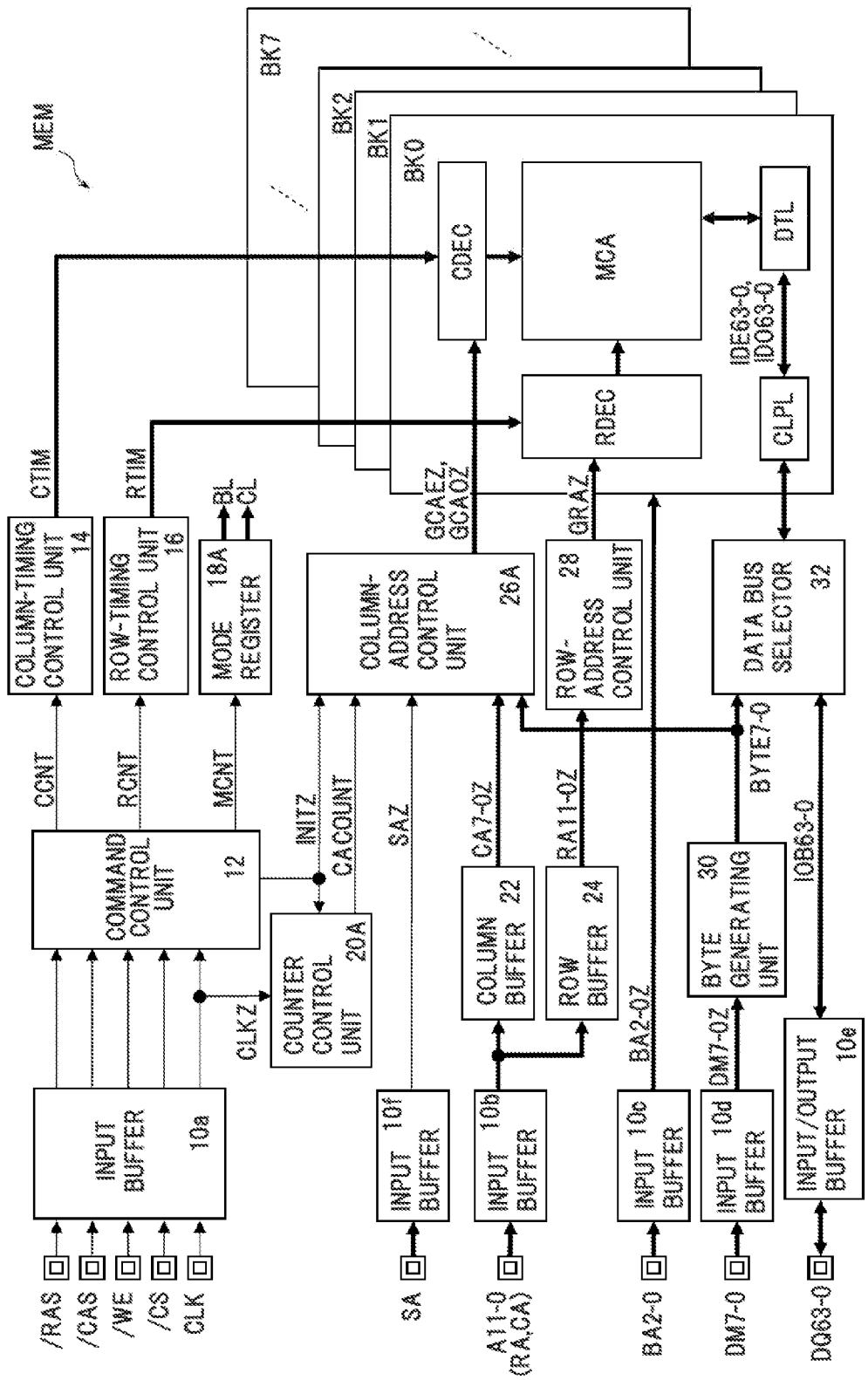
FIG. 14 illustrates a second semiconductor memory.

FIG. 14 illustrates a second semiconductor memory. In the second semiconductor memory, elements substantially the same as the elements in the first semiconductor memory (FIG. 1) are denoted by the same reference numerals and signs and explanation is reduced or omitted. As in FIG. 1, the memory MEM may be an SDRAM. The memory MEM may be mounted on the system SYS illustrated in FIG. 12. For example, image data may be stored in the memory cells MC.

The memory MEM includes a mode register 18A, a counter control unit 20A, and a column-address control unit 26A instead of the mode resister 18, the counter control unit 20 and the column-address control unit 26. Each of the banks BK0-7 includes a column pipeline CLPL between the data latch DTL and the data bus selector 32A. The memory MEM includes an input buffer 10f that receives a select address signal SA and outputs a select address signal SAZ. The memory controller MCNT illustrated in FIG. 12 outputs the select address signal SA to the memory MEM. Other elements are substantially the same as or similar to the elements illustrated in FIG. 1.

The mode register 18A is substantially the same as the mode register 18 illustrated in FIG. 1 but outputs a step signal STEP2Z. In the second semiconductor memory, a burst operation is started when different column address signals CA are sequentially received. The command control unit 12 outputs the initialization signal INITZ twice for each burst operation. The counter control unit 20A starts, for each burst operation, output of the counter signal CACOUNT after a given number of clocks elapses from receiving the initialization signal INITZ for the second time. The counter signal CACOUNT is output in synchronization with the clock signal CLKZ. The number of pulses of the counter signal CACOUNT is substantially equal to the burst length BL.

The column-address control unit 26A does not output the mask signal MASKZ unlike the column-address control unit 26 illustrated in FIG. 1. The column pipeline CLPL of each of the banks BK0-7 supplies read data output from the data latch DTL to the internal data lines IDE63-0 to the data bus selector 32 at one clock cycle later. The data bus selector 32 contemporaneously receives the internal data signals IDE63-0 and IDO63-0 (128 bits) output from the data latch DTL at one clock cycle shifted from each other. The data bus selector 32 is substantially the same as or similar to, for example, the circuit illustrated in FIGS. 6 and 7.

Figure 15:
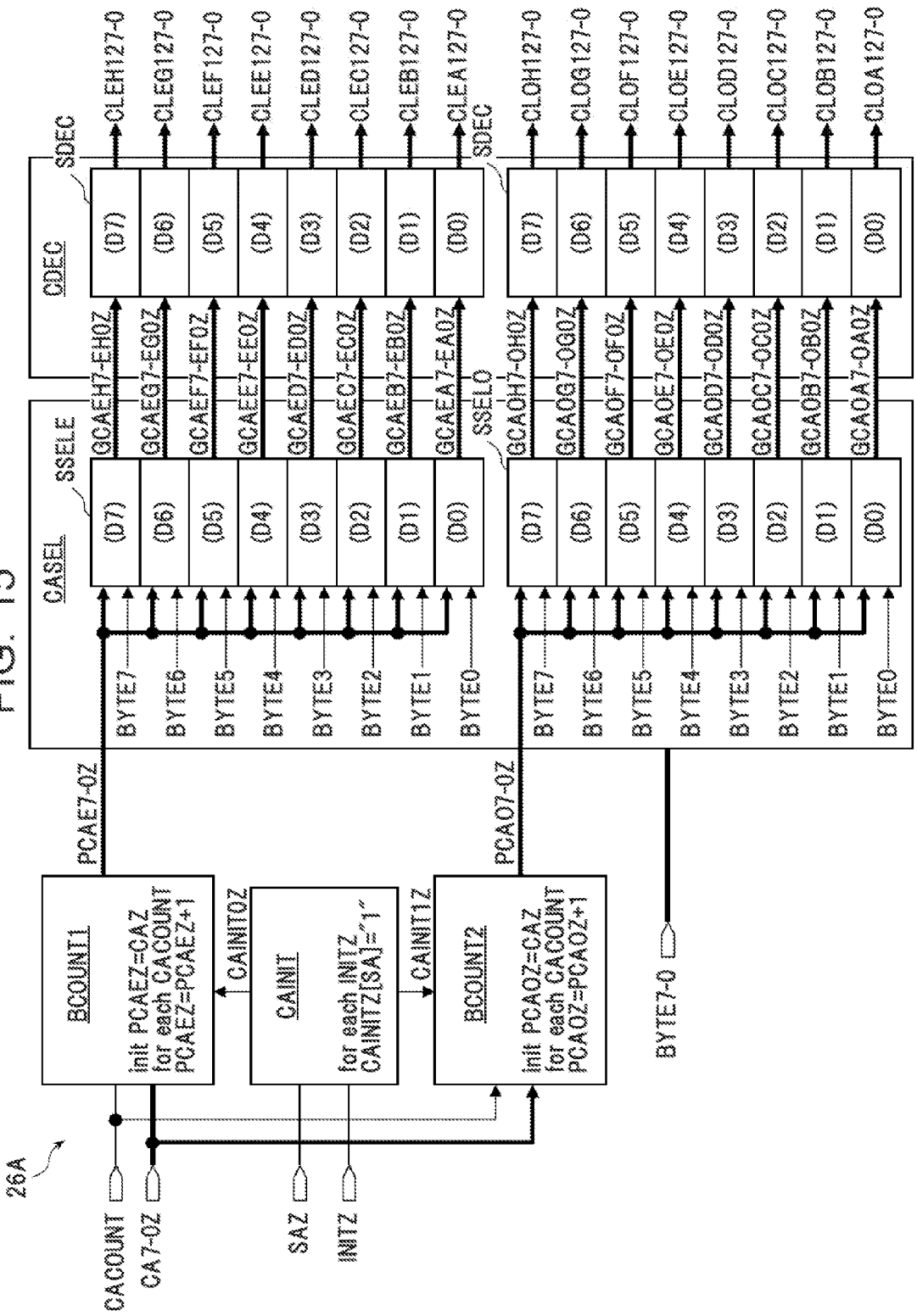
FIG. 15 illustrates an exemplary column-address control unit and a column decoder.

FIG. 15 illustrates an exemplary column-address control unit and an exemplary column decoder CDEC. The exemplary column-address control unit and the exemplary column decoder CDEC may be the column-address control unit 26A and the column decoder CDEC illustrated in FIG. 14 respectively. The column-address control unit 26A includes a counter initializing unit CAINIT, a first burst counter BCOUNT1, a second burst counter BCOUNT2, and a column address selector CASEL. The counter initializing unit CAINIT outputs a counter initialization signal CAINIT0Z in synchronization with the initialization signal INITZ when the select address signal SAZ is at a low level. The counter initializing unit CAINIT outputs a counter initialization signal CAINIT1Z in synchronization with the initialization signal INITZ when the select address signal SAZ is at a high level.

Figure 16:
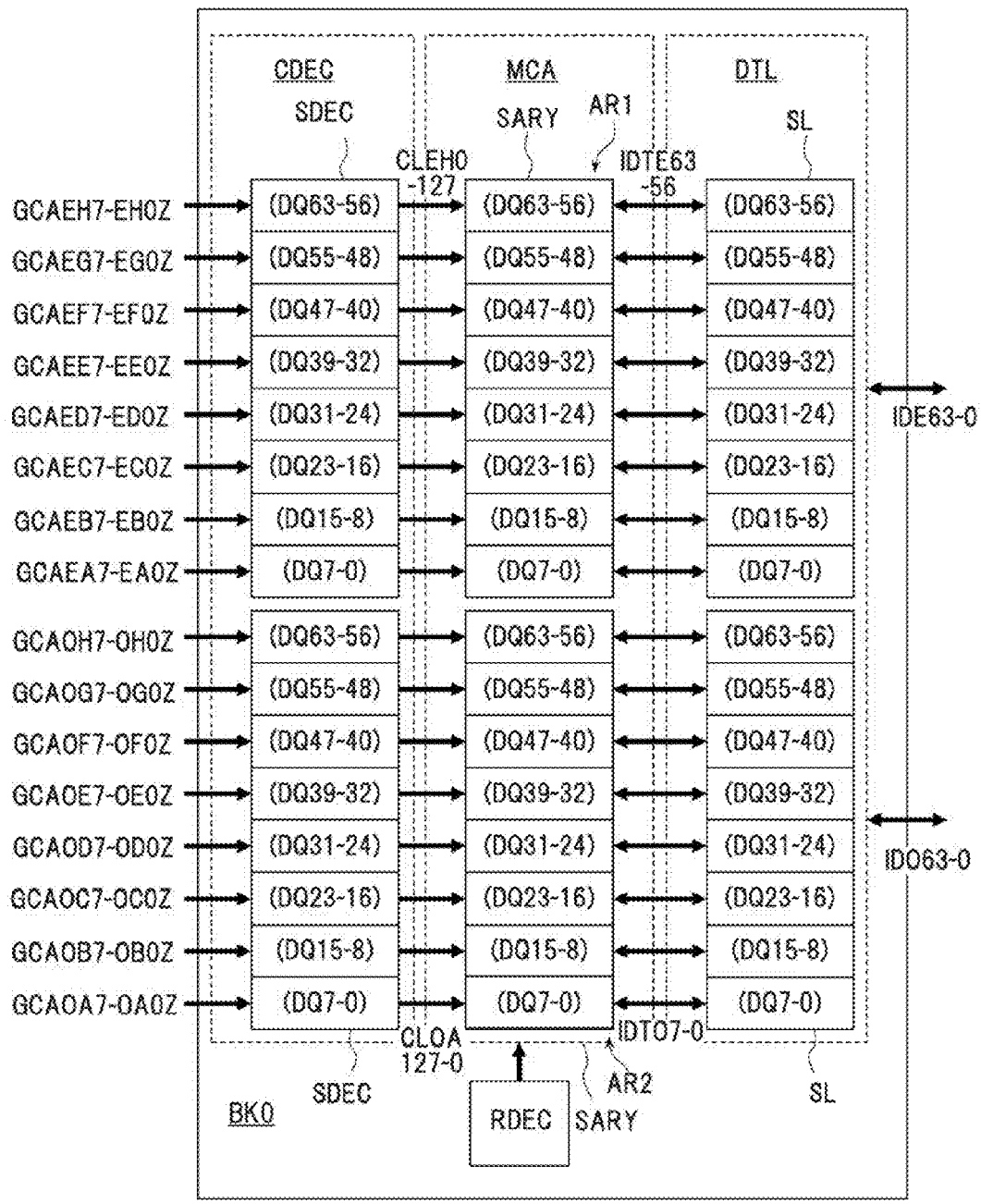
FIG. 16 illustrates an exemplary bank.

The first burst counter BCOUNT loads the column address signal CAZ, for example, CA7-0Z as a burst start address in synchronization with the counter initialization signal CAINIT0Z and outputs the loaded signal as a pre-column address signal PCAEZ, for example, PCAE7-0Z. The first burst counter BCOUNT1 increments the pre-column address signal PCAE7-0Z by one in synchronization with the counter signal CACOUNT. The second burst counter BCOUNT2 loads the column address signal CAZ, for example, CA7-0Z as a burst start address in synchronization with the counter initialization signal CAINIT0Z and outputs the loaded signal as a pre-column address signal PCAOZ, for example, PCAO7-0Z. The second burst counter BCOUNT2 increments the pre-column address signal PCAO7-0Z by one in synchronization with the counter signal CACOUNT. The pre-column address signals PCAEZ and PCAOZ may be 8-bit signals. Since the two burst counters BCOUNT1 and BCOUNT2 are provided, two memory areas corresponding to the different column addresses CA, for example, AR1-2 in FIG. 16 are contemporaneously accessed.

The column address selector CASEL includes eight sub-selectors SSELE that receive the pre-column address signal PCAEZ and eight sub-selectors SSELO that receive the pre-column address signal PCAOZ. The sub-selectors SSELE and SSEL0 correspond to the data groups D7 to D0. Each of the sub-selectors SSELE outputs the pre-column address signals PCAE7-0Z as 8-bit global column address signals GCAEZ, for example, GCAEH7Z, GCAEH6Z, . . . , and GCAEH0Z when the corresponding byte signals BYTE7-0 are at a low level. Each of the sub-selectors SSELE prohibits the output of the global column address signal GCAEZ when the corresponding byte signals BYTE7-0 are at a high level.

Operations of the sub-selectors SSEL0 are substantially the same as the operations of the sub-selectors SSELE. A, B, C, D, E, F, G, and affixed to the global column address signals GCAEZ and GCAOZ indicate, as in FIG. 4, the corresponding data groups D0 to D7. The global column address signals GCAEZ and GCAOZ are transmitted to the column decoder CDEC using, for example, complementary signal lines. For example, the output of the global column address signals GCAEZ and GCAOZ is prohibited based on complementary signals set to a high level.

For example, when the byte signals BYTE7-0 are "0Fh" the sub-selectors SSELE and the sub-selectors SSEL0 corresponding to the data groups D7 to D4 output the global column address signal GCAEZ or GCAOZ. The sub-selectors SSELE and the sub-selectors SSEL0 corresponding to the data groups D3 to D0 prohibit the output of the global column address signal GCAEZ or GCAOZ.

The column decoder CDEC includes sub-column decoders SDEC. Each of the sub-column decoders SDEC stops decoding when the corresponding global column address signal CGAEZ (or GCAOZ) is not output, for example, when a complementary signal of the signal GCAEZ (or GCAOZ) is at a high level. Since the sub-column decoder SDEC necessary for reading data operates, power consumption may be reduced.

Each of the sub-column decoders SDEC that decode activates one of 128 column selection signals CLE (or CLO) to a high level according to the address signal GCAEZ (or GCAOZ). Each of the sub-column decoders SDEC that do not decode holds all the column selection signals CLE (or CLO) at a low level. The sub-column decoders SDEC determine whether decoding is performed or not according to logic levels of the global column address signals GCAEZ and GCAOZ. Therefore, the column decoder CDEC does not receive the mask signals MASK1-0Z illustrated in FIG. 3. Since the sub-column decoders SDEC are provided in association with the burst counters BCOUNT1-2, two column signals CLE and CLO are generated for each of the data groups D7 to D0. Two memory areas AR1-2 illustrated in FIG. 16 are contemporaneously accessed.

FIG. 16 illustrates an exemplary bank. The exemplary bank may be the bank BK0 illustrated in FIG. 14. Explanation of elements substantially the same as the elements illustrated in FIG. 3 is omitted or reduced. The banks BK1-7 are substantially the same as the bank BK0. The bank BK0 has the structure obtained by combining the even number area EA and the odd number area OA illustrated in FIG. 3. A storage capacity of each of the banks BK0-7 is twice as large as that of the bank BK0 illustrated in FIG. 1. In the memory cell array MCA, a memory area on the right side of FIG. 16 coupled to the internal data line IDTE may be a first area AR1 and a memory area on the left side of FIG. 16 coupled to the internal data line IDTO may be a second area AR2. Two low decoders RDEC may be provided.

The memory area AR1 is selected by the column address signals CA7-0 supplied together with a low-level select address signal SA. The memory area AR2 is selected by the column address signals CA7-0 supplied together with a high-level select address signal SA. For example, the memory cells MC of the memory areas AR1 and AR2 selected by column address signals CA7-0="FFh" may be physically different. The select address signal SA is used as a part of a column address signal for identifying the memory areas AR1 and AR2.

Figure 17:
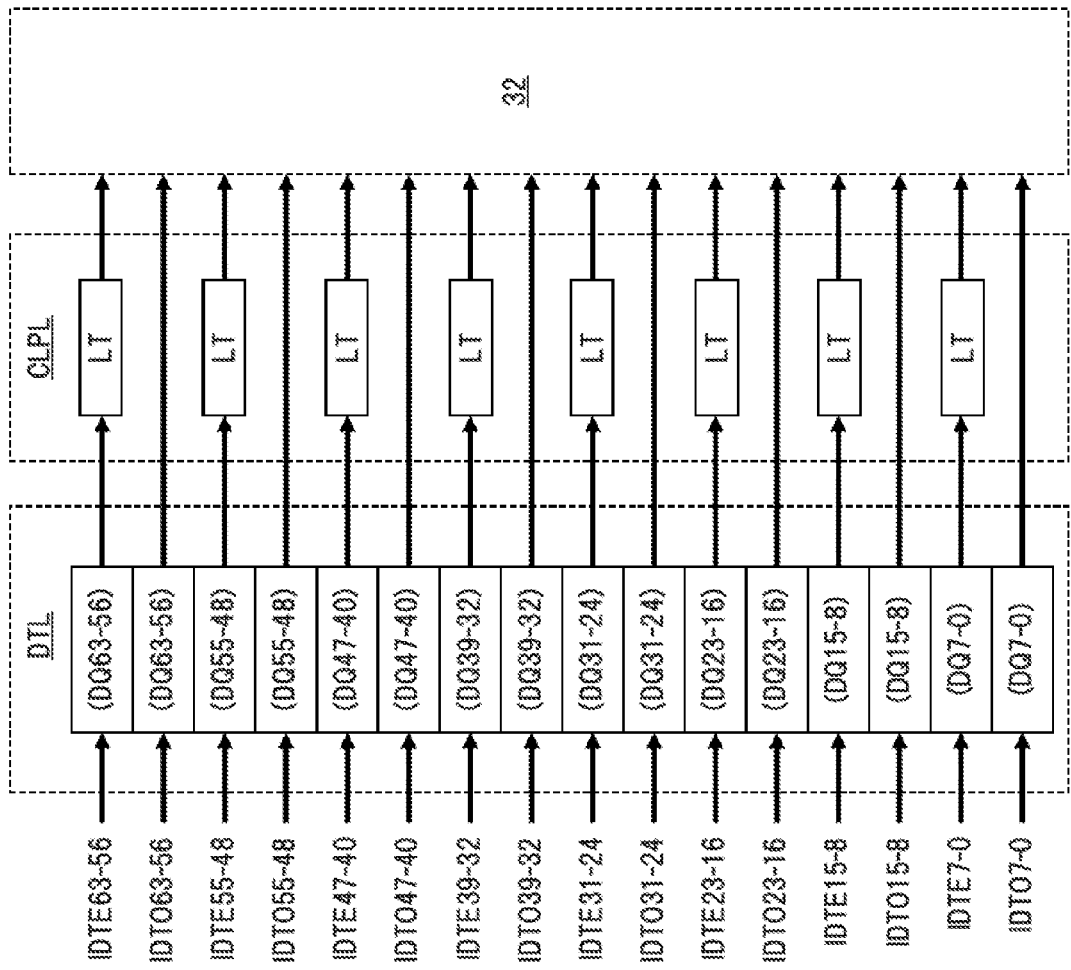
FIG. 17 illustrates an exemplary column pipeline.

FIG. 17 illustrates an exemplary column pipeline. The exemplary column pipeline may be the column pipeline CLPL illustrated in FIG. 14. The column pipeline CLPL includes a latch circuit LT coupled to the data latch DTL corresponding to the internal data line IDTE. Output of the data latch DTL corresponding to the internal data line IDTO is coupled to the data bus selector 32. For example, the latch circuit LT includes a master/slave latch that operates in synchronization with the clock signal CLKZ. The latch circuit LT outputs a data group, which is transmitted via the internal data line IDTE, to the data bus selector 32 after holding the data group for one clock cycle. The data bus selector 32 selects, according to a logic of the byte signals BYTE7-0, one of the data groups D7 to D0 read from the memory area AR1 or AR2. Data that is output from the two memory areas AR1 and AR2 corresponding to the internal data line IDTE or IDTO at different timings is contemporaneously output to the data terminals DQ63-0.

Figure 18:
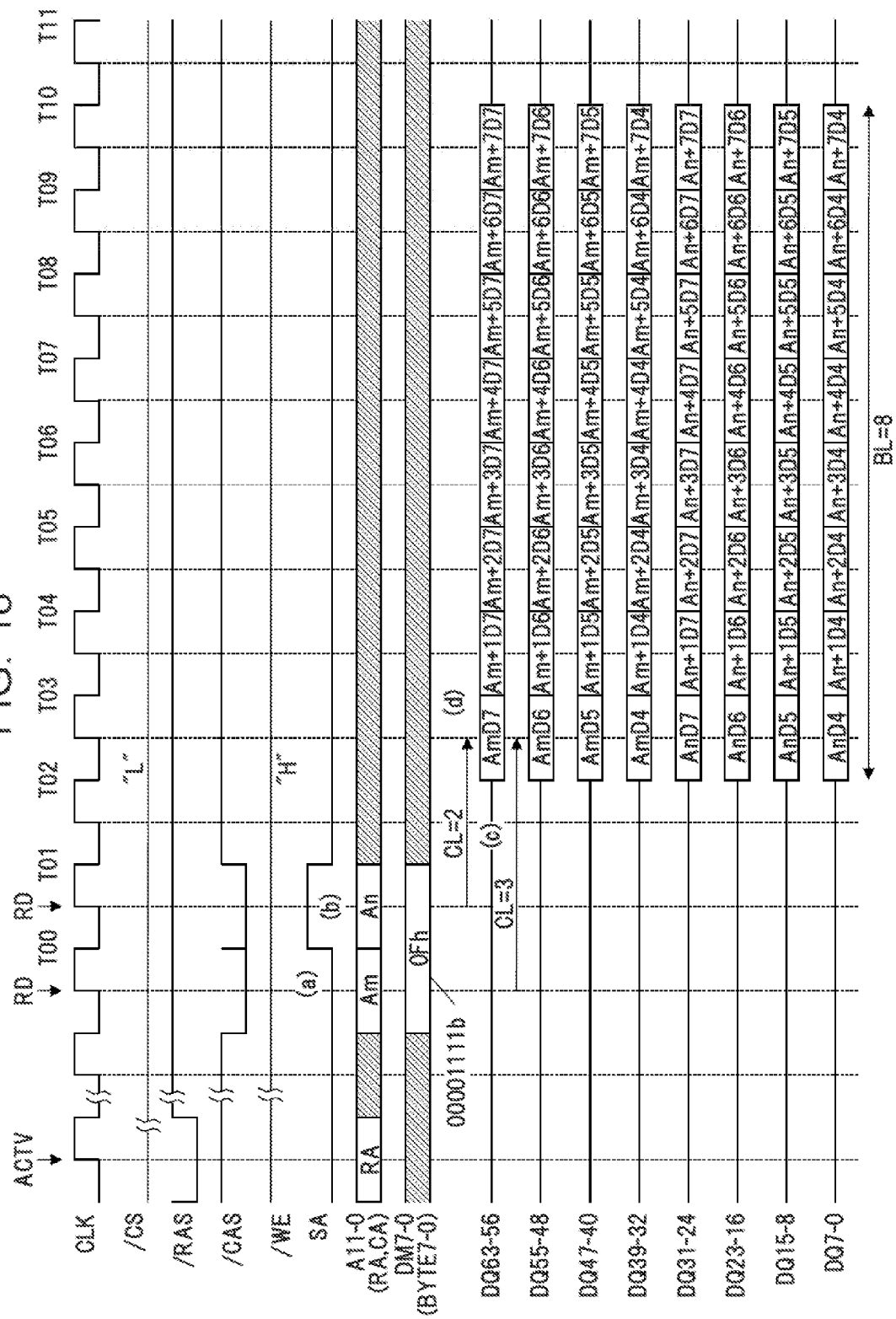
FIG. 18 illustrates exemplary operations of a semiconductor memory.

FIG. 18 illustrates exemplary operations of the semiconductor memory. The semiconductor memory may be the semiconductor memory MEM illustrated in FIG. 14. When the memory controller MCNT controlled by the processor PRC accesses the memory MEM, the operations illustrated in FIG. 14 may be performed. Explanation of operations substantially the same as the operations illustrated in FIG. 13 is omitted or reduced. The burst length BL is set to "8". The CAS latency CL is set to "3" with respect to a first /CAS signal and set to "2" with respect to a later /CAS signal. Switching of the CAS latency CL may be automatically executed in the memory MEM.

In the second semiconductor memory, one burst operation is executed in response to continuous two /CAS commands (read commands RD). A low-level select address signal SA, a column address Am, and a data mask signal DM(BYTE)=0Fh are supplied in synchronization with a first /CAS command (FIG. 18(*a*)). A high-level select address signal SA, a column address An, and a data mask signal DM(BYTE)=0Fh are supplied in synchronization with the next /CAS command (FIG. 18(*b*)). The column addresses Am and An are different from each other. However, the column addresses Am and An may be substantially the same. The memory areas AR1 and AR2 (assigned memory cells) accessed by the same column addresses Am and An are different from each other. Position information of the memory cells MC in which data groups corresponding to the column addresses Am and An are stored is obtained based on the select address signal SA. The data mask signal DM(BYTE) may be supplied in synchronization with one of the two /CAS command.

The column-address control unit 26A illustrated in FIG. 15 supplies column address signals CA7-0(Am) received together with the low-level select address signal SA to the sub-selectors SSELE as the pre-column address signals PCAE7-0Z. The column-address control unit 26A supplies the column address signals CA7-0(An) received together with the high-level select address signal SA to the sub-selectors SSEL0 as the pre-column address signals PCAO7-0Z.

The sub-column decoder SDEC corresponding to the sub-selectors SSELE outputs the column selection signal CLE to the memory area AR1, for example, in a clock cycle T00. Reading the memory area AR1 starts, for example, in the clock cycle T00. On the other hand, the sub-column decoder SDEC corresponding to the sub-selectors SSEL0 outputs the column selection signal CLO to the memory area AR2, for example, in a clock cycle T01. Reading the memory area AR2 starts, for example, in the clock cycle T01.

Reading the memory area AR1 starts is one clock cycle earlier than reading the memory area AR2. Data read from the memory areas AR1 and AR2 are contemporaneously output to the data bus selector 32 by the column pipeline CLPL illustrated in FIG. 17. A first read command RD is executed at the CAS latency CL="3" and the next read command RD is executed at the CAS latency CL="2" (FIG. 18(c)). Read corresponding to continuous readout commands RD are executed at different CAS latencies CL.

Switching of the CAS latency CL may be automatically executed by the column pipeline CLPL. When the latency CL is automatically changed in the memory MEM, read data is contemporaneously output from the data terminals DQ63-0 in response to /CAS commands supplied at different timings (FIG. 18(d)).

Data groups D7 to D4 among the data groups D7 to D0 assigned to the column address Am are output to the data terminals DQ63-32 corresponding to the "0" byte signals BYTE7-4 by the data bus selector 32. Data groups D7 to D4 among the data groups D7 to D0 assigned to the column address An are output to the data terminals DQ31-0 corresponding to the "1" byte signal BYTE3-0. The data groups stored in the memory areas AR1 and AR2 having discontinuous addresses are contemporaneously output from the data terminals DQ63-0. The data groups D7 to D4 are output from the data terminals DQ32-0 corresponding to the "1" byte signals BYTE3-0. At time T04 to TI, each of the column addresses Am and An of the memory areas AR1 and AR2 is incremented by one and read data are contemporaneously output.

Figure 19:
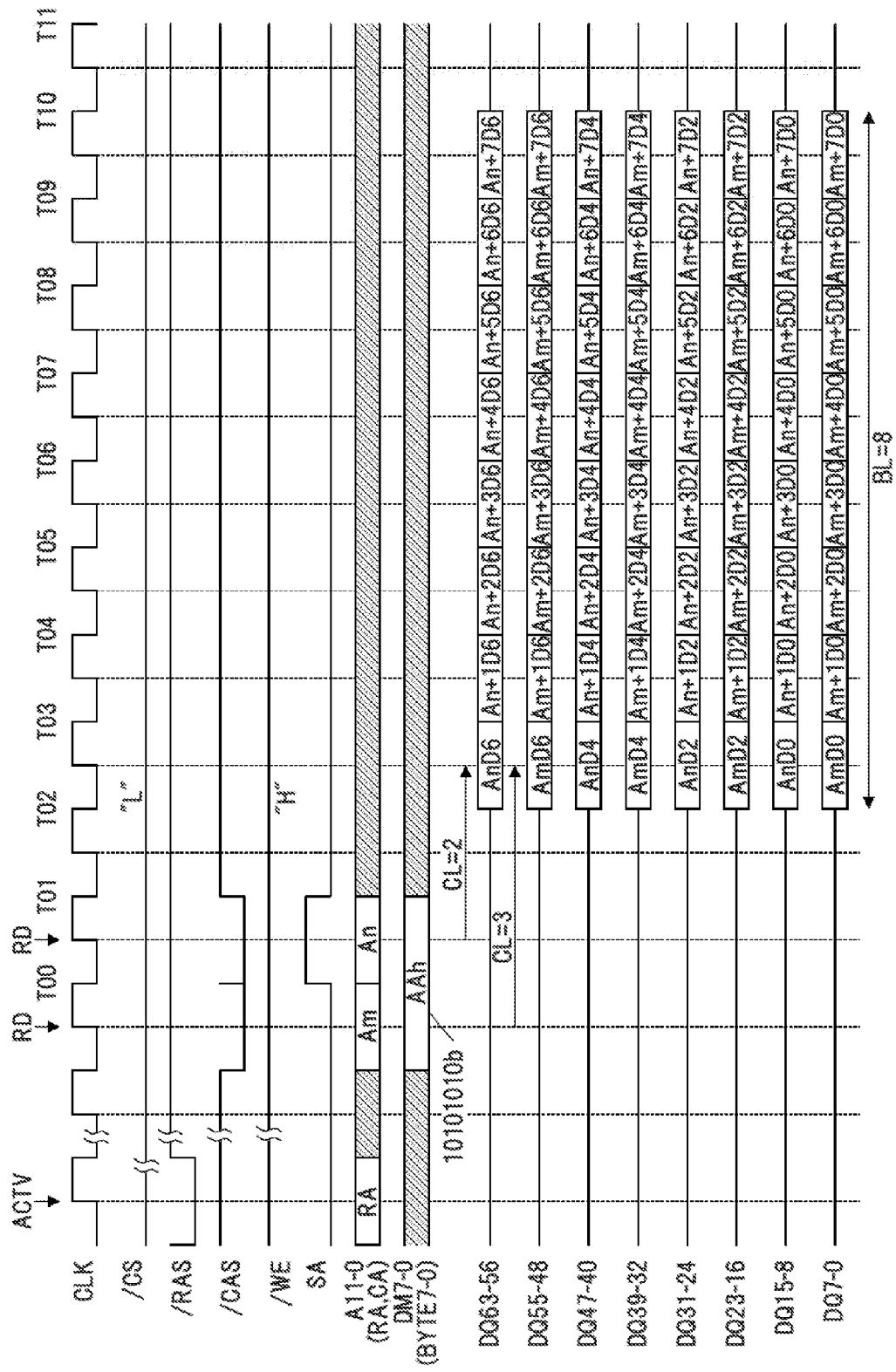
FIG. 19 illustrates other exemplary operations of a semiconductor memory.

FIG. 19 illustrates other exemplary operations of a semiconductor memory. The semiconductor memory may be the semiconductor memory MEM illustrated in FIG. 14. Explanation of operations substantially the same as the operations in FIGS. 13 and 18 is omitted or reduced. Values of the byte signals BYTE7-0 are different from the byte signals illustrated in FIG. 18. Other operations are substantially the same as or similar to the operations illustrated in FIG. 18.

When the byte signals BYTE7-0 is "AAh" read data corresponding to a first read command RD (CA=Am) is output to the data terminals DQ55-48, DQ39-32, . . . , and DQ7-0 corresponding to the data groups D6, D4, . . . , and D0 of the even numbers. Read data corresponding to a second read command RD (CA=An) is output to the data terminals DQ63-56, DQ47-40, . . . DQ15-8 corresponding to the data groups D7, D5, . . . , and D1 of the odd numbers. The data group stored in the memory areas AR1 and AR2 having discontinuous addresses are contemporaneously output from the data terminals DQ63-0.

In a writing operation, write data is supplied to the data terminals DQ63-0 three clock cycles earlier compared with that in FIGS. 18 and 19. A relation between the write data and the column address CA in which data is written depends on a logic of the byte signals BYTE7-0. A waveform at the time when a write command is supplied instead of a read command may be represented by shifting data three clock cycles forward in FIGS. 18 and 19.

When access addresses including the column addresses Am and An output from the memory controller MCNT to the memory MEM are assigned to the different banks BK, the column-address control unit 26A outputs the global column address signal GCAEZ or GCAOZ. The column-address control unit 26A is provided for each of the banks BK0-7. The burst counters BCOUNT1-2 generate the pre-column address signals PCAEZ or PCAOZ corresponding to different banks BK. The column pipeline CLPL is provided on an outer side of the banks BK0-7. Two banks BK are sequentially accessed and word lines of the two banks BK are activated. Data groups in memory cells selected by the column addresses CA among memory cells coupled to the word lines are output to the data bus selector 32. The data group of the bank BK accessed earlier is transferred to the column pipeline CLPL via the internal data lines IDE63-0. The data group of the bank BK accessed later is directly transferred to the data bus selector 32 via the internal data lines IDO63-0. Each of the banks BK0-7 includes a data selector that outputs output of the data latch DTL to the internal data lines IDE63-0 or IDO63-0 according to supply order of the read command RD. Operations substantially the same as the operations illustrated in FIG. 18 are executed.

The second semiconductor memory has effects substantially the same as those in the first semiconductor memory. In the second semiconductor memory, data groups arbitrarily designated out of data groups assigned to the column addresses CA, which are different from one another and discontinuous, are contemporaneously output from the data terminals DQ63-0 to the outside. The data groups D7 to D0 read at different timings from the memory areas AR1 and AR2 are contemporaneously and simultaneously output from the data terminals DQ63-0 to the outside according to the column addresses CA supplied at different timings.

Figure 20:
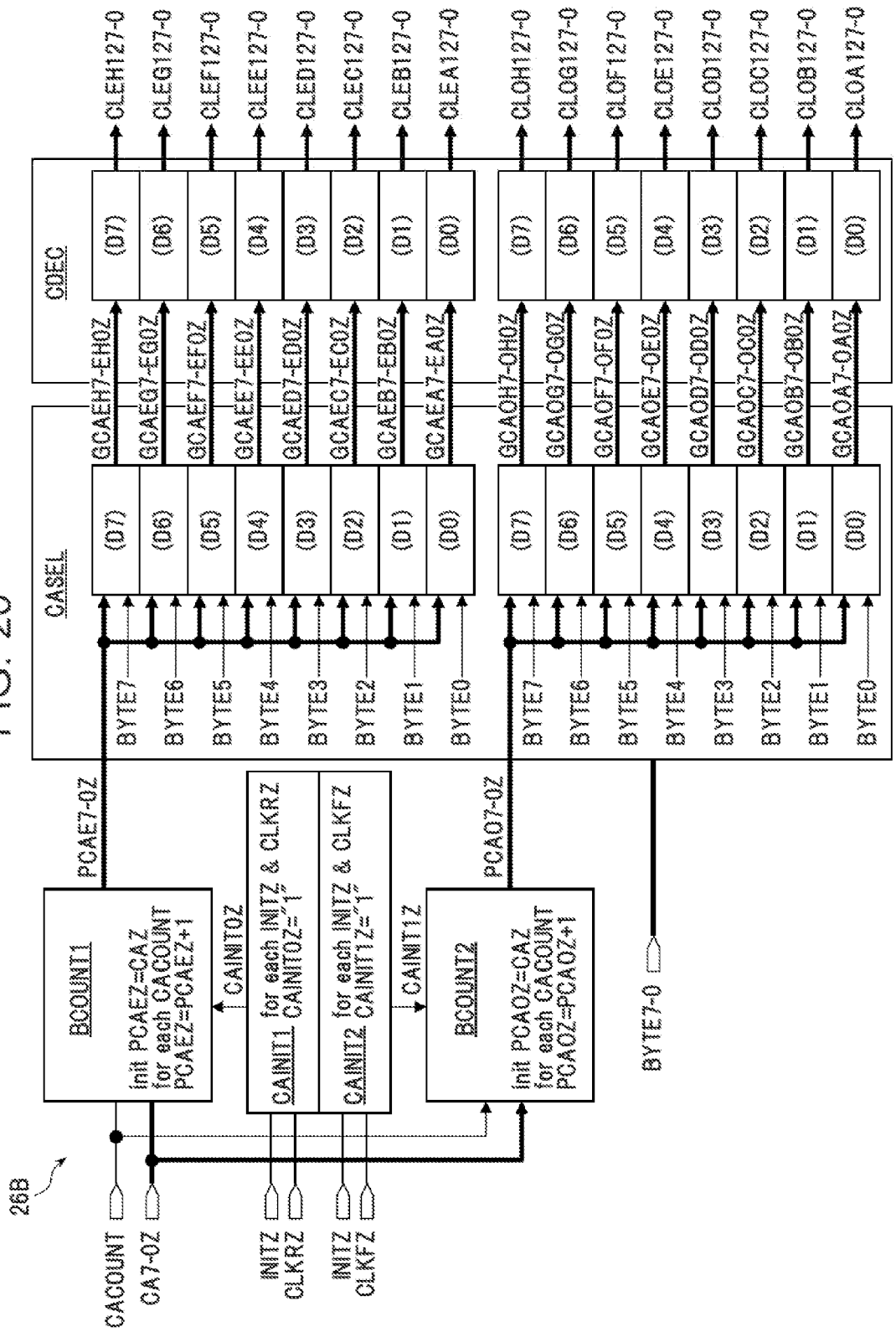
FIG. 20 illustrates a third semiconductor memory.

FIG. 20 illustrates a third semiconductor memory. Elements substantially the same as the elements in the first and second semiconductor memories are denoted by the same reference numerals and signs and explanation is omitted or reduced. The memory MEM is, for example, an SDRAM. The memory MEM may be mounted on the system SYS illustrated in FIG. 12. For example, image data may be stored in the memory cells MC.

The memory MEM according to the third semiconductor memory includes a column-address control unit 26B instead of the column-address control unit 26A illustrated in FIG. 14. A column buffer (not illustrated) that outputs the column address signals CA7-0Z operates in synchronization with a rising edge or a falling edge of the clock signal CLK. Each of the banks BK0-7 does not include the column pipeline CLPL illustrated in FIG. 14. Other elements are substantially the same as or similar to the elements illustrated in FIG. 14.

The column-address control unit 26B includes, instead of the counter initializing unit CAINIT illustrated in FIG. 15, a first counter initializing unit CAINIT1 and a second counter initializing unit CAINIT2 corresponding to the first burst counter BCOUNT1 and the second burst counter BCOUNT2. The counter initializing unit CAINIT1 outputs a counter initialization signal CAINIT0Z in synchronization with a rising clock signal CLKRZ when the initialization signal INITZ is at a high level. The rising clock signal CLKRZ is generated in synchronization with the rising edge of the clock signal CLK. The counter initializing unit CAINIT2 outputs a counter initialization signal CAINIT1Z in synchronization with a falling clock signal CLKFZ when the initialization signal INITZ is at a high level. The falling clock signal CLKFZ is generated in synchronization with the falling edge of the clock signal CLK. Other circuits and operations of the column-address control unit 26B are substantially the same as or similar to the circuits and the operations of the column-address control unit 26A illustrated in FIG. 15. The memory controller MCNT illustrated in FIG. 12 continuously outputs the column address signals CA7-0 twice in synchronization with the rising edge and the falling edge of the clock signal CLK.

Figure 21:
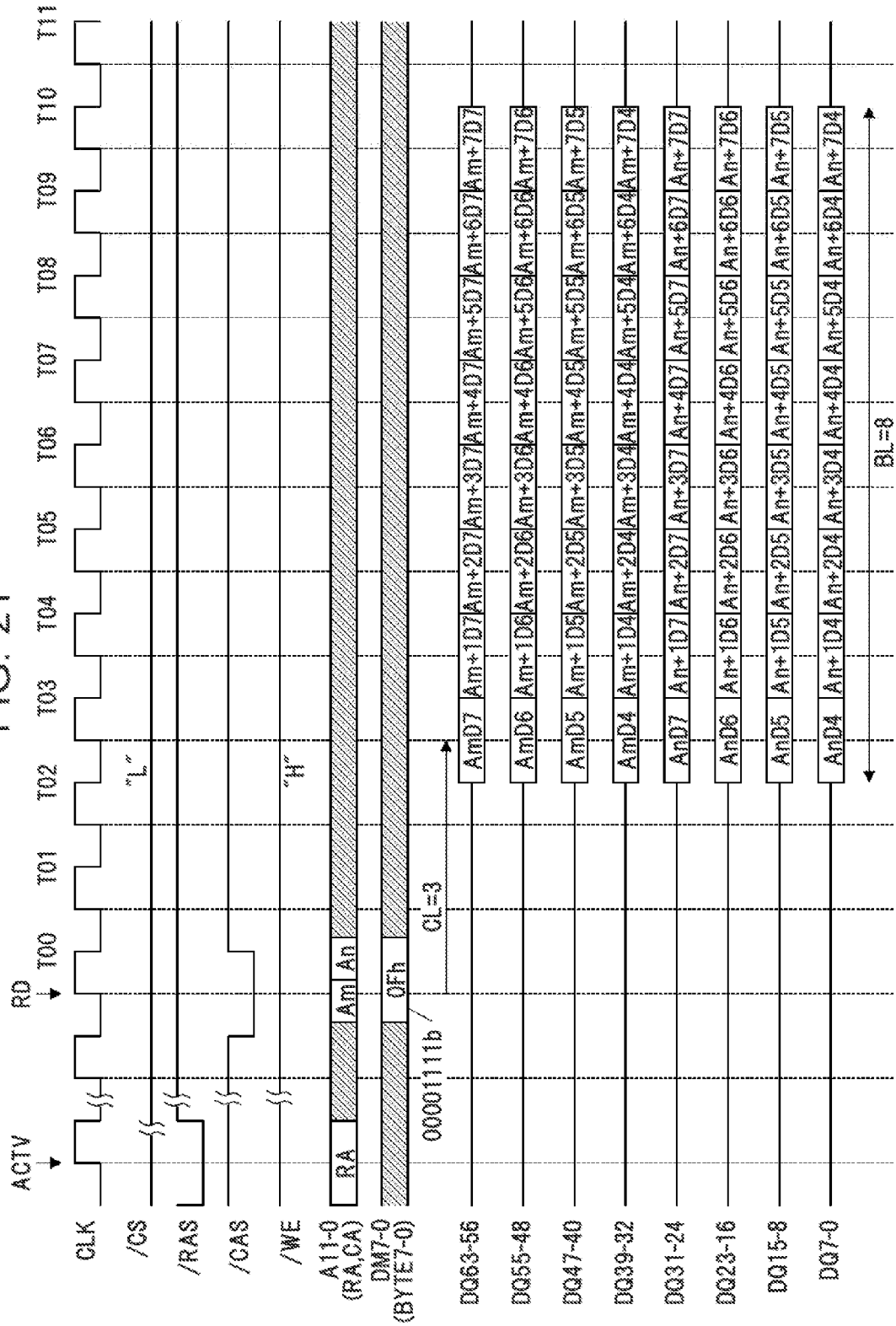
FIG. 21 illustrates exemplary operations of a semiconductor memory.

FIG. 21 illustrates exemplary operations of a semiconductor memory. The semiconductor memory may include a column-address control unit. The column-address control unit may be the column-address control unit 26B illustrated in FIG. 20. When the memory controller MCNT controlled by the processor PRC accesses the memory MEM, the operations illustrated in FIG. 21 are performed. Explanation of operations substantially the same as the operations illustrated in FIG. 18 is omitted or reduced. The CAS latency CL is set to "3". The two column address signals Am and An are supplied in synchronization with the rising edge or the falling edge of the clock signal CLK for supplying the read command RD. The data mask signals DM7-0 (=BYTE7-0) are supplied together with the read command RD. The memory MEM receives the two column address signals Am and An in synchronization with continuous clock edges in response to one read command RD.

Read data is output at timing substantially the same as the timing illustrated in FIG. 18. A write operation is substantially the same as the operation illustrated in FIG. 21. However, two sets of data groups to be written in memory cells assigned to different column addresses Am and An are supplied together with a write command. In the write operation, data illustrated in FIG. 21 is supplied to the memory MEM three clock cycles earlier as write data.

When the access addresses including the column addresses Am and An output from the memory controller MCNT to the memory MEM are assigned to the different banks BK, the column-address control unit 26B outputs the global column address signal GCAEZ or GCAOZ. The column-address control unit 26B is provided for each of the banks BK0-7. Each of the banks BK0-7 includes a data selector that outputs, according to supply order of the column addresses Am and An, output of the data latch DTL to the internal data lines IDE63-0 or IDO63-0. Operations substantially the same as the operations illustrated in FIG. 21 are performed.

The third semiconductor memory has effects substantially the same as those in the first and second semiconductor memories. In the third semiconductor memory, when the column address signals Am and An are received in synchronization with both the edges of the clock signal CLK, the data groups D7 to D4 assigned to the different column addresses CA are contemporaneously read in response to a read command. Because the column pipeline CLPL may be unnecessary, a chip size of the memory MEM may be reduced. The data groups D7 to D4 assigned to the different column addresses CA are contemporaneously supplied to the data terminals DQ63-0 in response to a write command and are written in the memory cell.

Figure 22:
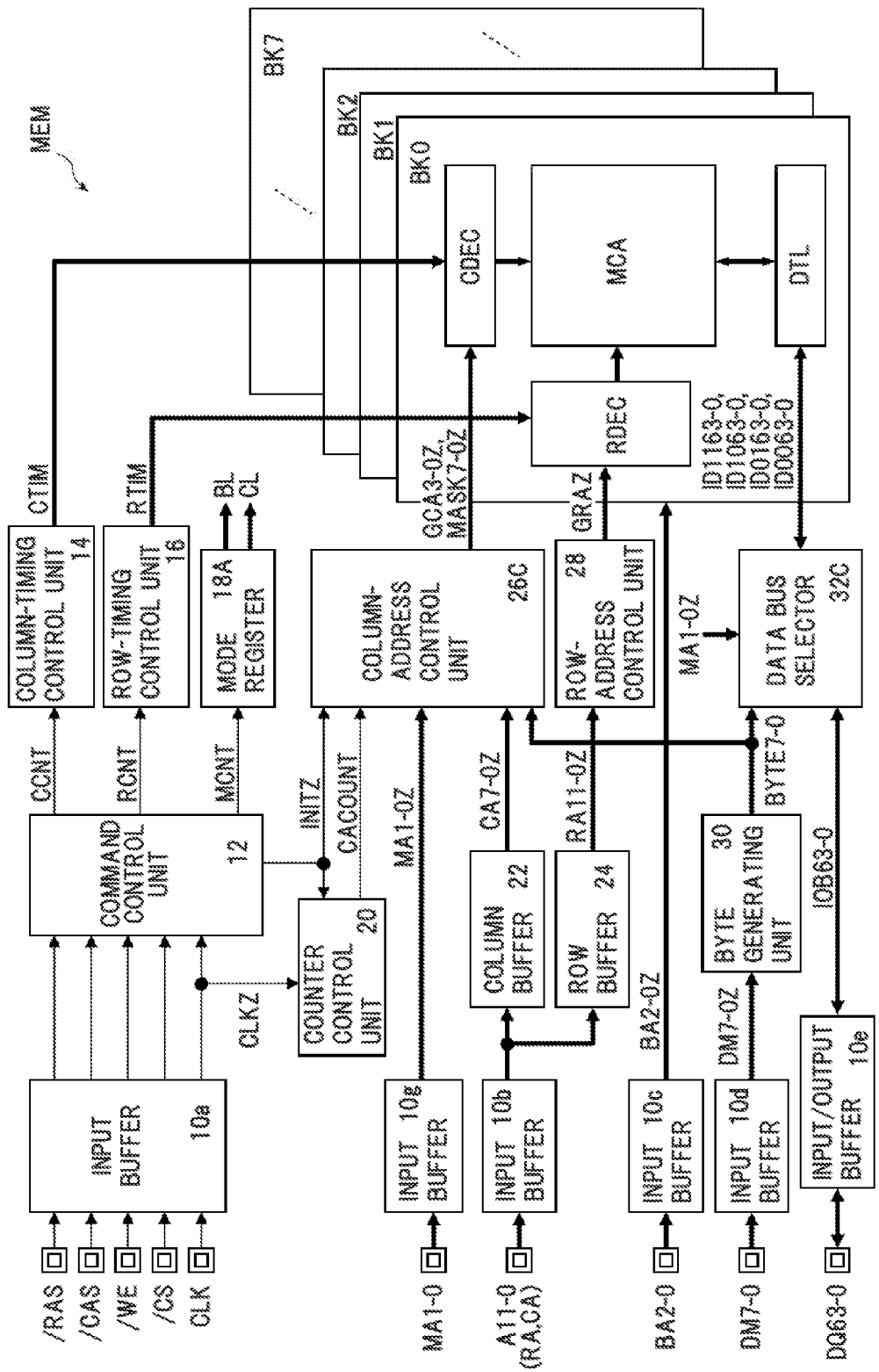
FIG. 22 illustrates a fourth semiconductor memory.

FIG. 22 illustrates a fourth semiconductor memory. Elements substantially the same as the elements in the first to third semiconductor memories are denoted by the same reference numerals and signs and explanation of the elements is omitted or reduced. The memory MEM is, for example, an SDRAM. The memory MEM may be mounted on the system SYS illustrated in FIG. 12. For example, image data is stored in the memory cells MC. The memory controller MCNT illustrated in FIG. 22 outputs degeneration signals MA1-0. Other elements are substantially the same as or similar to the elements illustrated in FIG. 1.

The memory MEM includes a mode register 18A, a column-address control unit 26C, and a data bus selector 32C instead of the mode register 18, the column-address control unit 26 and the data bus selector 32 of FIG. 1. The data latch DTL and the data bus selector 32C of each of the banks BK0-7 are coupled by internal data lines ID1163-0, ID1063-0, ID0163-0, and ID0063-0. The memory MEM includes an input buffer 10g that receives the degeneration signals MA1-0 and outputs degeneration signals MA1-0Z. Other elements are substantially the same as or similar to the elements illustrated in FIG. 1 except that the banks BK0-7 are different.

Figure 23:
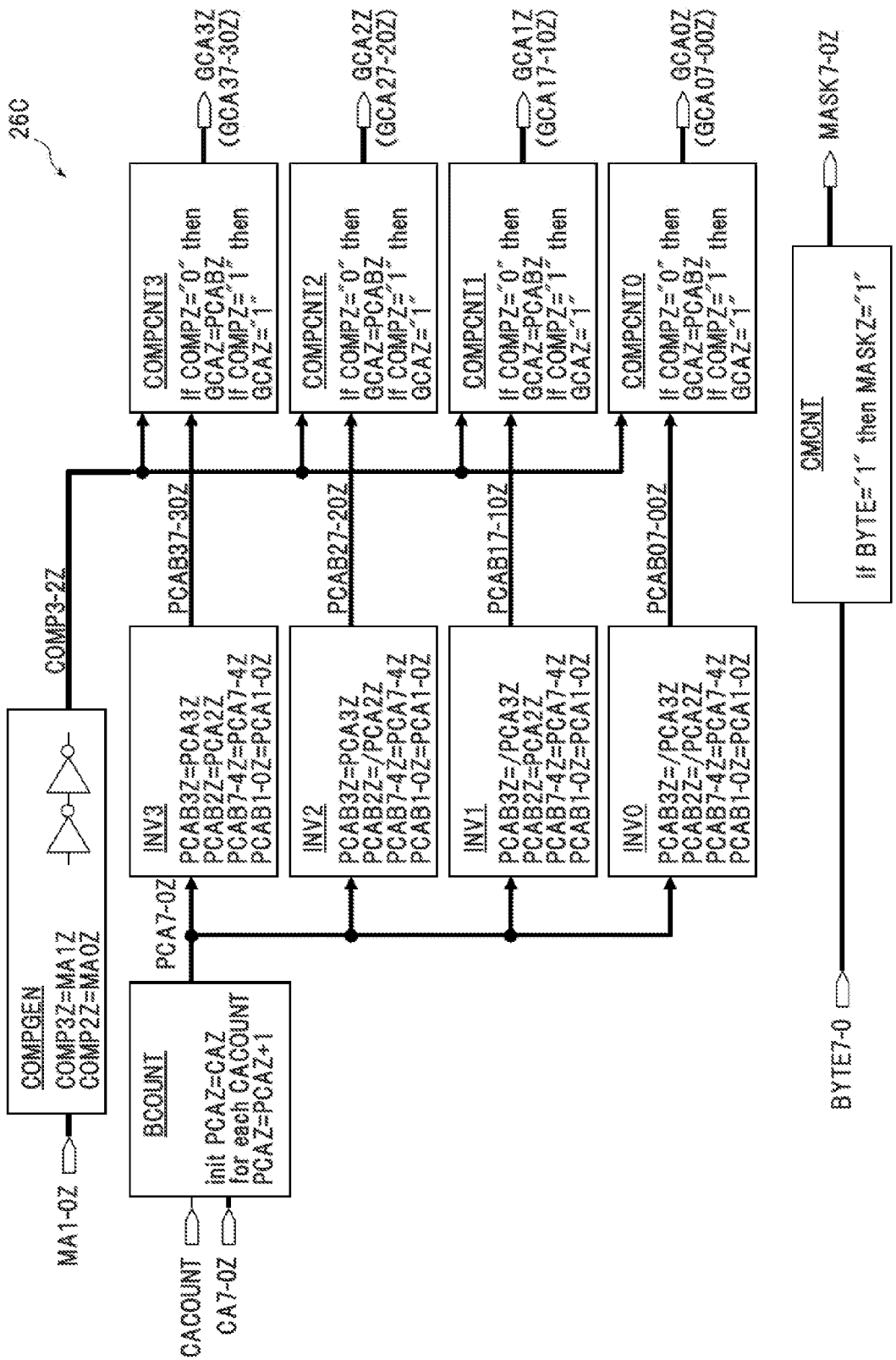
FIG. 23 illustrates an exemplary column-address control unit.

The column-address control unit 26C outputs global column address signal groups GCA3-0Z according to the column address signals CA7-0Z and the degeneration signals MA1-0Z. Each of the global column address signal groups GCA3-0Z are 8-bit signals, for example, GCA37Z, GCA36Z, . . . , and GCA30Z as illustrated in FIG. 23. The column-address control unit 26C outputs the mask signals MASK7-0Z according to the byte signals BYTE7-0.

The data bus selector 32C selects data corresponding to bits of the byte signals BYTE7-0 of a logic "0" among read data transferred to the internal data lines ID1163-0, ID1063-0, ID0163-0, and ID0063-0. The data bus selector 32C selects read data according to a logic of the degeneration signals MA1-0Z and outputs the read data to the internal data buses IOB63-0.

FIG. 23 illustrates an exemplary column-address control unit. The exemplary column-address control unit may be the column-address control unit 26C illustrated in FIG. 22. The column-address control unit 26C includes a degeneration-signal generating unit COMPGEN, a burst counter BCOUNT, address inverting units INV3-0, degeneration control units COMPCNT3-0, and a column-mask control unit CMCNT. The burst counter BCOUNT and the column-mask control unit CMCNT are substantially the same as or similar to the burst counter and the column-mask control unit illustrated in FIG. 2.

The degeneration-signal generating unit COMPGEN outputs the degeneration signals MA1-0Z as degeneration signals COMP3-2Z. The degeneration signal COMP3Z is used to degenerate the pre-column address signal PCA3Z. The degeneration signal COMP2Z is used to degenerate the pre-column address signal PCA2Z. Degeneration of an address indicates masking or neglecting a bit value of an address signal. An address signal in which one bit is degenerated is recognized as two address signals. Two memory areas are accessed by the two address signals.

The address inverting unit INV3 outputs the address signals PCA7-0Z as 8-bit pre-column address signals PCAB37-30Z. The address inverting unit INV2 inverts a logic of PCA2Z among the address signals PCA7-0Z and outputs the address signals PCA7-0Z as 8-bit pre-column address signals PCAB27-20Z. The address inverting unit INV1 inverts a logic of PCA3Z among the address signals PCA7-0Z and outputs the address signals PCA7-0Z as 8-bit pre-column address signals PCAB17-10Z. The address inverting unit INV0 inverts a logic of PCA3-2Z among the address signals PCA7-0Z and outputs the address signals PCA7-0Z as 8-bit pre-column address signals PCAB07-00Z. For example, when the address signals PCA3-2Z are "11" address signals PCAB33-32Z from the address inverting unit INV3 change to a high level. When the address signals PCA3-2Z are "01" address signals PCAB13-12Z from the address inverting unit INV1 change to a high level. In this way, the address inverting units INV3-0 pre-decode the address signals PCA3-2Z.

When the degeneration signal COMP3Z is "0" the degeneration control unit COMPCNT3 outputs an address signal PCAB33Z as a global column address signal GCA33Z. When the degeneration signal COMP3Z is "1" the degeneration control unit COMPCNT3 outputs the high-level global column address signal GCA33Z regardless of a value of the address signal PCAB33Z. When the degeneration signal COMP2Z is "0" the degeneration control unit COMPCNT3 outputs the address signal PCAB32Z as a global column address signal GCA32Z. When the degeneration signal COMP2Z is "1" the degeneration control unit COMPCNT3 outputs the high-level global column address signal GCA32Z regardless of a value of the address signal PCAB32Z. The degeneration control unit COMPCNT3 outputs the address signals PCAB37-34Z or PCAB31-30Z as global column address signals GCA37-34Z or GCA31-30Z.

Figure 25:
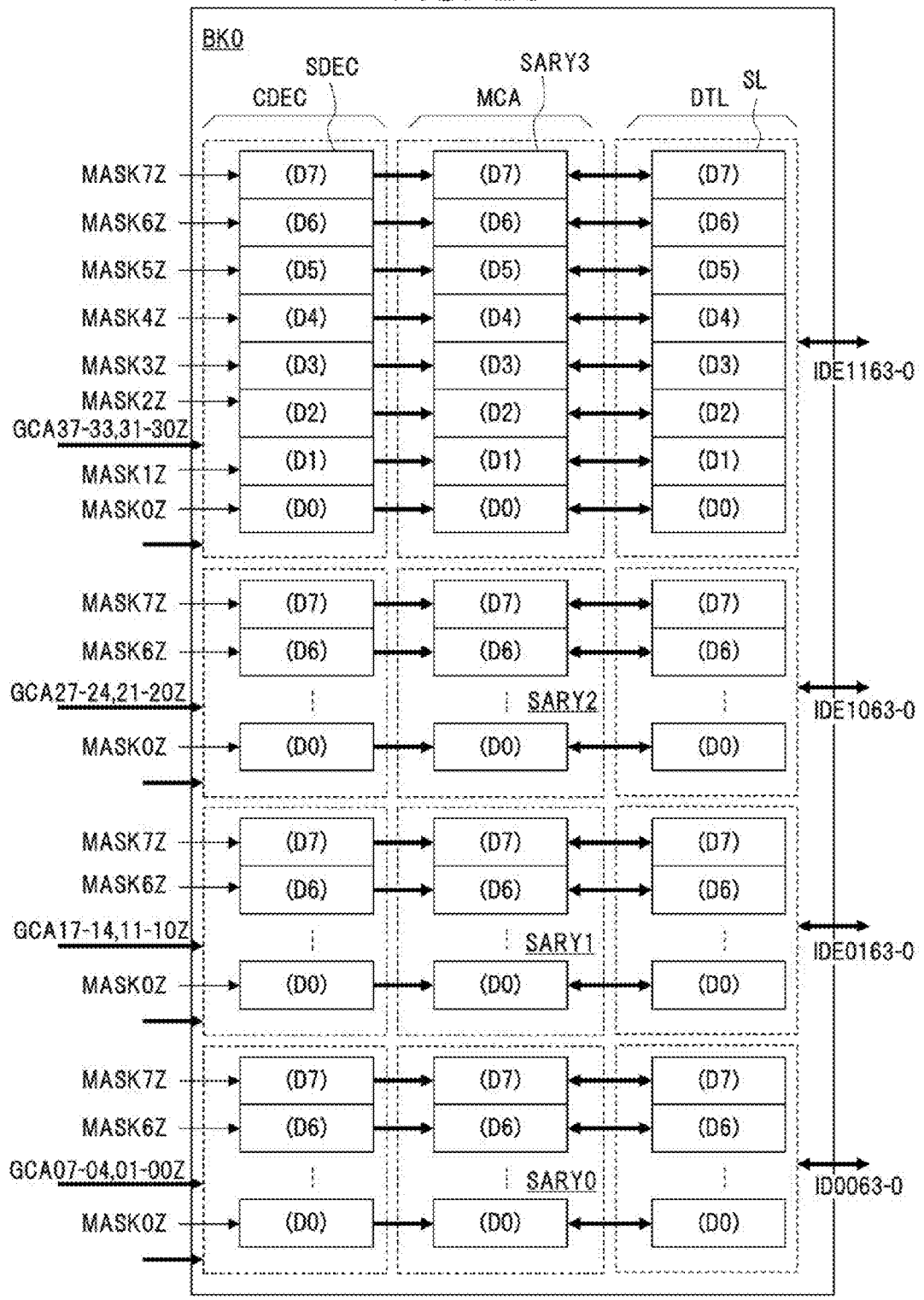
FIG. 25 illustrates an exemplary bank.

The degeneration control units COMPCNT2-0 operate in substantially the same manner as the degeneration control unit COMPCNT3. When the address signals GCA33-32Z are "11" a sub-array SARY3 illustrated in FIG. 25 is activated. When each of the address signals GCA23-22Z, GCA13-12Z, and GCA03-02Z is "11" sub-arrays SARY2, SARY1, and SARY0 illustrated in FIG. 25 are activated. For example, when the degeneration signal COMP3Z is "1" the address signals GCA33Z, 23Z, 13Z, and 03Z are set to a high level regardless of a logic of the address signal PCA3Z. Two of the sub-arrays SARY3-0 are contemporaneously activated according to logic levels of the address signals PCA3-2Z. When the degeneration signal COMP2Z is "1" two of the sub-arrays SARY3-0 are contemporaneously activated. When the degeneration signals COMP3-2Z are "11" the sub-arrays SARY3-0 are contemporaneously activated.

Figure 24:
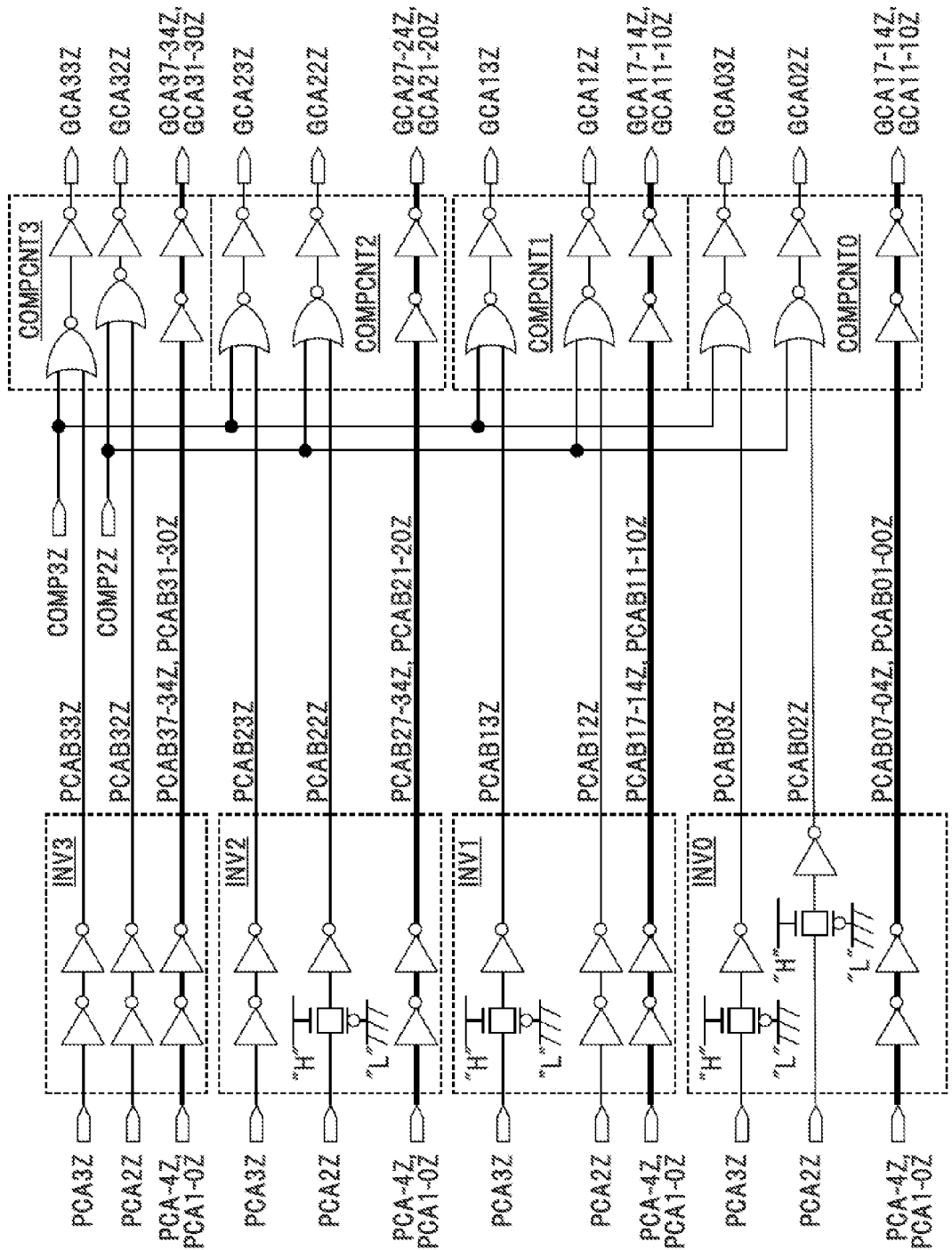
FIG. 24 illustrates an exemplary address inverting unit and an exemplary degeneration control unit.

FIG. 24 illustrates an exemplary address inverting units and an exemplary degeneration control units. The exemplary address inverting units and the exemplary degeneration control units may be the address inverting units INV3-0 and the degeneration control units COMPCNT3-0 illustrated in FIG. 23. In the address inverting units INV2-0, delay time of ON CMOS transfer gates is substantially equal to delay time of inverters.

FIG. 25 illustrates an exemplary bank. The exemplary bank may be the bank BK0 illustrated in FIG. 22. Explanation of elements substantially the same as the elements illustrated in FIG. 3 is omitted or reduced. The banks BK1 to BK7 are substantially the same as the bank BK0. A storage capacity of each of the banks BK0 to BK7 may be substantially the same as that of the bank BK0 illustrated in FIG. 1. The bank BK0 includes the sub-arrays SARY3-0 identified by the column address signals GCA03-02Z. A logic of column address signals GCA33-32Z, 23-22Z, 13-12Z, and 03-02Z supplied to the sub-column decoders SDEC corresponding to the sub-arrays SARY3-0 is converted by the degeneration control units COMPCNT3-0. Therefore, plural sub-arrays SARY are activated according to the degeneration signals MA1-0Z. For example, when one bit of the degeneration signals MA1-0Z is at a high level, two sub-arrays SARY are contemporaneously activated. For example, when all bits of the degeneration signals MA1-0Z are at a high level, all the sub-arrays SARY3-0 are contemporaneously activated.

The sub-column decoder SDEC of the column decoder CDEC corresponding to each of the sub-arrays SARY3-0 decodes, for example, 6-bit column address signals GCA07-04 and 01-00Z. Each of the sub-column decoders SDEC performs decoding when the mask signals MASK7Z to MASK0Z corresponding thereto are at a low level. Each of the sub-column decoders SDEC does not perform decoding when the mask signals MASK7-0Z corresponding thereto is at a high level. Since the sub-column decoder SDEC of each of the sub-arrays SARY3-0 operates for each of areas corresponding to the data groups D7 to D0 according to the mask signals MASK7-0Z, power consumption of the memory MEM may be reduced.

The data latch DTL coupled to the sub-array SARY 3 is coupled to 64-bit internal data lines ID1163-0. Data latches DTL coupled to the sub-arrays SARY2-0, respectively, are coupled to the internal data lines ID1063-0, ID0163-0, and ID0063-0, respectively. In the fourth semiconductor memory, 2-byte, 4-byte, or 8-byte data read to the four internal data line groups ID1163-0, ID1063-0, ID0163-0, and ID0063-0 are replaced with one another by the data bus selector 32C illustrated in FIG. 22. The replacement is performed according to the mask signals MASK7-0Z. Data corresponding to the different column address signals CA7-0 are contemporaneously read from the data terminals DQ63-0.

Figure 26:
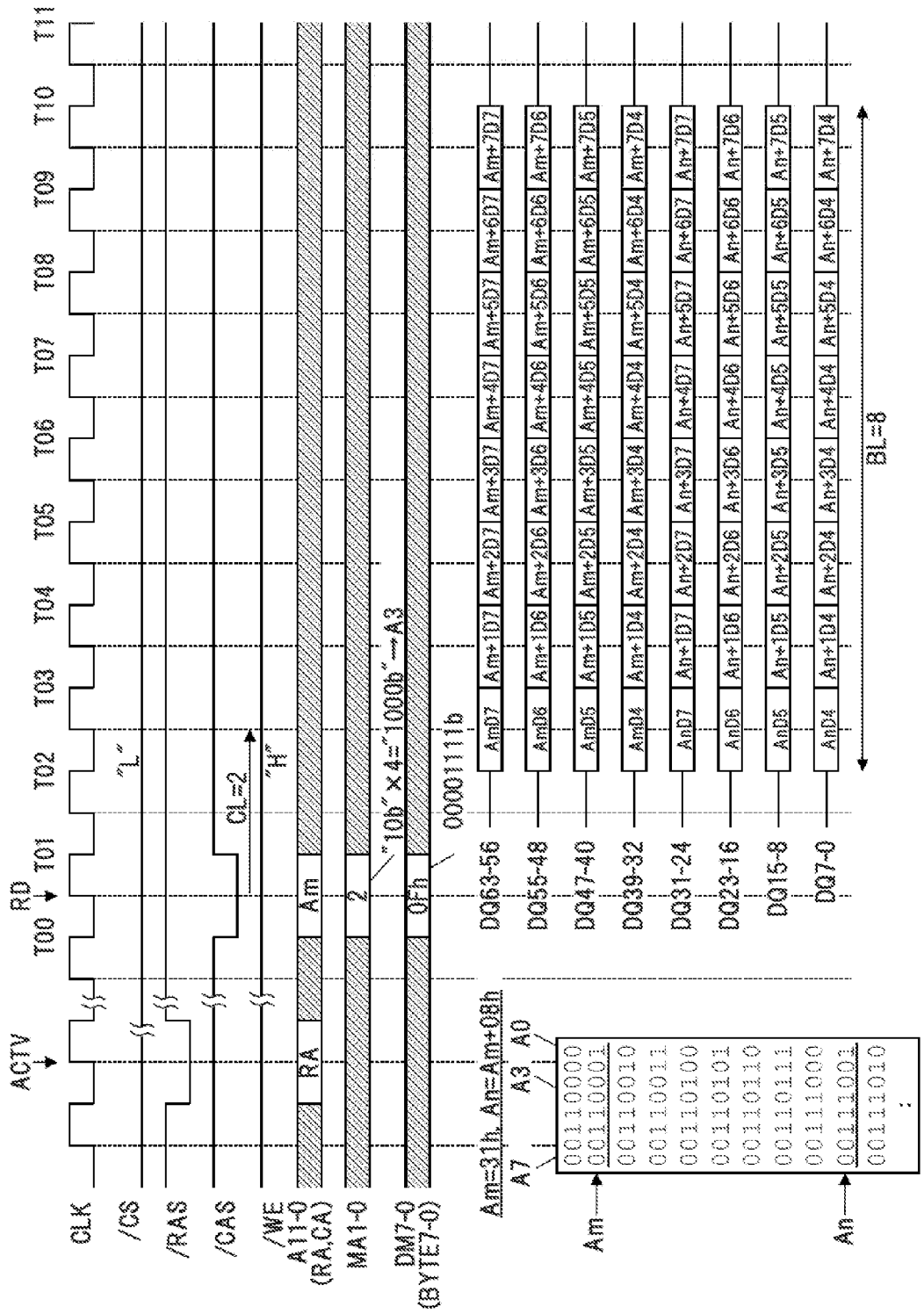
FIG. 26 illustrates exemplary operations of a semiconductor memory.

FIG. 26 illustrates exemplary operations of a semiconductor memory. The semiconductor memory may be the semiconductor memory MEM illustrated in FIG. 22. When the memory controller MCNT controlled by the processor PRC accesses the memory MEM, the operations illustrated in FIG. 26 are executed. Explanation of operations substantially the same as the operations illustrated in FIG. 13 is omitted or reduced. The burst length BL is set to "8". The CAS latency CL is set to "2". A logic of the byte signals BYTE7-0 may be "0Fh" like the logic illustrated in FIG. 13. The degeneration signals MA1-0 are supplied to the memory MEM form the memory controller MCNT. The readout command RD is not supplied to the memory MEM at time T05. Other operations are substantially the same as or similar to the operations illustrated in FIG. 13.

Since a logic of the degeneration signals MA1-0 is "10b" (2 in a decimal number), a logic of the column address signal CA3 is masked. A bit number of the column address signal CA to be masked, for example, "3" is calculated by multiplying the degeneration signals MA1-0 by four. A calculated value is converted into a binary number and set as, for example, "1000b". A number of a digit in which "1" is set indicates a bit number to be masked.

Since the column address signal CA3 is masked, data are read from the sub-arrays SARY3 and SARY1 or the sub-arrays SARY2 and SARY0 illustrated in FIG. 25 according to the column address signal CA2. For example, when the column address signal CA7-0(Am) supplied together with the read command RD are 31h, the column address signal CA2 is "0". A logic of the byte signals BYTE7-0 is "0Fh". At this point, the data groups D7 to D4 to which a column address=31h(Am) of the sub-array SARY0 is assigned are read. At substantially the same time, the data groups D7 to D4 to which a column address=39h(Am+08h=An) of the sub-array SARY2 is assigned are read. The column address of the sub-array SARY2 is calculated by an EOR operation of the address Am and the value obtained by multiplying the degeneration signals MA1-0 by four.

Numbers, for example, 7 to 4 of the data groups D7 to D4 transferred from the sub-arrays SARY0 and SARY2 to the data terminals DQ63-0 are substantially equal to one another. Thereafter, the pre-column address signals PCA7-0Z are incremented by one by the burst counter BCOUNT and a burst operation is performed.

For example, when a logic of the degeneration signals MA1-0 is "11" and a logic of the mask signals MASK7-0Z is "FCh" data are read from memory areas corresponding to the data groups D1 to D0 of all the sub-arrays SARY3 to SARY0. A value four times as large as a logic value of the degeneration signals MA1-0 may be "00011000b". Column addresses of the sub-arrays SARY excluding the sub-array SARY to which the address Am is assigned are calculated by subjecting the address Am and each of "00001000b", "00010000", and "00011000" to the EOR operation.

Data from the sub-array SARY corresponding to the column address signal Am is output to the data terminals DQ15-0. Data from the sub-array SARY corresponding to the column address signal Am+04h is output to the data terminals DQ31-16. Data from the sub-array SARY corresponding to the column address signal Am+08h is output to the data terminals D47-32. Data from the sub-array SARY corresponding to the column address signals Am+0Ch is output to the data terminals D63-48.

When 3-bit addresses for identifying the banks BK0-7 include column addresses CA3-2, the sub-arrays SARY3 to SARY0 are assigned to the banks BK different from one other. The column-address control unit 26C outputs the global column address signal groups GCA3-0Z to the banks BK. Word lines of the two banks BK are activated and data groups are read from memory cells selected by the column addresses CA among memory cells coupled to the respective word lines. The data groups read from the banks BK are output to one of the internal data lines ID1163-0, ID1063-0, ID0163-0, and ID0063-0 and transferred to the data bus selector 32C. Each of the banks BK0-7 includes a data selector that outputs output of the data latch DTL to one of the internal data lines ID1163-0, ID1063-0, ID0163-0, and ID0063-0. Operations substantially the same as the operations illustrated in FIG. 26 are performed.

In a write operation, two sets of data groups written in memory cells assigned allocated to the column addresses Am and An different from each other are supplied together with a write command. Other operations are substantially the same as or similar to the operations illustrated in FIG. 26. In the write operation, the data illustrated in FIG. 26 are supplied to the memory MEM as write data two clock cycles earlier.

The fourth semiconductor memory has effects substantially the same as those in the first to third semiconductor memories. In the fourth semiconductor memory, since the degeneration signals MA1-0 are used, the two column addresses CA7 are not supplied from the memory controller MCNT to the memory MEM and arbitrary data groups are contemporaneously output from plural memory areas having different column addresses CA7. Control of the memory controller MCNT is simplified and a data transfer rate and performance of the system SYS are improved.

Figure 27:
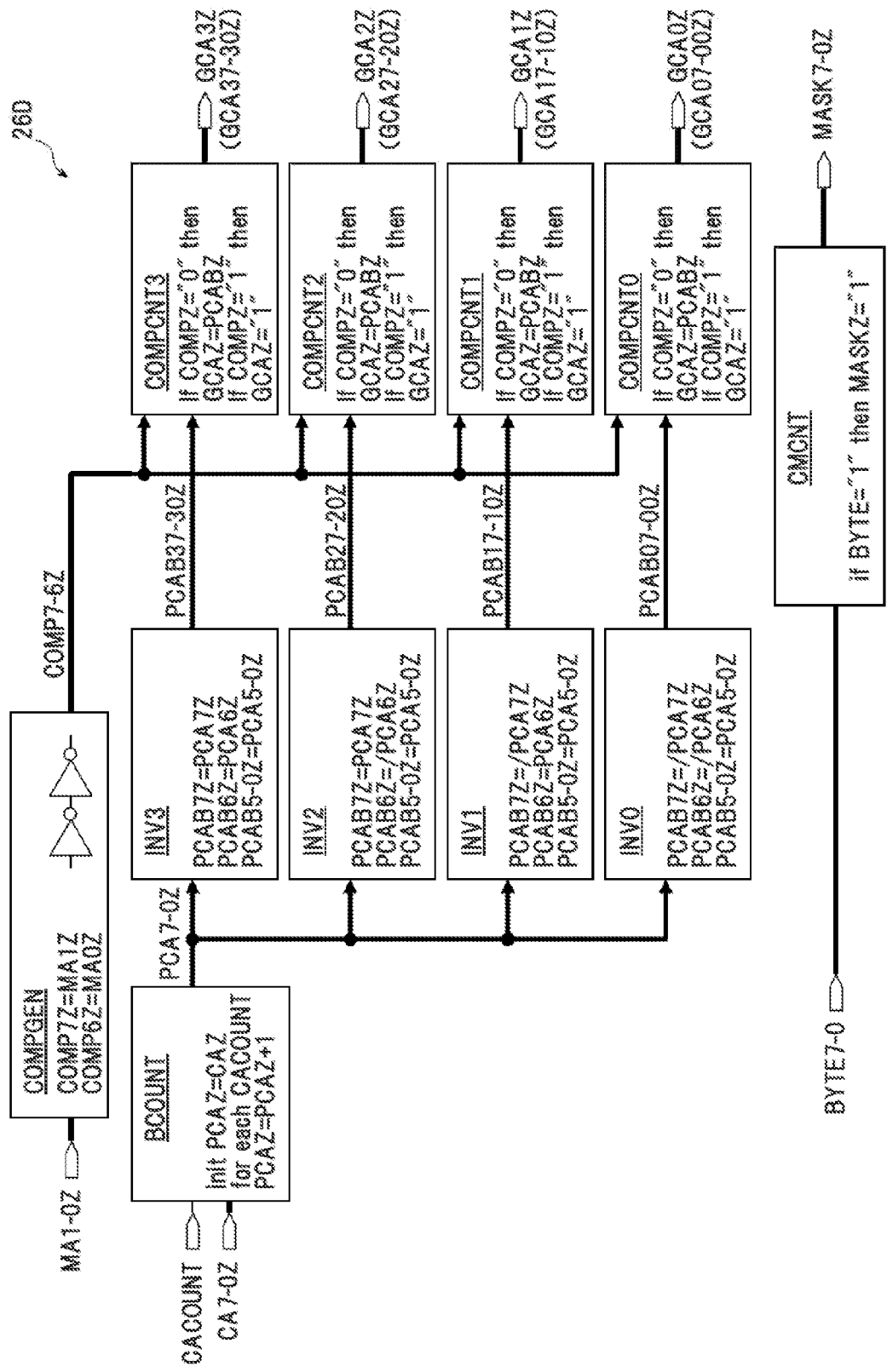
FIG. 27 illustrates a fifth semiconductor memory.

FIG. 27 illustrates a fifth semiconductor memory. Elements substantially the same as the elements in the first to fourth semiconductor memories are denoted by the same reference numerals and signs and detailed explanation of the elements is omitted or reduced. The memory MEM may be an SDRAM. The memory MEM may be mounted on the system SYS illustrated in FIG. 12. For example, image data is stored in the memory cells MC. The memory controller MCNT outputs the degeneration signals MA1-0. The memory MEM according to the fifth semiconductor memory includes a column-address control unit 26D instead of the column-address control unit 26C illustrated in FIG. 22. Other elements are substantially the same as or similar to the elements illustrated in FIG. 22.

The degeneration-signal generating unit COMPGEN of the column-address control unit 26D outputs the degeneration signals MA1-0Z as degeneration signals COMP7-6Z. The address inverting units INV2-0 convert a logic of the address signals PCA7-0Z and outputs the address signals PCA7-0Z as pre-column address signals PCAB27-20Z. In the fifth embodiment, the column address signals CA7-0Z are degenerated. The sub-arrays SARY3-0 illustrated in FIG. 25 are identified by the column address signals CA7-0Z.

Other functions of the address inverting units INV2-0 are substantially the same as or similar to the functions of the address inverting units INV2-0 illustrated in FIG. 23. Functions of the address inverting unit INV3 are substantially the same as or similar to the functions of the address inverting unit INV3 illustrated in FIG. 23. The degeneration control units COMPCNT3-0 and the column-mask control unit CMCNT are substantially the same as or similar to the degeneration control units and the column-mask control unit illustrated in FIG. 23.

Figure 28:
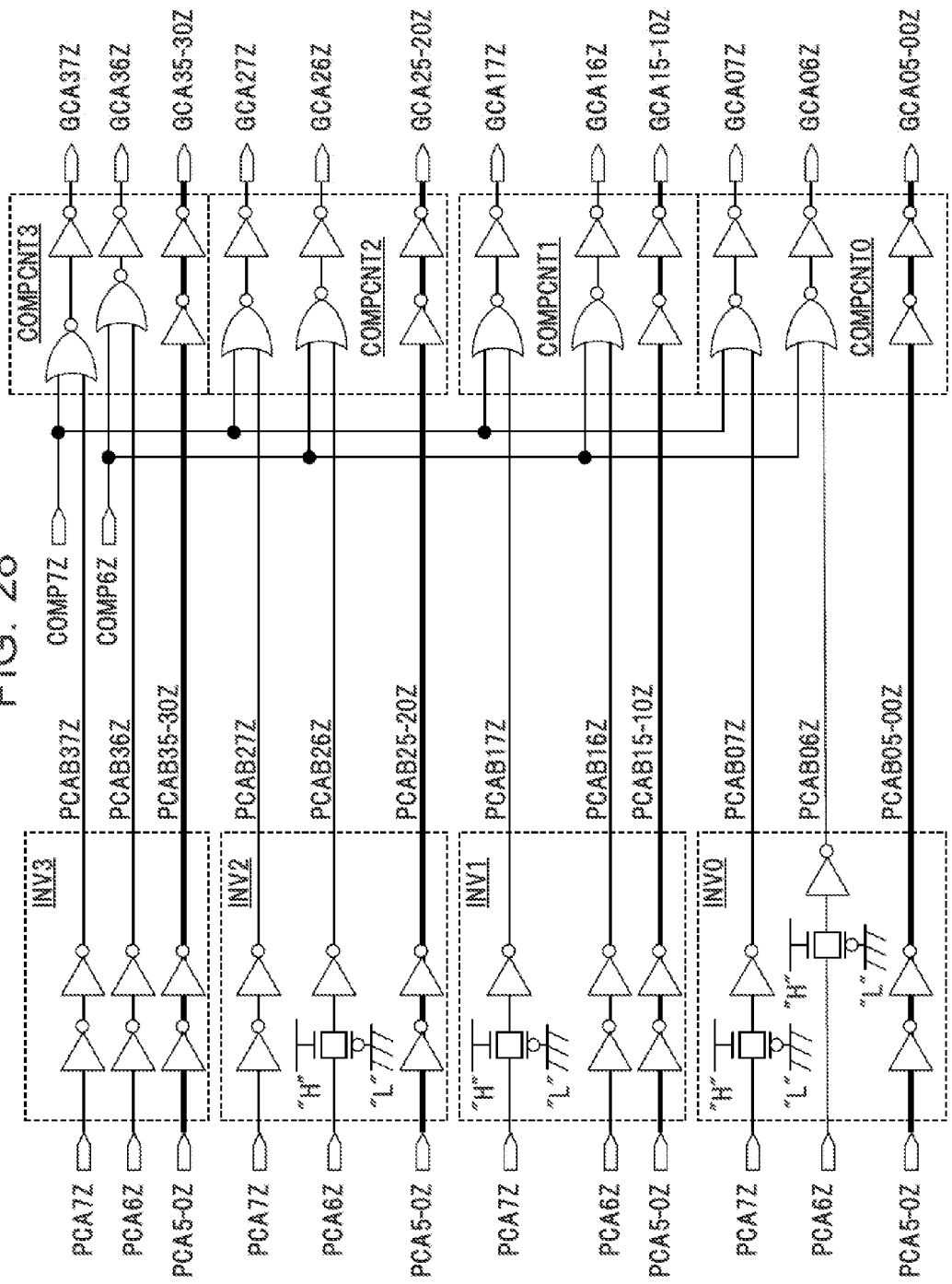
FIG. 28 illustrates an exemplary address inverting unit and an exemplary degeneration control unit.

FIG. 28 illustrates an exemplary address inverting units and an exemplary degeneration control units. The exemplary address inverting units and the exemplary degeneration control units may be the address inverting units INV3-0 and the degeneration control units COMPCNT3-0 illustrated in FIG. 27. A logic of the address inverting units INV3-0 and the degeneration control units COMPCNT3-0 is substantially the same as or similar to the logic illustrated in FIG. 24.

Figure 29:
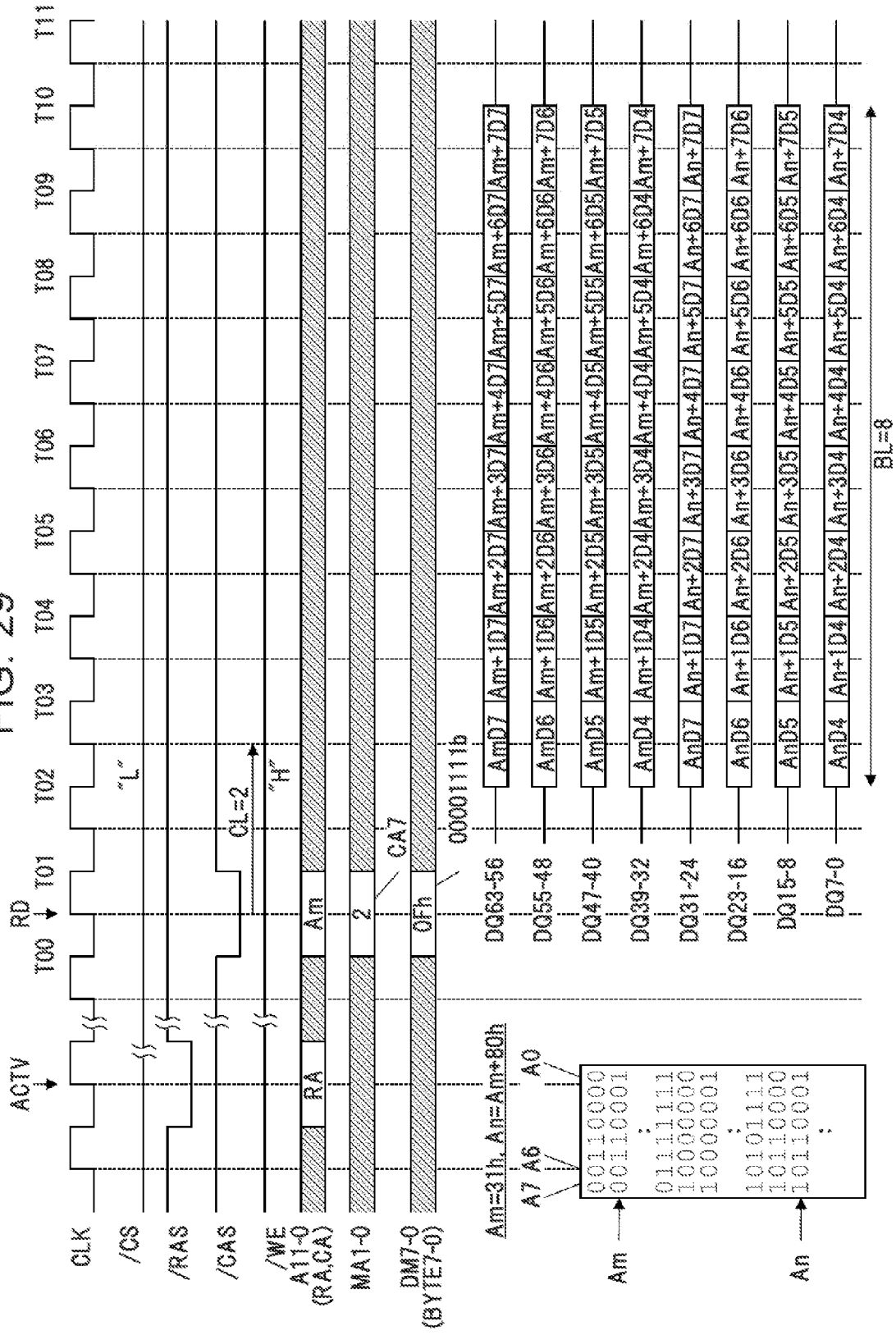
FIG. 29 illustrates exemplary operations of a semiconductor memory.

FIG. 29 illustrates exemplary operations of a semiconductor memory. The semiconductor memory may include the column-address control unit 26D illustrated in FIG. 27. When the memory controller MCNT controlled by the processor PRC accesses the memory MEM, the operations illustrated in FIG. 29 are performed. Explanation of operations substantially the same as the operations illustrated in FIG. 26 is omitted or reduced. In the fifth semiconductor memory, since the degeneration signals MA1-0 are "2" in a decimal number, a logic of the column address signal CA7 is masked.

For example, when the column address signals CA7-0 (Am) supplied together with the read command RD are 31h, the column address signal CA7 is "0". A logic of the byte signals BYTE7-0 is "0Fh". The data groups D7 to D4 to which the column address=31h(Am) of the sub-array SARY0 is assigned are read. At substantially the same time, the data groups D7 to D4 to which a column address=B1h(Am+ 80h=An) of the sub-array SARY2 is assigned allocated are read. A column address of the sub-array SARY2 is calculated by subjecting the address Am and a value, which is obtained by multiplying a value of the degeneration signals MA1-0 by 64, to an EOR operation. Numbers, for example, numbers 7 to 4 of the data groups D7 to D4 transferred from the sub-arrays SARY0 and SARY2 to the data terminals DQ63-0 are substantially equal to one another. Thereafter, in substantially the same manner as the operations illustrated in FIG. 26, the pre-column address signals PCA7-0Z are incremented by one by the burst counter BCOUNT and a burst operation is executed.

In the fifth semiconductor memory, in a write operation, two sets of data groups written in memory cells assigned to the column addresses Am and An different from each other are supplied together with a write command. Other operations are substantially the same as or similar to the operations illustrated in FIG. 29. In the write operation, the data illustrated in FIG. 29 are supplied to the memory MEM as write data two clock cycles earlier.

Figure 30:
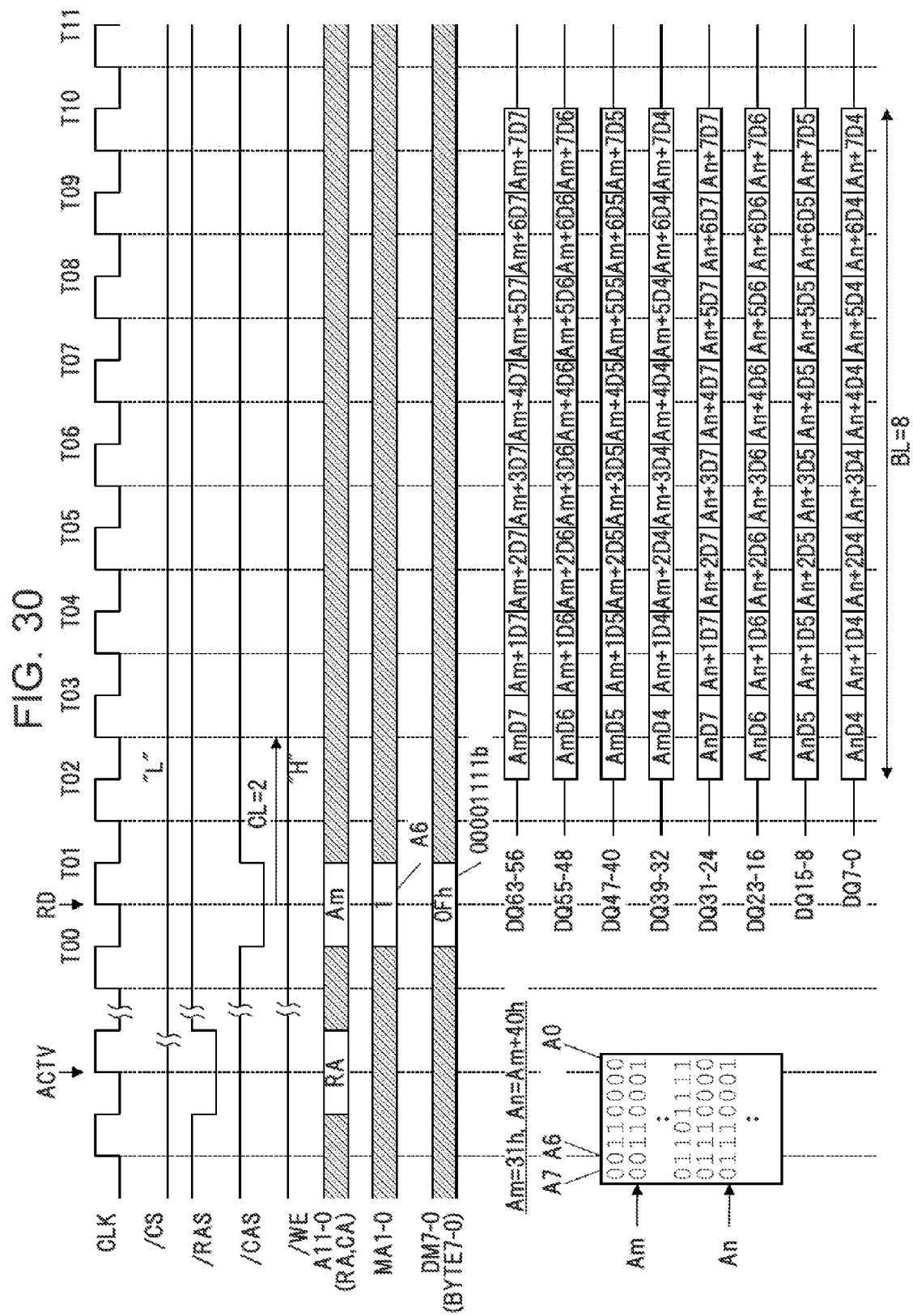
FIG. 30 illustrates other exemplary operations of a semiconductor memory.

FIG. 30 illustrates other exemplary operations of a semiconductor memory. The semiconductor memory may include the column-address control unit 26D illustrated in FIG. 27. Explanation of operations substantially the same as the operations illustrated in FIGS. 26 and 29 is omitted or reduced. In the fifth semiconductor memory, since the degeneration signals MA1-0 are "1" in a decimal number, a logic of the column address signal CA6 is masked.

For example, when the column address signals CA7-0 (Am) supplied together with the read command RD are 31h, the column address signal CA6 is "0". A logic of the byte signals BYTE7-0 is "0Fh". The data groups D7 to D4 to which the column address=31h(Am) of the sub-array SARY0 is assigned allocated are read. At substantially the same time, the data groups D7 to D4 to which a column address=71h (Am+40h=An) of the sub-array SARY2 is assigned are read. A column address of the sub-array SARY2 is calculated by subjecting the address Am and a value, which is obtained by multiplying a value of the degeneration signals MA1-0 by 64, to an EOR operation.

Figure 31:
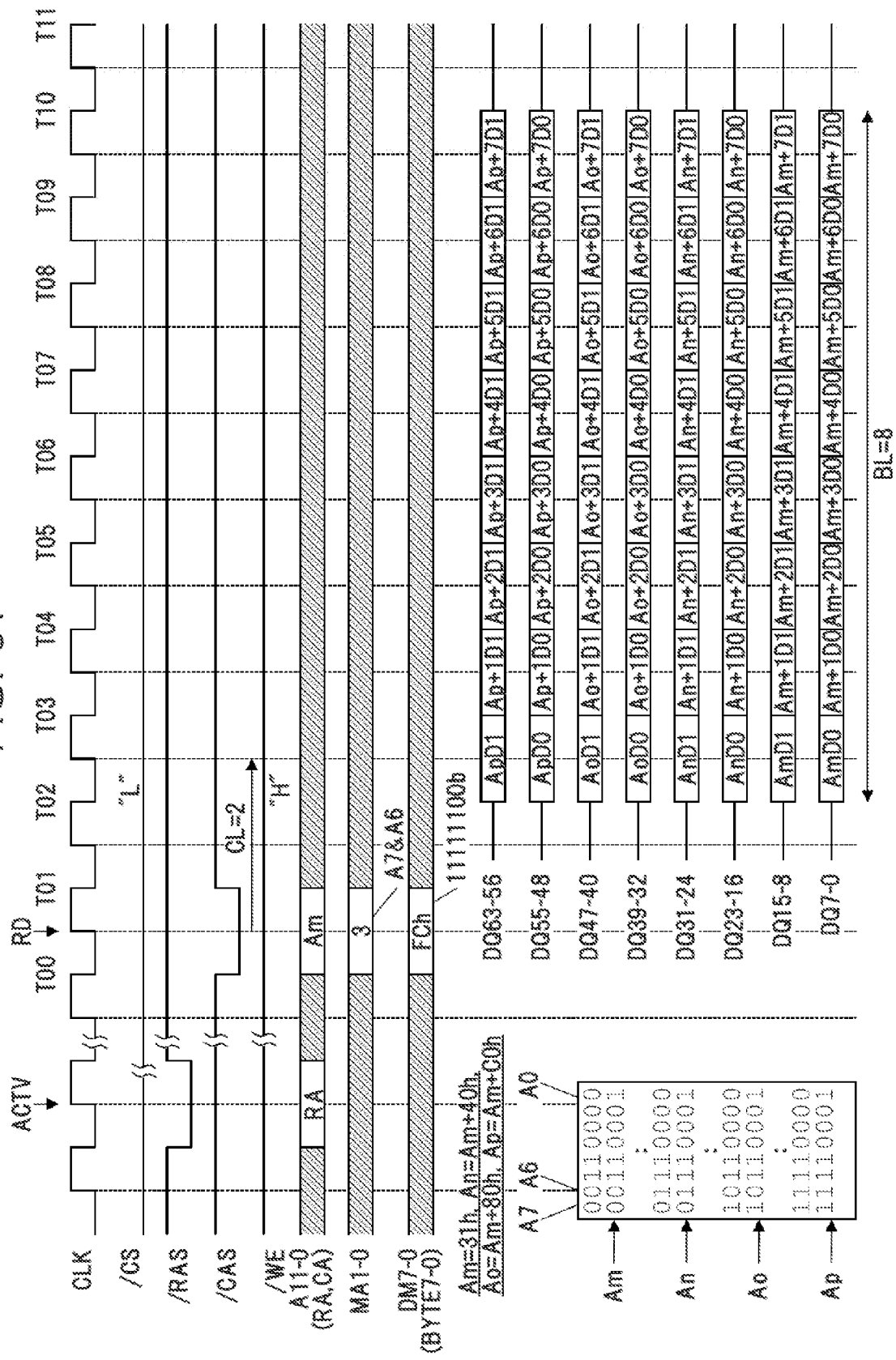
FIG. 31 illustrates still other exemplary operations of a semiconductor memory.

FIG. 31 illustrates other exemplary operations of a semiconductor memory. The semiconductor memory may include the column-address control unit 26D illustrated in FIG. 27. Explanation of operations substantially the same as the operations illustrated in FIGS. 26 and 29 is omitted or reduced. In the fifth semiconductor memory, since the degeneration signals MA1-0 are "3" in a decimal number, a logic of the column address signals CA7-6 is masked. A logic of the byte signals BYTE7-0 is "FCh". Therefore, the data groups D1 to D0 of the four sub-arrays SARY3-0 corresponding to the byte signals BYTE1-0 of a logic "0" are output from the data terminals DQ63-0.

For example, when the column address signals CA7-0 (Am) supplied together with the read command RD are 31h, the column address signals CA7-6 are "00b". The data groups D1 to D0 to which the column address=31h(Am) of the sub-array SARY0 is assigned are read. At the same time, the data groups D1 to D0 to which the column address=71h(Am+ 40h=An) of the sub-array SARY1 is allocated, the data groups D1 to D0 to which a column address=B1h(Am+ 80h=Ao) of the sub-array SARY2 is assigned, and the data groups D1 to D0 to which a column address=F1h(Am+ C0h=Ap) of the sub-array SARY3 is assigned are read. A value 64 times as large as a logic value of the degeneration signals MA1-0 is "11000000b". Column addresses of the sub-arrays SARY other than the sub-array SARY to which the address Am is assigned are calculated by subjecting the address Am and each of "01000000b", "10000000", and "11000000" to an EOR operation.

When 3-bit addresses for identifying the banks BK0-7 include the column addresses CA7-6, the sub-arrays SARY3-0 are assigned to the banks BK different from one another. The column-address control unit 26D outputs the global column address signal groups GCA3-0Z to the banks BK, respectively. Word lines of the two banks BK are activated and data groups are read from memory cells selected by the column addresses CA among memory cells coupled to the respective word lines. Each of the banks BK0-7 includes a data selector that outputs output of the data latch DTL to one of the internal data lines ID1163-0, ID1063-0, ID0163-0, and ID0063-0. Operations substantially the same as the operations illustrated in FIG. 29 to FIG. 31 are performed.

The fifth semiconductor memory has substantially the effects as those in the first to fourth semiconductor memory. In the fifth semiconductor memory, an arbitrary bit of the column addresses CA7-0 is degenerated by the column-address control unit 26D.

Figure 32:
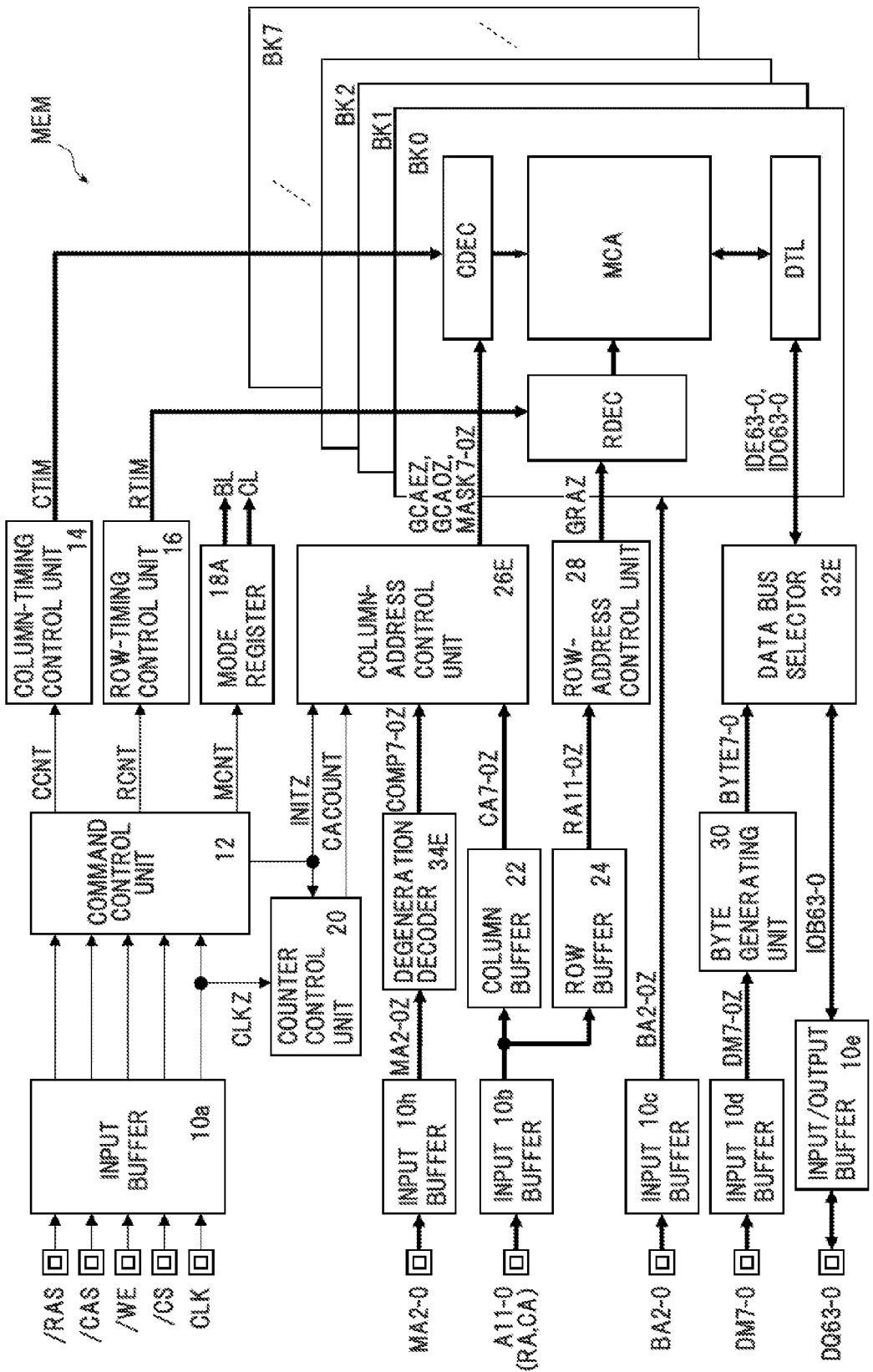
FIG. 32 illustrates a sixth semiconductor memory.

FIG. 32 illustrates a sixth semiconductor memory. Elements substantially the same as the elements in the first to fifth semiconductor memory are denoted by the same reference numerals and signs and explanation of the elements is omitted or reduced. The memory MEM may be an SDRAM. The memory MEM may be mounted on the system SYS illustrated in FIG. 12. For example, image data is stored in the memory cells MC. The memory controller MCNT outputs 3-bit degeneration signals MA2-0.

The memory MEM includes a column-address control unit 26E and a data bus selector 32E instead of the column-address control unit 26C and the data bus selector 32C illustrated in FIG. 22. Functions of the data bus selector 32E are substantially the same as or similar to the functions illustrated in FIG. 1. The memory MEM includes an input buffer 10h that receives the degeneration signals MA2-0 and a degeneration decoder 34E that decodes the 3-bit degeneration signals MA2-0Z from the input buffer 10h and outputs 8-bit degeneration signals COMP7-0Z. Other elements are substantially the same as or similar to the components illustrated in FIG. 1. Each of the banks BK0-7 includes the even number area EA and the odd number area OA illustrated in FIG. 3.

The degeneration decoder 34E recognizes logic values indicated by the degeneration signals MA2-0 as bit numbers of the degeneration signals COMP7-0Z. The degeneration decoder 34E sets one of bits of the degeneration signals COMP7-0Z to a high level and sets the remaining seven bits to a low level. A number of the high-level bit of the degeneration signals COMP7-0Z indicates a bit number of the column addresses CA7-0 to be degenerated.

Like the column-address control unit illustrated in FIG. 23, the column-address control unit 26E includes a buffer unit that outputs the column address PCAZ as pre-column address signals PCA7-0Z without inverting the column address PCAZ and an inverting unit that inverts a given bit of a logic of the column address PCAZ. The inverting unit inverts bits of the column address signals CA7-0Z corresponding to the high-level degeneration signals COMP7-0Z and outputs the column address signals CA7-0Z as pre-column address signals PCA7-0Z. For example, the inverting unit includes a first buffer that outputs a signal having a logic substantially the same as that of the column addresses CA for each of bits of the column address signal CA and a second buffer that outputs a signal having a logic opposite to that of the column addresses CA. The first buffer transmits the column addresses CA when the corresponding degeneration signal COMPZ is at a low level. The second buffer transmits the column addresses CA when the corresponding degeneration signal COMPZ is at a high level.

The column-address control unit 26E uses the column address CA to be degenerated, for example, one bit to identify the even number area EA and the odd number area OA illustrated in FIG. 3 and generates the global column address signals GCAEZ and GCAOZ based on the remaining column addresses CA. The column-address control unit 26E replaces bits of the column addresses CA7-0Z according to the degeneration signals COMP7-0Z. The column-address control unit 26E outputs the byte signals BYTE7-0 as the mask signals MASK7-0Z.

Figure 33:
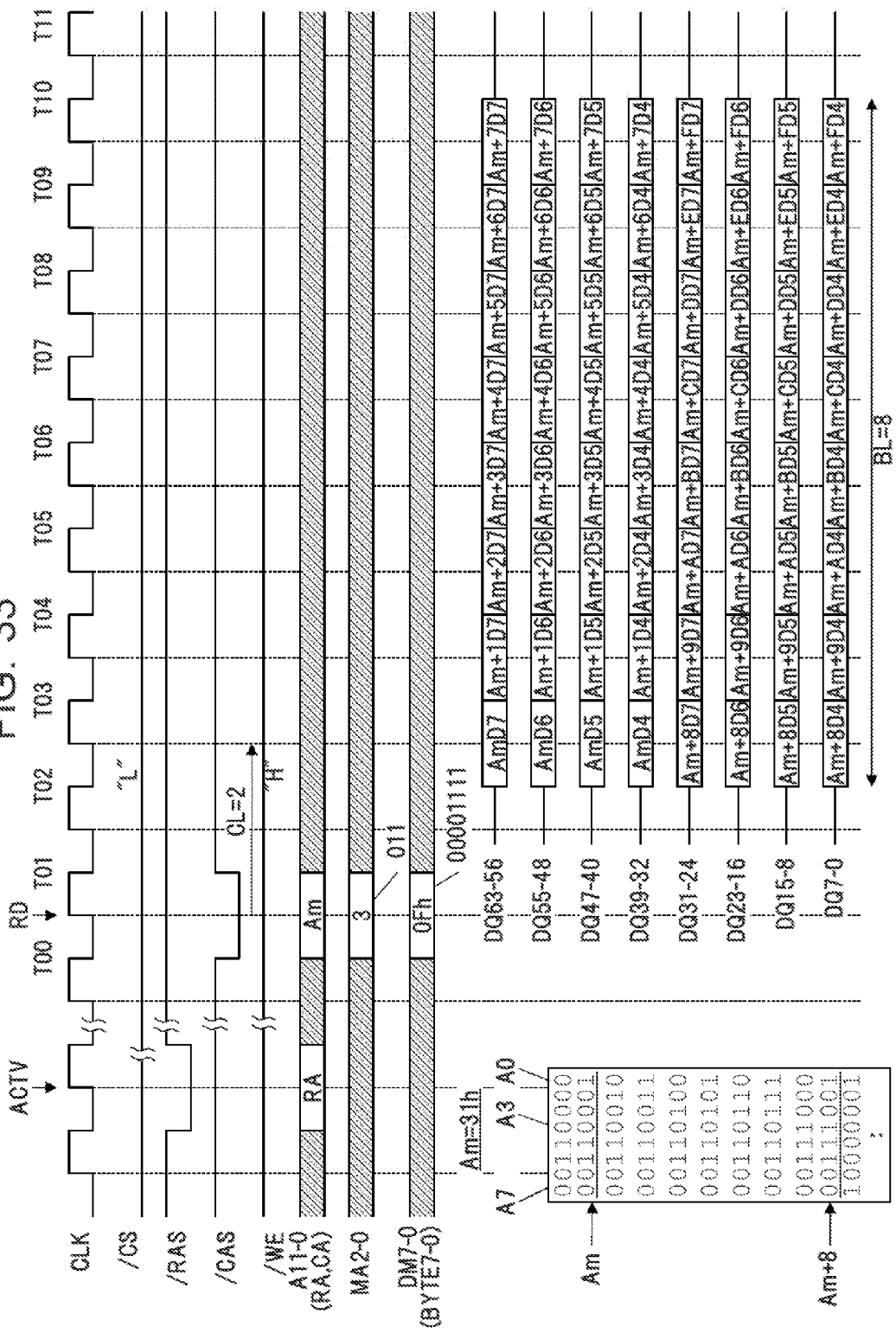
FIG. 33 illustrates exemplary operations of a semiconductor memory.

FIG. 33 illustrates exemplary operations of a semiconductor memory. The semiconductor memory may be the semiconductor memory MEM illustrated in FIG. 32. When the memory controller MCNT controlled by the processor PRC accesses the memory MEM, the operations illustrated in FIG. 33 are performed. Explanation of operations substantially the same as those illustrated in FIG. 26 is omitted or reduced. Signals output by the memory controller MCNT to the memory MEM are substantially the same as the signals illustrated in FIG. 26 except the degeneration signals MA2-0. Since a logic of the degeneration signals MA2-0 is "3" in a decimal number, a logic of the column address signal CA3 is masked. The even number area EA and the odd number area OA are identified by the column address CA3. The memory MEM performs operations substantially the same as or similar to those illustrated in FIG. 26 and outputs the data groups D7 to D4 assigned by the column addresses CA from the data terminals DQ63-0.

In a write operation in the sixth semiconductor memory, two sets of data groups written in memory cells assigned to the column addresses Am and Am+8 different from each other are supplied together with a write command. Other operations are substantially the same as or similar to the operations illustrated in FIG. 33. In the write operation, the data illustrated in FIG. 33 are supplied to the memory MEM as write data two clock cycles earlier.

Figure 34:
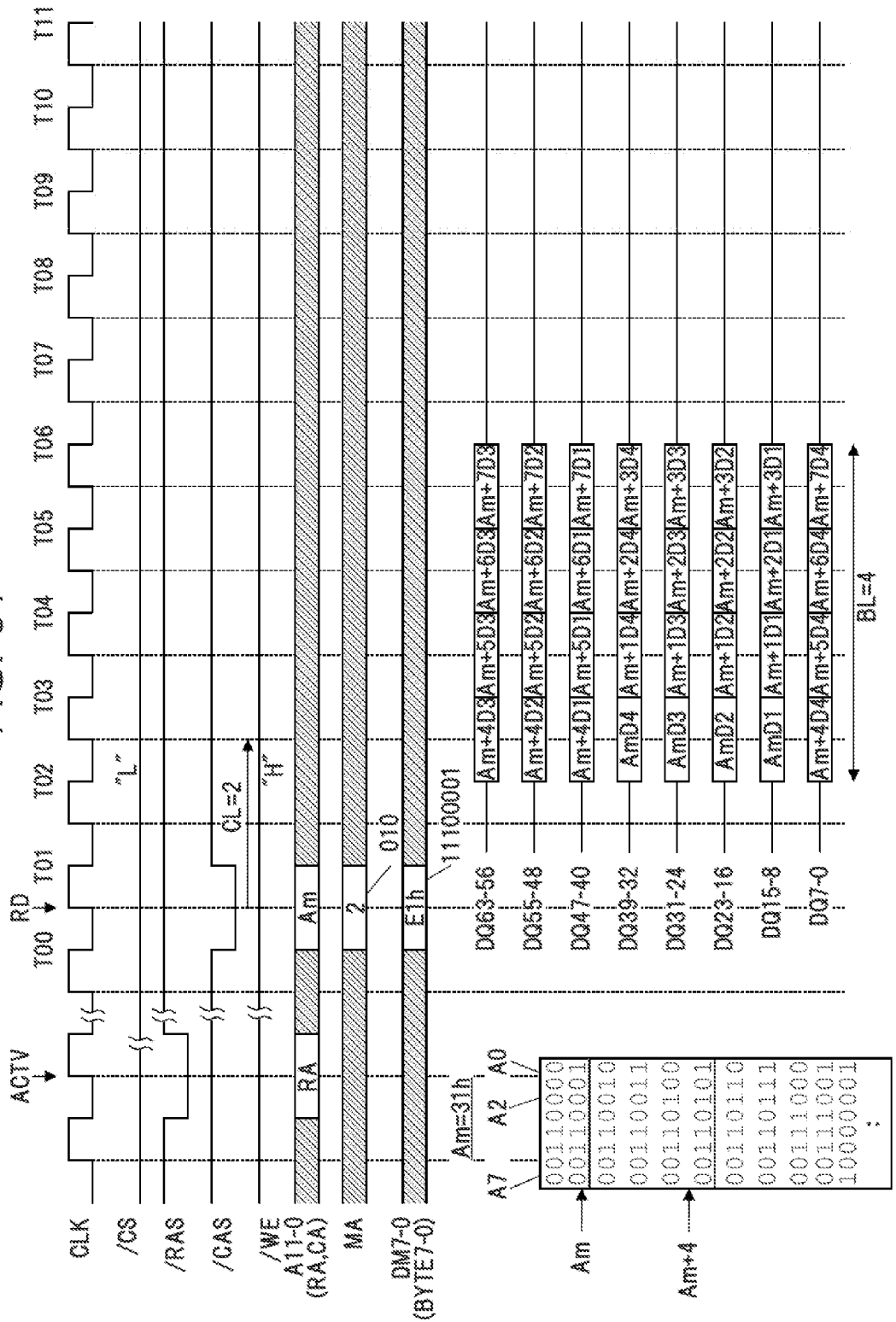
FIG. 34 illustrates other exemplary operations of a semiconductor memory.

FIG. 34 illustrates other exemplary operations of a semiconductor memory MEM. The semiconductor memory may be the semiconductor memory illustrated in FIG. 32. Explanation of operations substantially the same as the operations illustrated in FIGS. 26 and 33 is omitted or reduced. The burst length BL is set to "4".

Because a logic of the byte signals BYTE7-0 is "E1h (11100001b)", the data groups D4 to d1 are read. Because the degeneration signals MA1-0 are "2" in a decimal number, a logic of the column address signal CA2 is masked. The even number area EA and the odd number area OA are identified by the column address CA2. Two sets of data groups D4 to D1 assigned to the column address Am and a column address Am+4 supplied together with the read command RD are contemporaneously output from the data terminals DQ63-0.

The data bus selector 32E outputs the data groups D4 to D1 to the data terminals DQ39-8 corresponding to the byte signals BYTE4-1 of a logic "0". The data bus selector 32E outputs the data groups D3 to D1 and D4 to the data terminals DQ63-40 and DQ7-0 corresponding to the byte signals BYTE7-5 and 0 of a logic "1". The data bus selector 32E determines the data terminals DQ for outputting the data groups D3 to D1 and D4 according to a following rule.

The data terminal groups DQ63-56, DQ55-48, DQ47-40, DQ39-32, DQ31-24, DQ23-16, DQ15-8, and DQ7-0 are indicated by "111", "110", "101", "100", "011", "010", "001" or "000" of a binary number. For example, the data groups D4 to D1 are output from DQ39-32, DQ31-24, DQ23-16, and DQ15-8 corresponding to "100", "011", "010", and "001," which are the same as numbers of the data groups D4 to D1. For example, the data group D4 is output from the data terminals DQ7-0 corresponding to "000" lower-order two bits of which are the same as the data group D4. The data groups D3 to D1 are respectively output from the data terminals DQ63-56, DQ55-48, and DQ47-40 corresponding to "111", "110", and "101" lower-order two bits of which are the same as the data groups D3 to D1.

When the burst length BL is set to "8" the data groups D4 to D1 assigned to the column addresses Am to Am+7 and column addresses Am+4 to Am+B are read. The data groups D4 to D1 assigned to the column addresses Am+4 to Am+7 are redundantly read. In FIG. 34, in order to avert the data groups D4-1 from being redundantly output, the burst length BL is set to "4".

Figure 35:
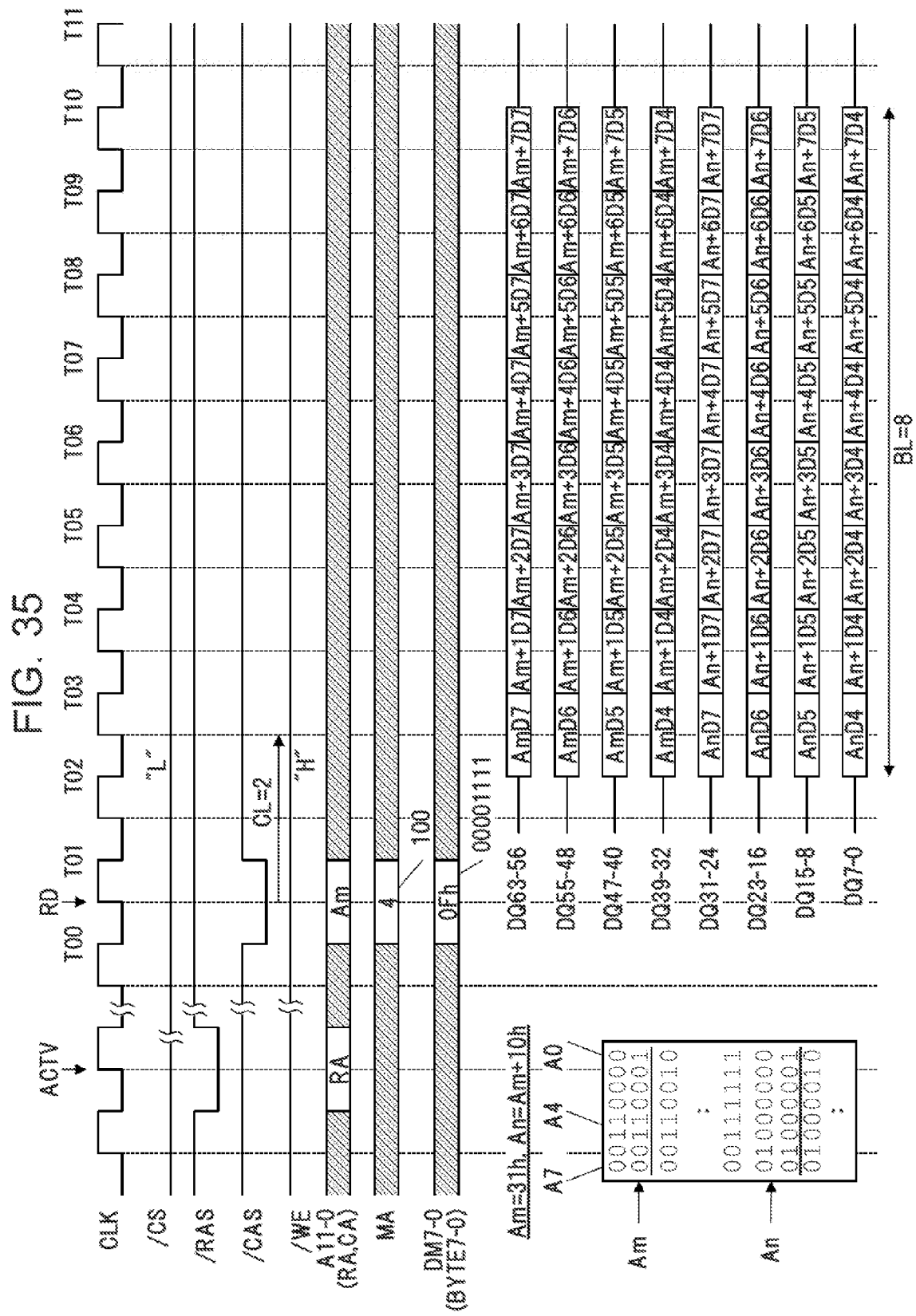
FIG. 35 illustrates still other exemplary operations of a semiconductor memory.

FIG. 35 illustrates other exemplary operations of a semiconductor memory. The semiconductor memory may be the semiconductor memory MEM illustrated in FIG. 32. Explanation of operations substantially the same as the operations illustrated in FIGS. 26 and 33 is omitted or reduced. Since a logic of the degeneration signals MA2-0 is "4" in a decimal number, a logic of the column address signal CA4 is masked. The even number area EA and the odd number area OA are identified by the column address CA4. Two data groups D7 and D4 assigned to the column address Am and a column address An(Am+10h) supplied together with the read command RD are contemporaneously output from the data terminals DQ63-0.

The sixth semiconductor memory has substantially the same effects as the effects in the first to fifth embodiments. In the sixth semiconductor memory, one arbitrary bit of the column addresses CA7-0 is degenerated according to a logic of the degeneration signal MA2-0. An interval of the column addresses CA to which data groups contemporaneously read are assigned is freely changed. A degree of freedom of selection of data groups contemporaneously read increases and a data transfer rate and performance of the system SYS are improved.

Figure 36:
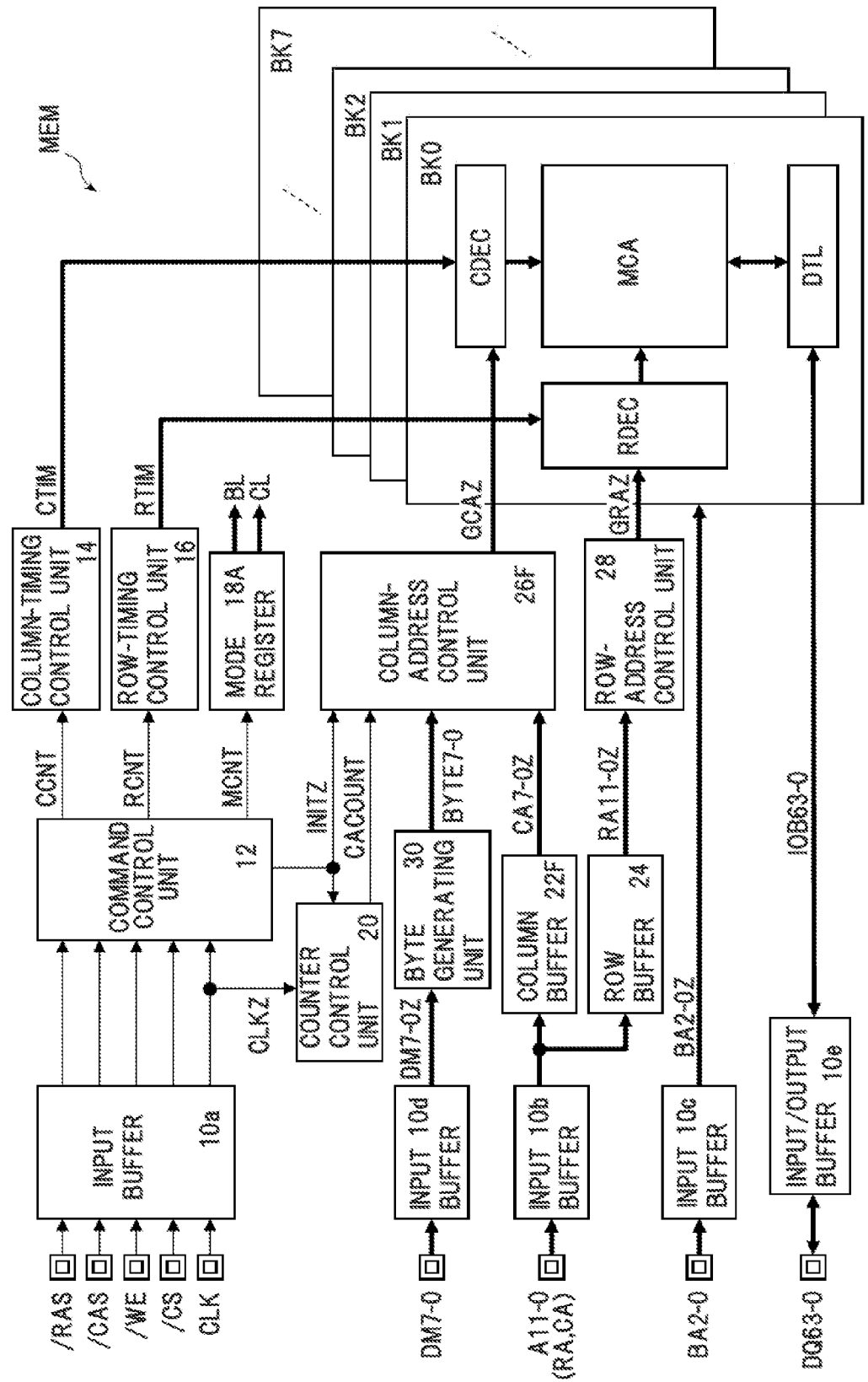
FIG. 36 illustrates a seventh semiconductor memory.

FIG. 36 illustrates a seventh semiconductor memory. Elements substantially the same as the elements in the first to sixth semiconductor memories are denoted by the same reference numerals and signs and explanation of the elements is omitted or reduced. The memory MEM may be an SDRAM. The memory MEM may be mounted on the system SYS illustrated in FIG. 12. For example, image data is stored in the memory cells MC.

The memory MEM includes a mode register 18A, a column buffer 22F, and a column-address control unit 26F instead of the mode register 18, the column buffer 22, and the column-address control unit 26 illustrated in FIG. 1. The data latch DTL of each of the banks BK0-7 is coupled to the internal data buses IOB63-0. The memory MEM may not include the data bus selector 32. Allocation of the column addresses CA7-0 in each of the banks KB0-7 is different from that illustrated in FIG. 1. The column buffer 22F operates in synchronization with a rising edge or a falling edge of the clock signal CLK. Other elements are substantially the same as or similar to the elements illustrated in FIG. 1. The column-address control unit 26F outputs the global column address signal groups GCA7-0Z corresponding to the data groups D7 to D0, respectively.

Figure 37:
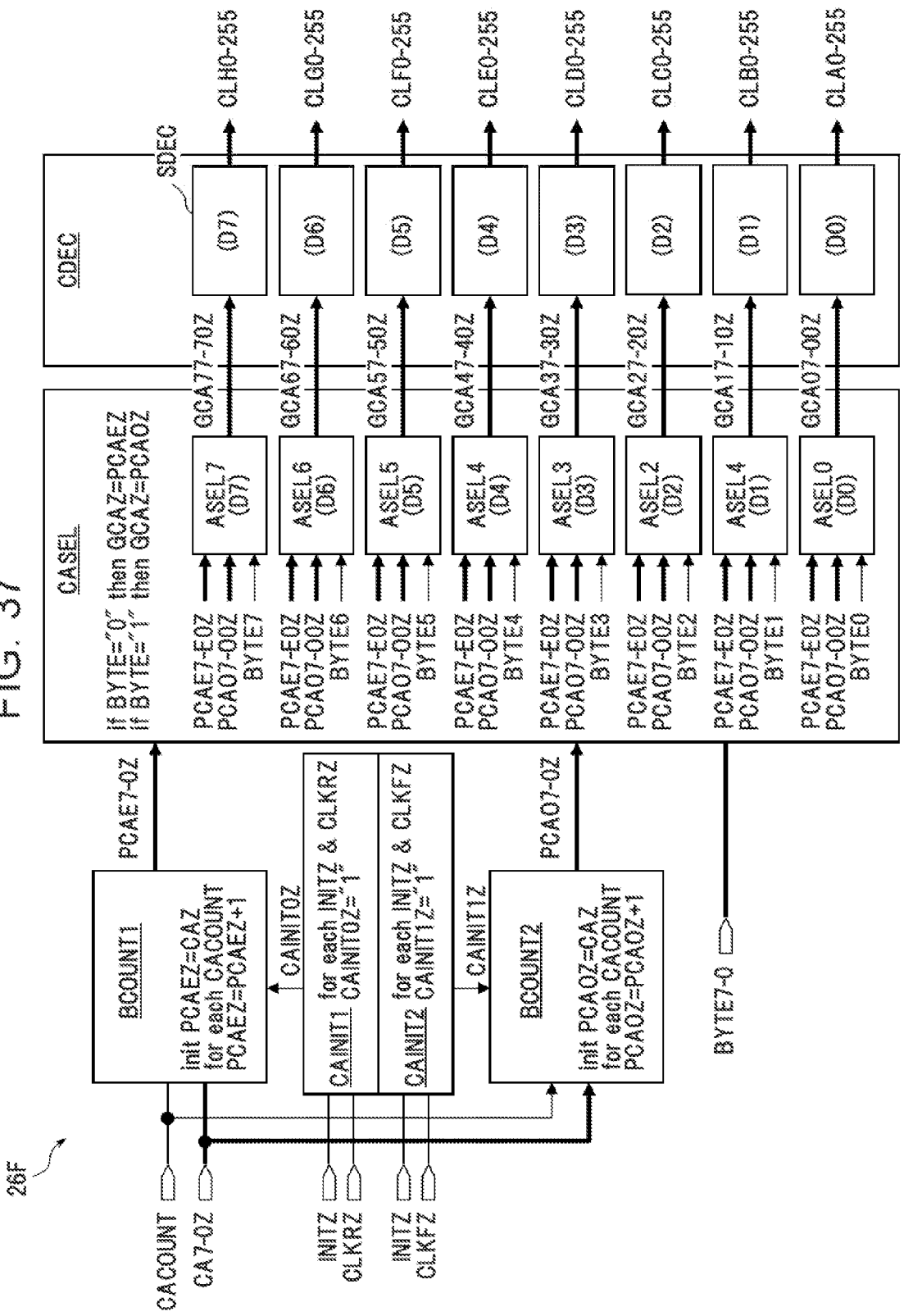
FIG. 37 illustrates an exemplary column-address control unit and an exemplary column decoder.

FIG. 37 illustrates an exemplary column-address control unit and an exemplary column decoder. The column-address control unit and the column decoder may be the column-address control unit 26F and the column decoder CDEC illustrated in FIG. 36. The column-address control unit 26F includes a first burst counter BCOUNT1, a second burst counter BCOUNT2, a first counter initializing unit CAINIT1, and a second counter initializing unit CAINIT2 that are substantially the same as or similar to the first burst counter, the second burst counter, the first counter initializing unit, and the second counter initializing unit illustrated in FIG. 20.

The column address selector CASEL includes eight address selectors ASEL7-0 that operate according to the byte signals BYTE7-0. The address selectors ASEL7-0 output the pre-column address signal PCAE7-0Z as, for example, global column address signals GCA77-70Z when the corresponding byte signals BYTE7-0 are at a low level. The address selectors ASEL7-0 output the pre-column address signals PCAO7-0Z as, for example, global column address signals GCA77-70Z when the corresponding byte signals BYTE7-0 are at a high level.

The column decoder CDEC includes eight sub-column decoders SDEC that corresponding receive global column address signals and are provided in association with the data groups D7 to D0, respectively. Each of the sub-column decoders SDEC activates, for example, one of 256 column selection signals CLH0-255 to a high level according to the global column address signals. "A", "B", "C", "D", "E", "F", "G", and "H" affixed to column selection signals indicate the corresponding data groups D0 to D7. In the seventh semiconductor memory, one of the pre-column address signals PCAE7-0Z and PCAO7-0Z is selected based on the byte signals BYTE7-0 supplied to the address selectors ASEL7-0. The global column address signals GCA7-0Z are output and the sub-column decoders SDEC operate.

Figure 38:
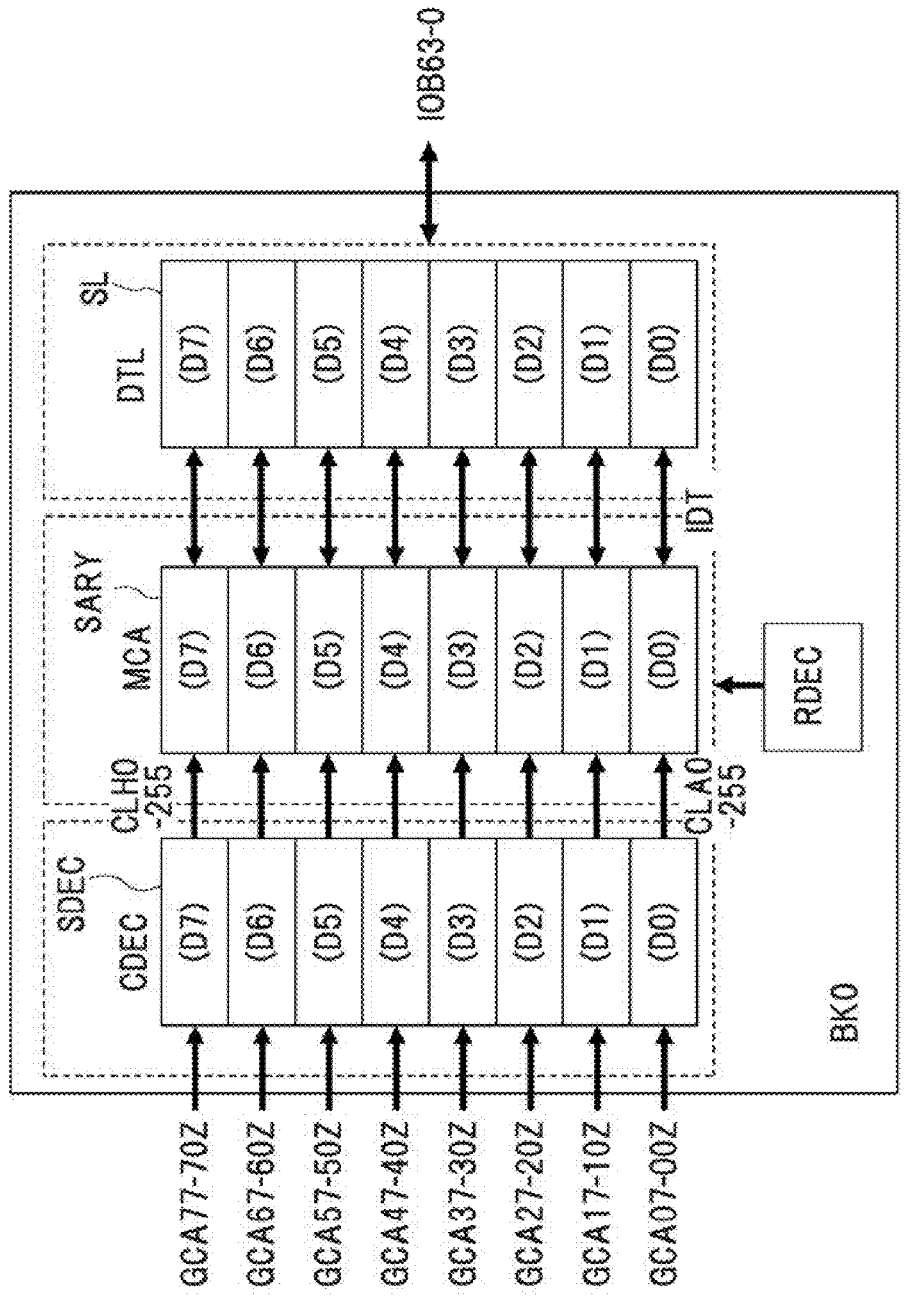
FIG. 38 illustrates an exemplary bank.

FIG. 38 illustrates an exemplary bank. The exemplary bank may be the bank BK0 illustrated in FIG. 36. Explanation of elements substantially the same as the components illustrated in FIG. 3 is omitted or reduced. The banks BK1-7 are substantially the same as the bank BK0. The bank BK0 includes the even number area EA substantially the same as the even number area EA illustrated in FIG. 3. A storage capacity of each of the banks BK0-7 is substantially the same as that of the bank BK0 illustrated in FIG. 1. A storage capacity of the sub-arrays SARY is twice as large as that of the sub-arrays SARY illustrated in FIG. 1. The data latch DTL includes eight sub-latches SL corresponding to the data groups D7 to D0. Each of the sub-latches SL is coupled to the sub-arrays SARY via the complementary internal data lines IDT. Each of the sub-latches SL is coupled to one of the internal data buses IOB63-56, 55-48, 47-40, 39-32, 31-24, 23-16, 15-8, and 7-0.

Figure 39:
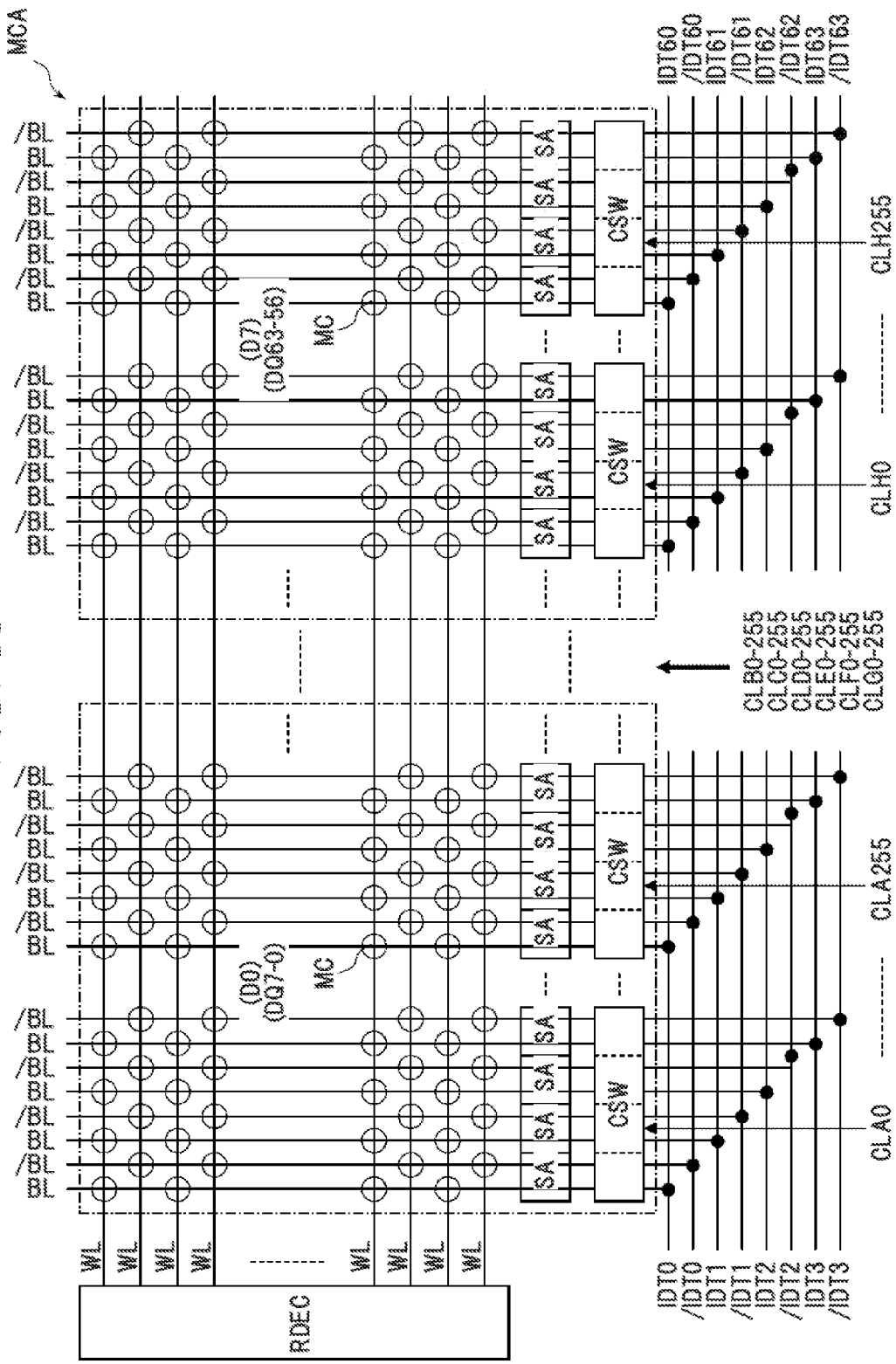
FIG. 39 illustrates an exemplary memory cell array.

FIG. 39 illustrates an exemplary memory cell array. The exemplary memory cell array may be the memory cell array MCA illustrated in FIG. 38. In memory cell array MCA, for example, 256 column selection signals CLA0 to CLA255 are supplied for each of the data groups D0 to D7. Each of the data groups D0 to D7 includes 1024 bit line pairs BL and /BL. Other elements are substantially the same as or similar to those of the even number area EA illustrated in FIG. 5.

Figure 40:
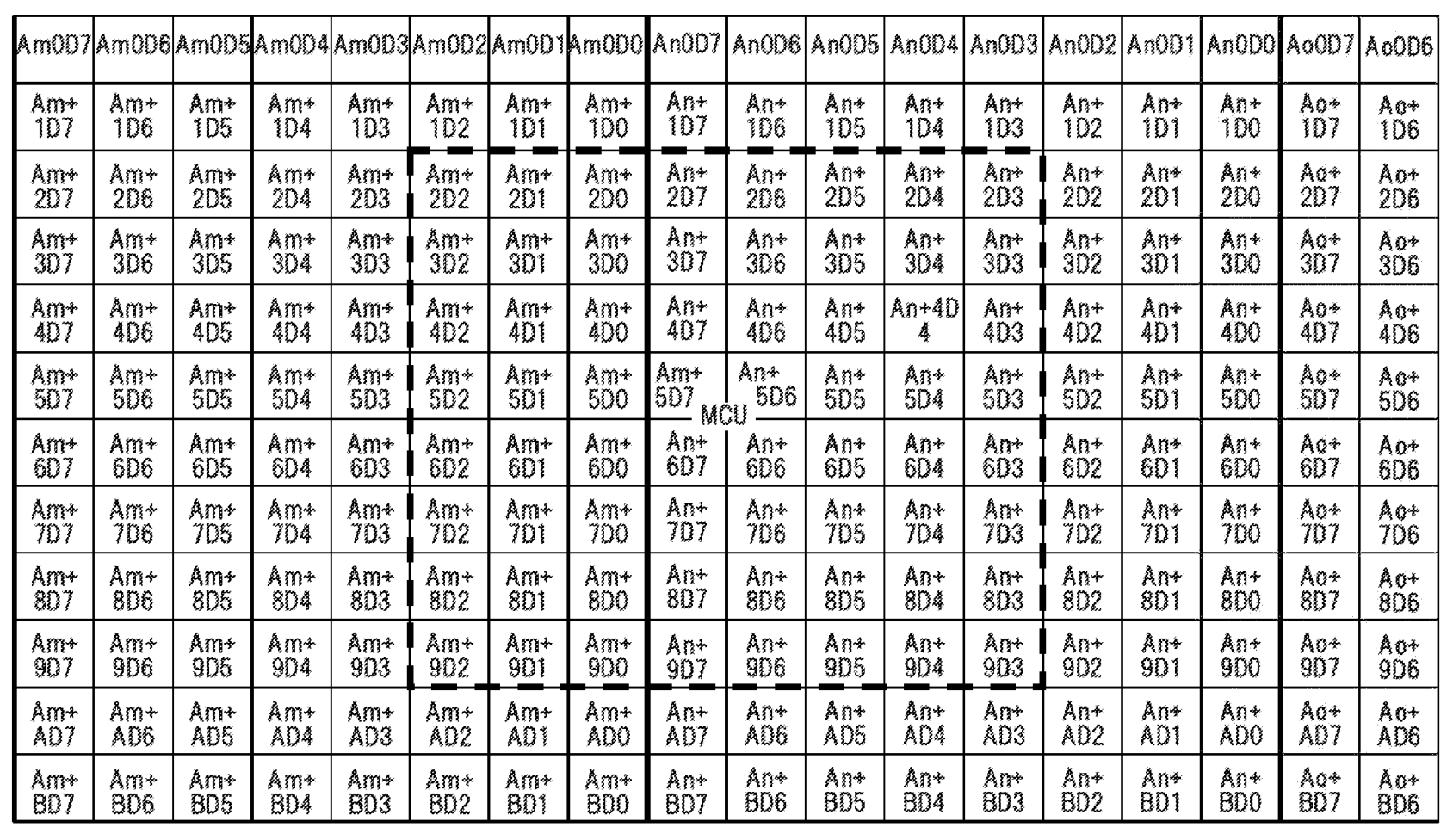

FIG. 40 illustrates an exemplary area accessed in a semiconductor memory. The semiconductor memory may be the semiconductor memory MEM illustrated in FIG. 36. In FIG. 40, image data is stored in the memory MEM. A small square indicates a memory cell MC for one byte. Signs "Am", "An" and "Ao" in the figure indicate positions of the memory cells MC, for example, the column addresses CA. For example, the column address An is Am+1 and the column address Ao is Am+2. Signs "D7 to D0" in the figure indicate data groups D7-0 to which the memory cells MC belong.

The image data is processed in, for example, rectangle units. For example, the memory controller MCNT accesses the memory MEM with a 64-bit rectangular area which corresponds to an area set by vertical 8 bits and horizontal 8 bits and is set as one unit. For example, the rectangular area stores sixty-four pixel data having 8-bit gradation. Since the memory MEM includes 64-bit data terminals Q63-0, one rectangular area is accessed in one burst read operation (the burst length BL=8).

When moving image data is stored in the memory MEM and processing such as motion prediction is performed, the processor PRC performs comparison processing such as search processing for a minimum value for data stored in a rectangular area MCU extending over two column addresses Am and An indicated by a bold broken line frame. Data corresponding to the column address Am and data corresponding to the column address An may be separately read and stored in a cache memory or the like. In the semiconductor memory MEM according to the seventh semiconductor memory, data in the bold broken line frame is read at a time.

Figure 41:
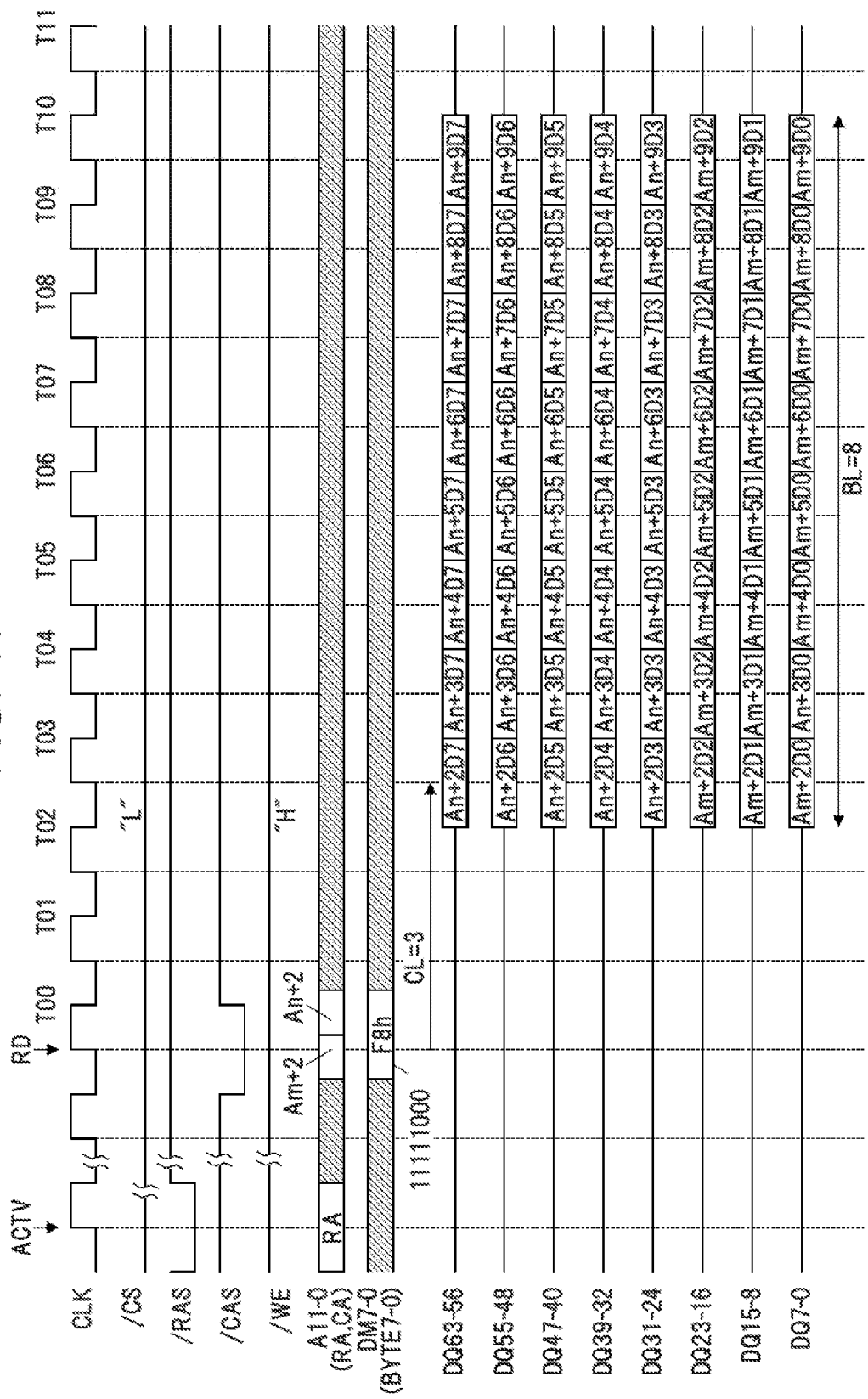
FIG. 41 illustrates exemplary operations of the semiconductor memory.

FIG. 41 illustrates exemplary operations of a semiconductor memory. The semiconductor memory MEM may be the semiconductor memory MEM illustrated in FIG. 36. When the memory controller MCNT controlled by the processor PRC accesses the memory MEM, the operations illustrated in FIG. 41 are performed. Explanation of operations substantially the same as the operations illustrated in FIG. 21 is omitted or reduced. The burst length BL may be set to "8". The CAS latency CL may be set to "3".

Two column address signals Am+2 and An+2 are supplied in synchronization with a rising edge and a falling edge of the clock signal CLK for supplying the read command RD. A logic of the byte signals BYTE7-0 is "F8h(11111000b)". As explained with reference to FIG. 37, data groups D2 to D0 corresponding to byte signals BYTE2-0 indicating "0" are read based on the first column address Am+2. Data groups D7 to D3 corresponding to byte signals BYTE7-3 indicating "1" are read based on the second column address An+2. Therefore, a rectangular area MCU extending over the two addresses Am+2 and An+2 indicated by a bold broken line is accessed at a time. The data groups D7 to D0 are read without redundancy from the area MCU to which the different column addresses Am+2 and An+2 are assigned.

A write operation in the seventh semiconductor memory is substantially the same as or similar to the operations illustrated in FIG. 41 except that two sets of data groups written in memory cells assigned to the column addresses Am+2 and An+2 different from each other are supplied together with a write command. In the write operation, data illustrated in FIG. 41 is supplied to the memory MEM as write data three clock cycles earlier.

The seventh embodiment has effects substantially the same as the effects in the first to sixth semiconductor memories. In the seventh semiconductor memory, the data groups D7 to D0 are read without redundancy from plural memory areas having the different column addresses CA7. When image data accessed with the rectangular area MCU, which is set as one unit, is stored in the memory MEM, a data transfer rate and performance of the system SYS are improved.

Figure 42:
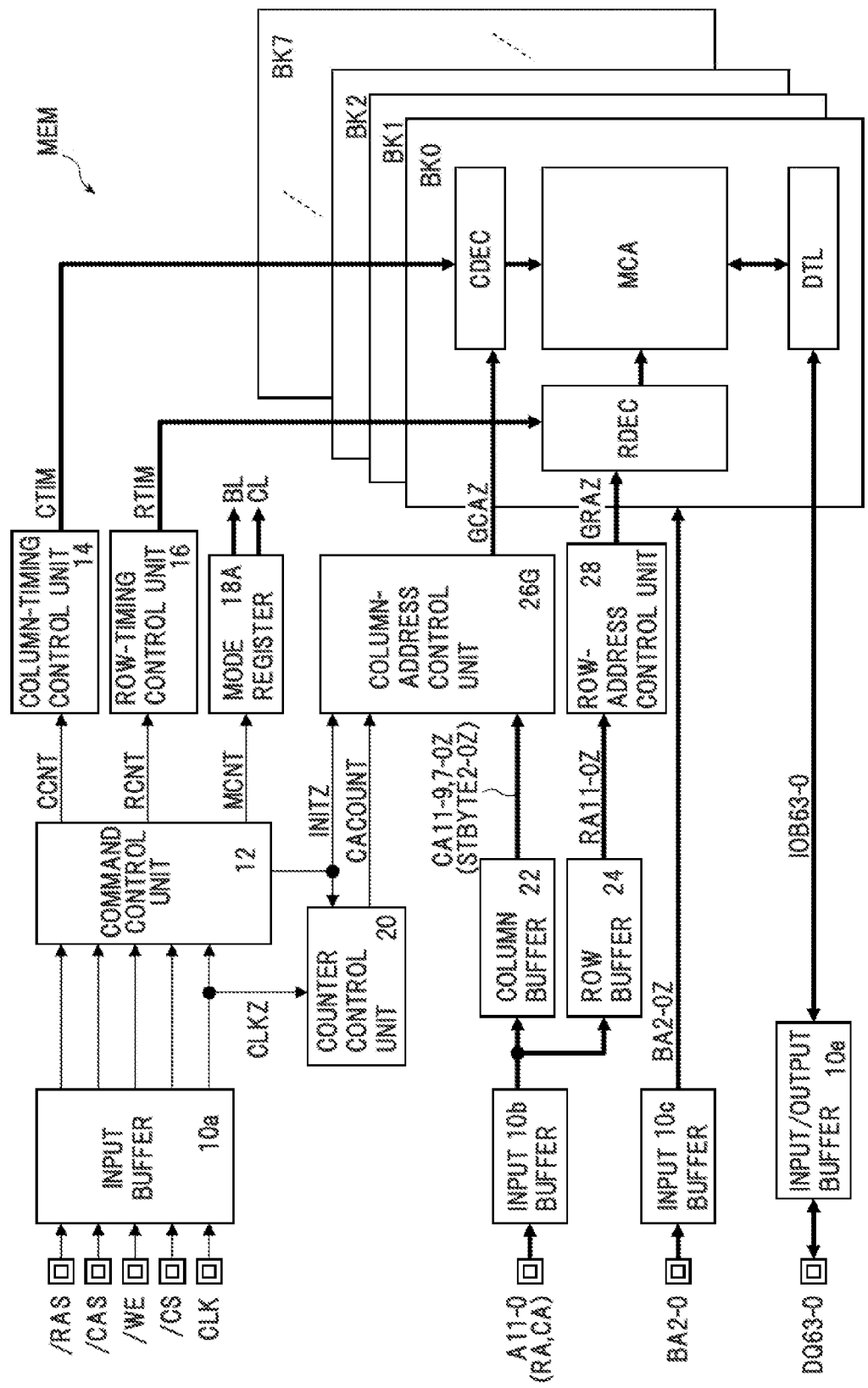
FIG. 42 illustrates an eighth semiconductor memory.

FIG. 42 illustrates an eighth semiconductor memory. Elements substantially the same as the elements in the previous semiconductor memories are denoted by the same reference numerals and signs and explanation of the elements is omitted or reduced. The memory MEM may be an SDRAM. The memory MEM may be mounted on the system SYS illustrated in FIG. 12. For example, image data may be stored in the memory cells MC. The memory MEM does not include elements corresponding to the data mask terminals DM7-0, the input buffer 10d, and the byte generating unit 30. The memory MEM includes a column-address control unit 26G. The column buffer 22 receives CA11-9 in addition to the column addresses CA7-0. Other elements are substantially the same as or similar to the elements illustrated in FIG. 36. The memory MEM may include a rectangular area MCA for storing image data.

In the eighth semiconductor memory, 3-bit start byte signals STBYTE2-0Z are supplied to the address terminals A11-9 together with the column address signals CA7-0 instead of the data mask signals DM7-0. The start byte signals STBYTE2-0Z indicate boundaries of the data groups D7 to D0 read by the two column address signals CA7-0 supplied together with the read command RD. The start byte signals STBYTE2-0Z indicate a rectangular area accessed at a time, for example, a data group at the left end of a bold broken line frame illustrated in FIG. 40, for example, data D2.

Figure 43:
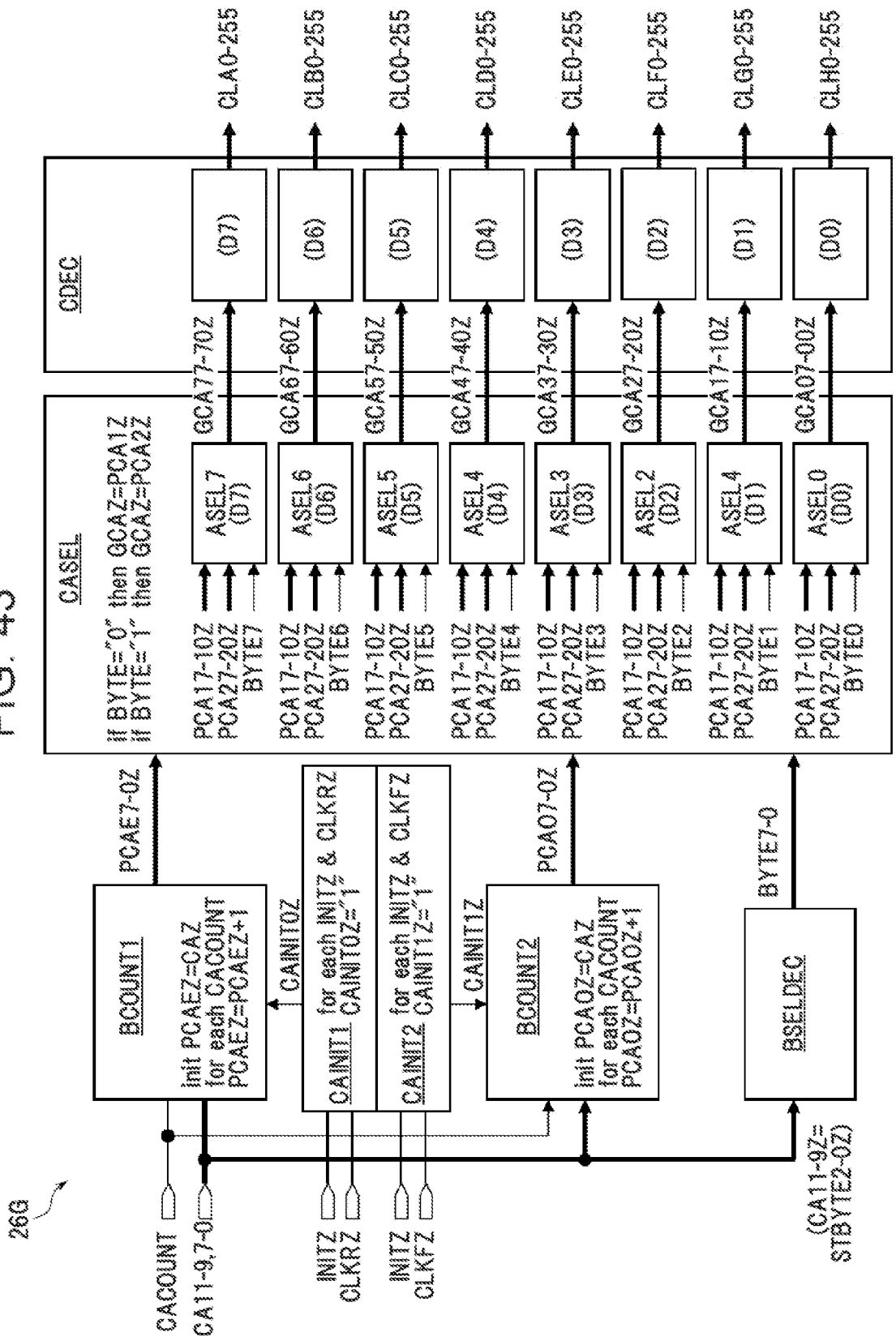
FIG. 43 illustrates an exemplary column-address control unit.

FIG. 43 illustrates an exemplary column-address control unit. The exemplary column-address control unit may be the column-address control unit 26G illustrated in FIG. 42. The column-address control unit 26G is substantially the same as or similar to the column-address control unit 26F illustrated in FIG. 37. The column-address control unit 26G includes a byte selection decoder BSELDEC. The byte selection decoder BSELDEC generates the byte signals BYTE7-0 from the start byte signals STBYTE2-0Z.

Figure 44:
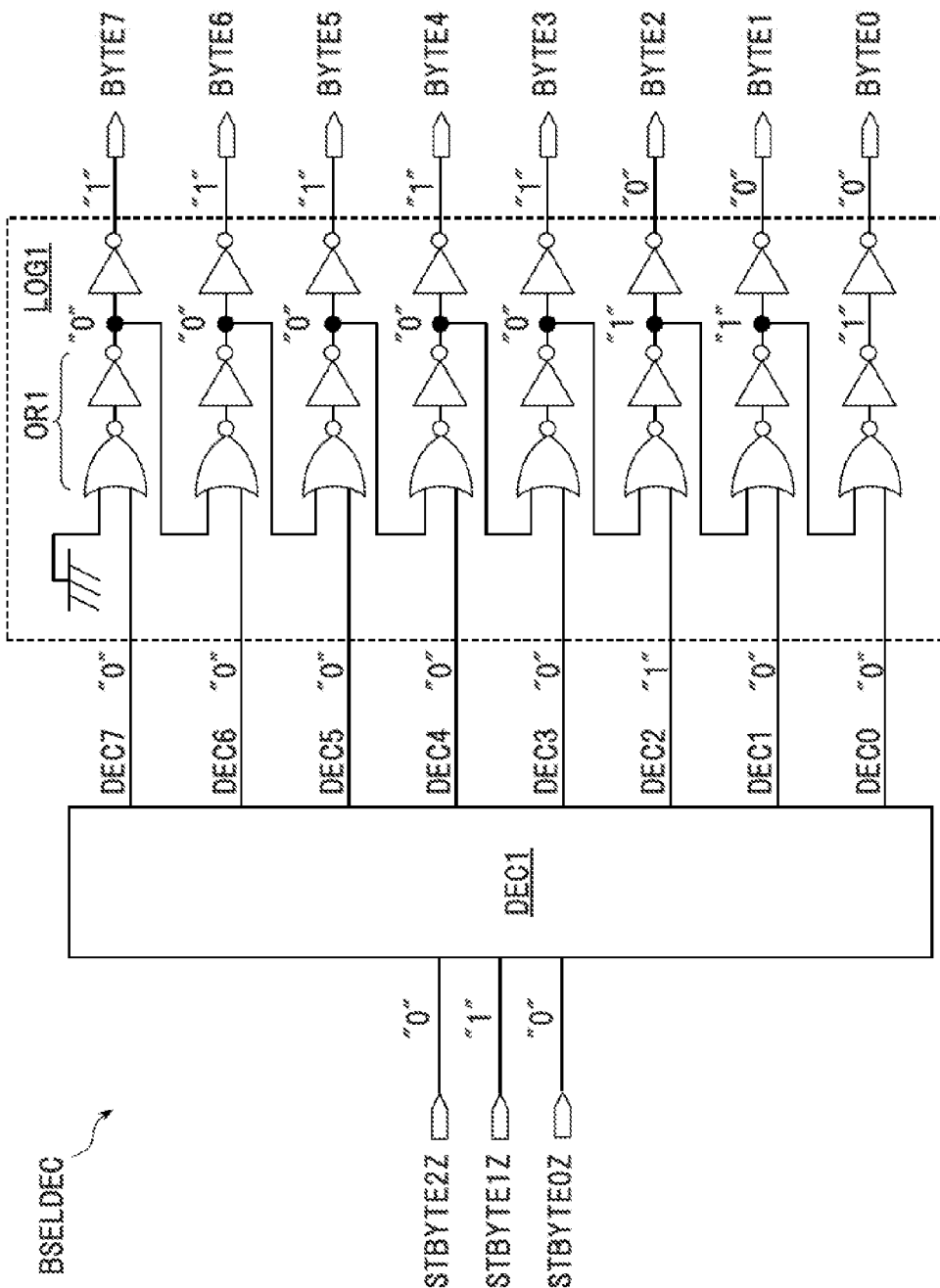
FIG. 44 illustrates an exemplary byte selection decoder.

FIG. 44 illustrates an exemplary byte selection decoder. The byte selection decoder may be the byte selection decoder BSELDEC illustrated in FIG. 43. The byte selection decoder BSELDEC includes a decoder DEC1 and a logic circuit LOG1 that generates the byte signals BYTE7-0. The decoder DEC1 sets one of decode signals DEC7-0 corresponding to the start byte signals STBYTE2-0Z to a high level. For example, when the start byte signals STBYTE2-0Z indicate "010b", a decode signal DEC2 is set to "1" as illustrated in FIG. 44.

The logic circuit LOG1 includes eight OR circuits OR1 that receive the decode signals DEC7-0 in one input and eight inverters that invert outputs of the OR circuits OR1 and output the inverted outputs as the byte signals BYTE7-0. The OR circuits OR1 receive outputs of higher-order OR circuits in the other input. When the start byte signals STBYTE2-0Z indicates "010b", the byte signals BYTE7-0 may be "11111000b". The memory may execute operations substantially the same as the operations illustrated in FIG. 41.

The eighth semiconductor memory has effects substantially the same as the effects in the previous semiconductor memories discussed above. In the eighth semiconductor memory, the byte signals BYTE7-0 are supplied to free bits CA11-9 of a column address terminal CA as the start byte signals STBYTE2-0Z. Therefore, a transfer rate of image data accessed with the rectangular area MCU which is set as one unit and performance of the system SYS are improved with a small number of terminals.

Figure 45:
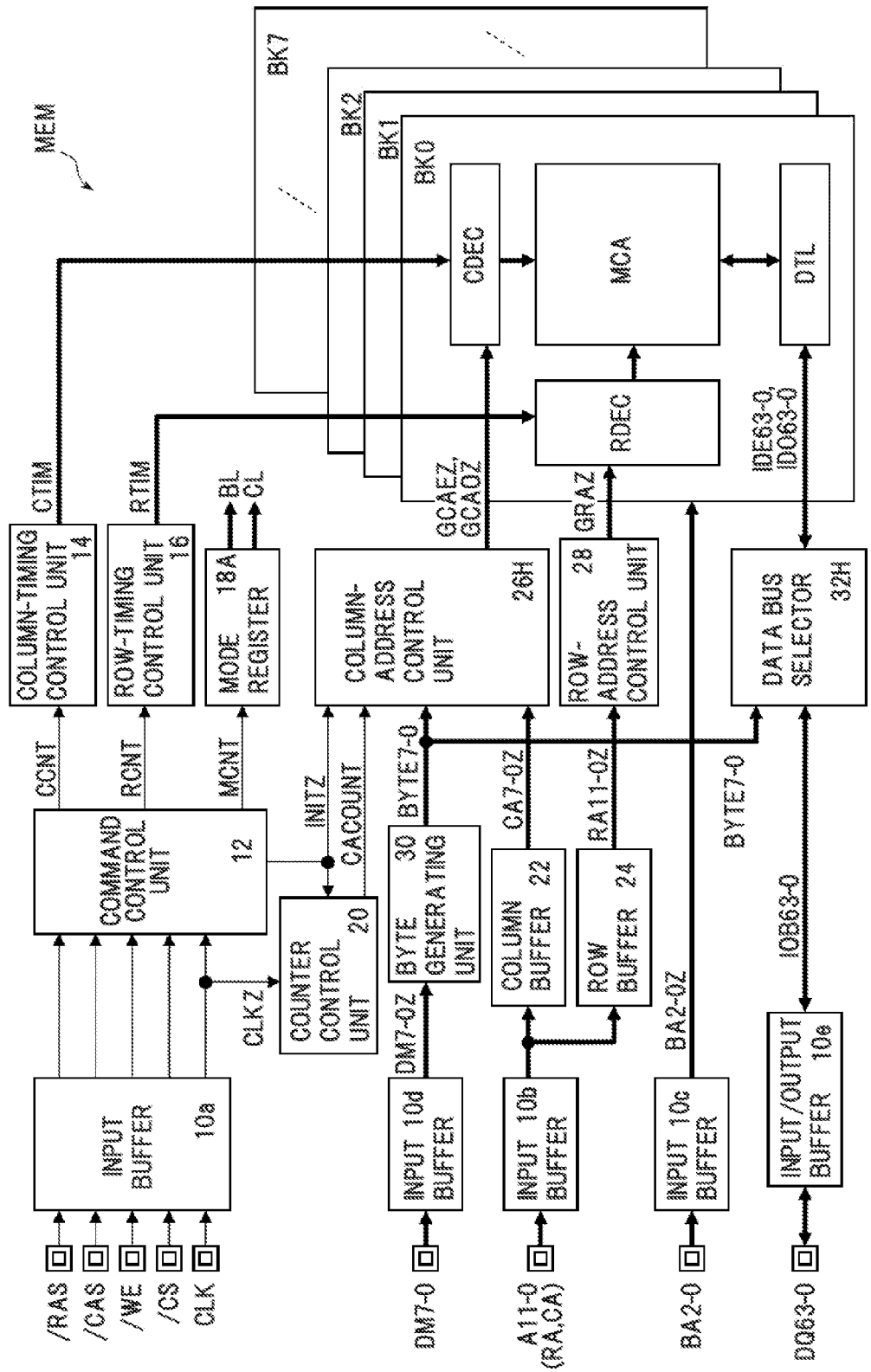
FIG. 45 illustrates a ninth semiconductor memory.

FIG. 45 illustrates a ninth semiconductor memory. Elements substantially the same as the elements in the previous semiconductor memories are denoted by the same reference numerals and signs and explanation of the elements is omitted or reduced. The memory MEM may be an SDRAM. The memory MEM may be mounted on the system SYS illustrated in FIG. 12. For example, image data is stored in the memory cells MC. The memory MEM includes a column-address control unit 26H instead of the column-address control unit 26F illustrated in FIG. 36. Each of the banks BK0-7 does not include the column pipeline CLPL. Other elements of each of the banks BK0-7 are substantially the same as or similar to the elements illustrated in FIGS. 14 and 16. The memory MEM includes a data bus selector 32H between the data latch DTL and the input/output buffer 10e. Other elements are substantially the same as or similar to the elements illustrated in FIG. 36. The memory MEM is accessed with, for example, the rectangular area MCA for storing image data which is set as one unit.

Figure 46:
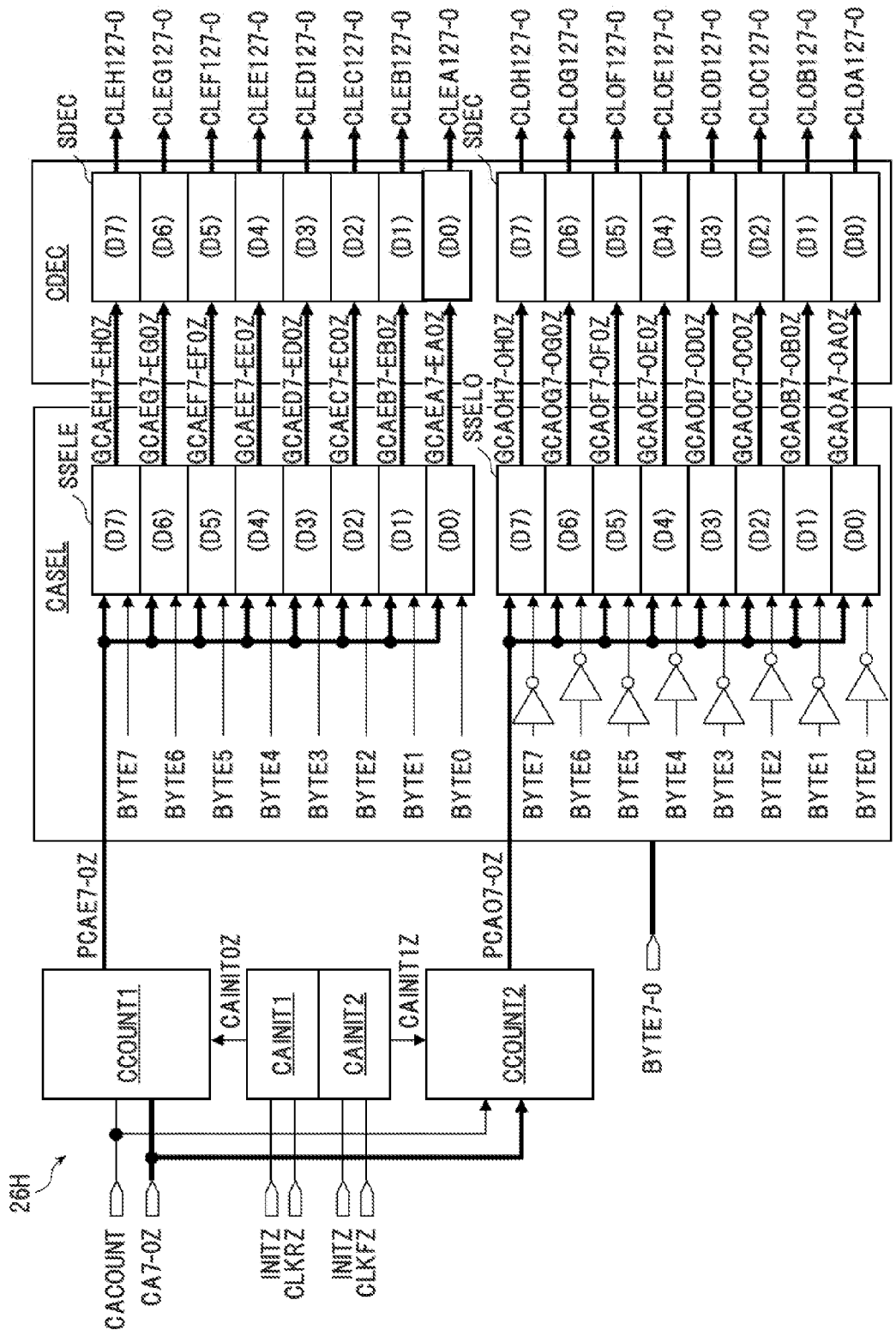
FIG. 46 illustrates an exemplary column-address control unit.

FIG. 46 illustrates an exemplary column-address control unit. The exemplary column-address control unit may be the column-address control unit 26H illustrated in FIG. 45. The column-address control unit 26H includes a counter initializing unit CAINIT1-2 and a burst counter BCOUNT1-2 substantially the same as the counter initializing unit and the burst counter illustrated in FIG. 20 and the column address selector CASEL. The column address selector CASEL includes eight sub-selectors SSELE that receive the pre-column address signal PCAEZ and eight sub-selectors SSELO that receive the pre-column address signal PCAOZ.

The sub-selectors SSELE receive the byte signals BYTE7-0, respectively. The sub-selectors SSELO receive signals obtained by inverting the byte signals BYTE7-0, respectively. The sub-selectors SSELE and SSELO have functions substantially the same as the functions of the sub-selectors illustrated in FIG. 15. For example, when a logic of the byte signals BYTE7-0 is "11111000", the sub-selectors SSELE corresponding to the data groups D7 to D3 prohibit output of the global column address signals GCAEH7-EH0Z, GCAEG7-EG0Z, GCAEF7-EF0Z, GCAEE7-EE0Z, and GCAED7-ED0Z. The sub-selectors SSELO corresponding to the data groups D2 to D0 prohibit output of the global column address signals GCAOC7-OCZ, GCAOB7-OB0Z, and GCAOA7-OA0Z.

Each of the sub-column decoders SDEC of the column decoder CDEC does not perform decoding when the corresponding global column address signal GCAEZ (or GCAOZ) is not output, for example, when both complementary signals indicating the signal GCAEZ (or GCAOZ) are at a high level. Since the sub-column decoder SDEC for reading data operates, power consumption is reduced.

Figure 47:
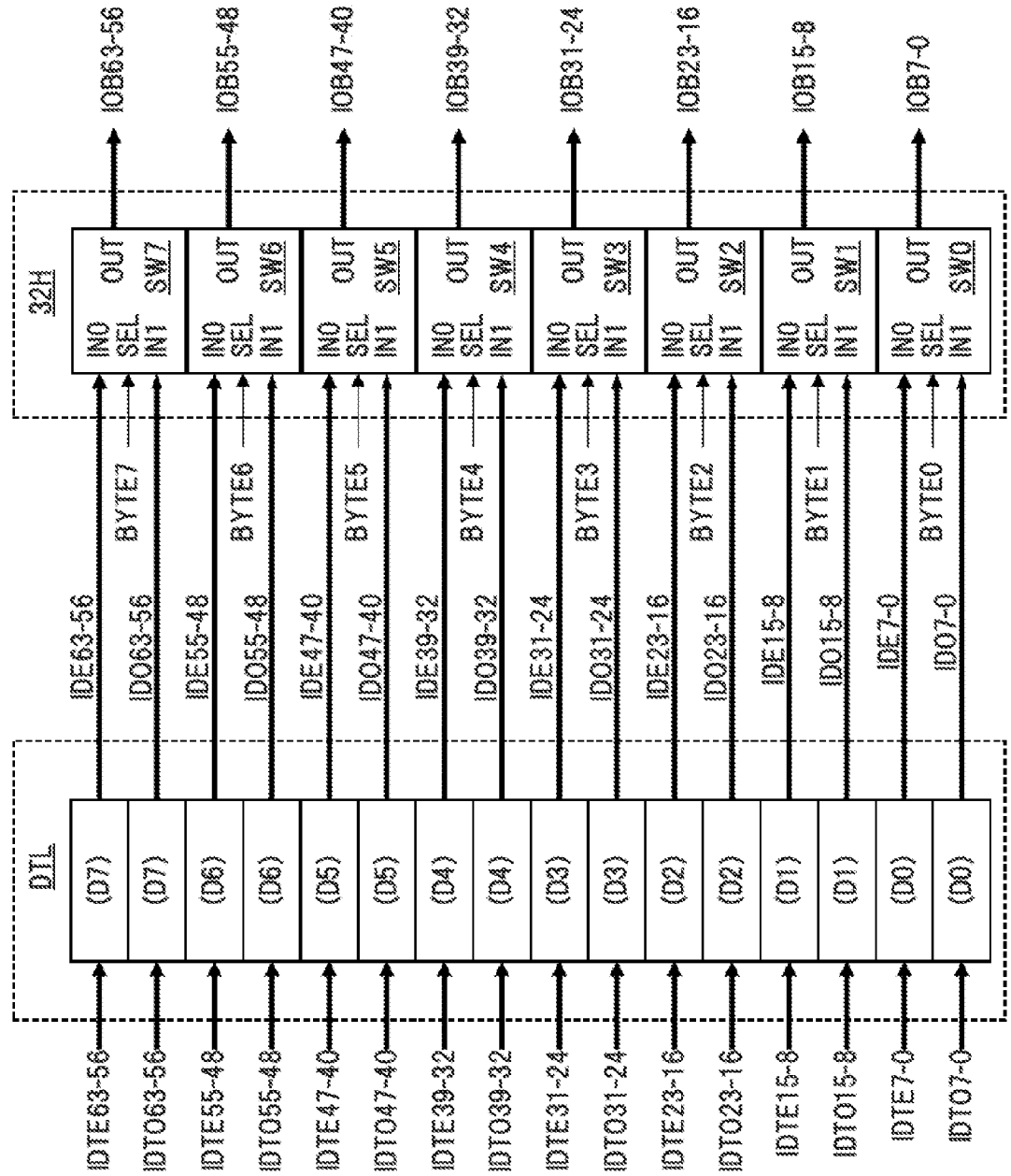
FIG. 47 illustrates an exemplary data bus selector.

FIG. 47 illustrates an exemplary data bus selector. The exemplary data bus selector may be the data bus selector 32H illustrated in FIG. 45. The data bus selector 32H includes the selector switches SW7-0 having a logic substantially the same as that of the selector switches illustrated in FIG. 7. Each of the selector switches SW7-0 selects, according to the byte signals BYTE7-0, one of a data group transferred from the sub-selector BSEL1 corresponding to the even number area EA and a data group transferred from the sub-selector BSEL1 corresponding to the odd number area OA. Operations of the memory MEM according to the ninth embodiment are substantially the same as or similar to the operations of the memory illustrated in FIG. 35.

When 3-bit addresses for identifying the banks BK0-7 include one of bits of the column addresses CA, the memory areas AR1-2 are assigned to the banks BK different from each other. The column-address control unit 26H outputs the global column address signal groups GCAEZ and GCAOZ to the banks BK, respectively. Each of the word lines of the two banks BK is activated. Data groups are read from memory cells selected by the column addresses CA among memory cells coupled to the activated word lines. The data groups read from the banks BK, respectively, are output to one of the internal data lines IDE63-0 and IDO63-0 and transferred to the data bus selector 32H. Each of the banks BK0-7 includes a data selector that outputs output of the data latch DTL to one of the internal data lines IDE63-0 and IDO63-0. The memory may execute operations substantially the same as the operations illustrated in FIG. 26.

The ninth semiconductor memory has effects substantially the same as the effects in the previous semiconductor memories.

The various semiconductor memories as discussed above may be applied to an SDRAM. For example, the previous embodiments may be applied to a DRAM, a pseudo SRAM, an SRAM, or a ferroelectric memory, and the like. For example, row addresses RA and column addresses CA are contemporaneously supplied to the pseudo SRAM, the SRAM, or the ferroelectric memory via different address terminals. These semiconductor memories operate in response to a read command or a write command without receiving, for example, the active command ACTV illustrated in FIG. 13. The row addresses RA and the column addresses CA are supplied to the semiconductor memories together with the read command or the write command. When the banks BK are selected by bits of a part of the column addresses CA, word lines of the different banks BK are activated. Data groups are respectively output from memory cells selected by the remaining column addresses CA among memory cells coupled to the activated word lines. The data groups read from the banks BK, respectively, are contemporaneously output to the data terminals DQ. The banks BK may be memory blocks that operate independently or may have sense amplifiers.

The various semiconductor memories as discussed above may be applied to a semiconductor memory of a clock synchronous type that performs burst transfer of data. The previous embodiments may be applied to a semiconductor memory of a clock asynchronous type.

Examples of embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made therein without departing from the spirit and scope of the present invention as set forth in the claims.

The invention claimed is:

1. A semiconductor memory that assigns M data groups, each data group including N data, to a first address, where M and N are integers equal to or larger than 2; and
wherein L data among N data is designated by a second address indicating a position of the data groups and the L data is read from the designated position, where L is an integer and L<N.

2. The semiconductor memory according to claim 1, wherein the L data of a first data group designated by a first second address and N−L data of a second data group designated by a second address different from the first second address are contemporaneously output.

3. The semiconductor memory according to claim 1, wherein first data corresponding to a first data position corresponding to a first second address in a first address and second data corresponding to a second data position corresponding to a second address in a second first address different from the first address.

4. The semiconductor memory according to claim 1, wherein the designation is performed via a data mask pin.

5. The semiconductor memory according to claim 1, wherein data in the designated position are output from a corresponding data pin.

6. The semiconductor memory according to claim 1, wherein the second address is a column address.

7. The semiconductor memory according to claim 1, wherein the L data include at least two data that are not adjacent to each other.

8. A semiconductor memory that assigns M data groups, each data group including N data, to a first address, where M and N are integers equal to or larger than 2, the semiconductor memory comprising:
data buses corresponding to the N data;
external terminals that receive data position information of L data among the N data designated by a second address indicating position of the data groups, where L is an integer and L<N; and
a supply circuit that supplies data of data position corresponding to the data position information to the data buses.

9. The semiconductor memory according to claim 8, further comprising:
data terminals coupled to the data buses,
wherein the L data is output from the data terminals corresponding to the data position information.

10. The semiconductor memory according to claim 8, further comprising:
a plurality of selectors that selects the L data among the N data groups based on the data position information and supplies the L data to the corresponding data bus.

11. The semiconductor memory according to claim 8, wherein the L data of a first data group designated by a first second address and N−L data of a second data group designated by a second second address different from the first second address are contemporaneously output.

12. The semiconductor memory according to claim 11, further comprising:
a counter that counts the second address in an integer equal to or larger than 2.

13. The semiconductor memory according to claim 8, further comprising:
an address terminal to which the first address is supplied,
wherein first data corresponding to the data position information of the L data of a first second address corresponding to a first first address and second data corresponding to data position information of N−L data of a second second address corresponding to a second first address different from the first first address.

14. The semiconductor memory according to claim 13, further comprising:
an external terminal that supplies a select signal for capturing the position information corresponding to the first data and the position information corresponding to the second data.

15. The semiconductor memory according to claim 13, further comprising:
a first counter that counts the second address corresponding to the first address; and
a second counter that counts a second address corresponding to a first address different from the first address.

16. The semiconductor memory according to claim 13, further comprising:
a circuit that adjusts a first latency for outputting the first data and a second latency for outputting the second data.

17. A memory system comprising:
a CPU;
a memory controller to be controlled by the CPU; and
at least one of a first semiconductor memory and a second semiconductor memory to be accessed by the memory controller,
wherein the first semiconductor memory to assign M data groups, each data group including N data, to a first address, wherein L (L<N) data among N data is designated by a second address indicating a position of the data groups and the L data is read from the designated position, where M and N are integers equal to or larger than 2
wherein the second semiconductor memory to assign M data groups, each data group including N data, to a first address, and includes data buses corresponding to the N data; external terminals that receive data position information of L data among the N data designated by a second address indicating position of the data groups, where L is an integer and L<N; and a supply circuit that supplies data of data position corresponding to the data position information to the data buses.

18. The memory system according to claim 17, wherein data stored in the first semiconductor memory or the second semiconductor memory includes image data.

19. The memory system according to claim 17, wherein the first semiconductor memory or the second semiconductor memory contemporaneously outputs L data of a first data group designated by the second address and N−L data of a second data group designated by a second address different from the second address.

20. The memory system according to claim 17, wherein the first semiconductor memory or the second semiconductor memory contemporaneously outputs data corresponding to a first data position corresponding to a second address of the first address and data corresponding to a second data position corresponding to a second address of a first address different from the first address.

* * * * *